United States Patent [19]

Niwa et al.

[11] Patent Number: 5,019,887
[45] Date of Patent: May 28, 1991

[54] NON-SINGLE CRYSTALLINE PHOTOSENSOR WITH HYDROGEN AND HALOGEN

[75] Inventors: Mitsuyuki Niwa; Takayoshi Arai, both of Nagahama; Isamu Shimizu, Yokohama; Eiji Takeuchi; Tsutomu Murakami, both of Nagahama; Shunichi Ishihara, Ebina, all of Japan

[73] Assignee: Canon Kabushiki Kaisha, Tokyo, Japan

[21] Appl. No.: 596,428

[22] Filed: Oct. 11, 1990

Related U.S. Application Data

[63] Continuation of Ser. No. 173,721, Mar. 25, 1988, abandoned.

[30] Foreign Application Priority Data

| Mar. 27, 1987 | [JP] | Japan | 62-73621 |
| Mar. 27, 1987 | [JP] | Japan | 62-73622 |
| Mar. 27, 1987 | [JP] | Japan | 62-73623 |
| Mar. 27, 1987 | [JP] | Japan | 62-73624 |
| Mar. 27, 1987 | [JP] | Japan | 62-73625 |
| Mar. 27, 1987 | [JP] | Japan | 62-73627 |
| Mar. 27, 1987 | [JP] | Japan | 62-73628 |
| Mar. 27, 1987 | [JP] | Japan | 62-75706 |

[51] Int. Cl.$^5$ .................................... H01L 27/14
[52] U.S. Cl. ........................................ 357/30; 357/2; 357/16; 357/4; 357/90; 357/59; 357/63; 357/32; 357/58
[58] Field of Search .............. 357/2, 4, 16, 58, 30 K, 357/30 M, 30 P, 30 L, 30 H, 32, 88, 90, 59 C, 63

[56] References Cited

U.S. PATENT DOCUMENTS

| 4,171,997 | 10/1979 | Irmler | 357/30 K X |
| 4,177,475 | 12/1979 | Holmberg | 357/90 X |
| 4,409,605 | 10/1983 | Ovshinsky et al. | 357/30 K X |
| 4,522,663 | 6/1985 | Ovshinsky | 357/30 K X |
| 4,536,459 | 8/1985 | Misumi et al. | 357/2 X |
| 4,680,607 | 7/1987 | Fukatsu et al. | 357/30 K |
| 4,718,947 | 1/1988 | Arya | 357/30 K X |
| 4,719,501 | 1/1988 | Nakagawa et al. | 357/30 K X |
| 4,720,444 | 1/1988 | Chen | 357/88 X |
| 4,769,682 | 9/1988 | Yang et al. | 357/30 K X |

FOREIGN PATENT DOCUMENTS

| 0122047 | 10/1984 | European Pat. Off. | 357/4 X |
| 56-62255 | 5/1981 | Japan | 357/30 K |
| 58-116781 | 7/1983 | Japan | 357/30 K |
| 60-74569 | 4/1985 | Japan | 357/30 K |

OTHER PUBLICATIONS

Hamakawa et al, "Optimum Design and Device Physics of the Horizontally Multilayered High Voltage Solar Cells Produced by Plasma Deposited Amorphous Silicon," Conference: Fourteenth IEEE Photovoltaic Specialists Conference 1980, San Diego, Calif., U.S.A., (7-10 Jan. 1980), pp. 1074-1079.

Loferski, "Photovoltaic IV: Advanced Materials," *IEEE Spectrum*, Feb. 1980, pp. 37-38.

Konagai et al, "Graded-Band-Gap p $Ga_{1-x}Al_xAs$--nGaAs Heterojunction Solar Cells," *Journal of Applied Physics*, vol. 46, No. 8, Aug. '75, pp. 3542-3546.

Primary Examiner—William Mintel
Attorney, Agent, or Firm—Fitzpatrick, Cella, Harper & Scinto

[57] ABSTRACT

A photosensor has a photoconductive member. The photoconductive member has a structure comprising a laminated product consisting of functional thin films superposed on one another. The laminated product comprises at least two functional thin films. The functional thin film containing 10 atomic % or less of hydrogen. The band gaps and conduction types and/or conductivity of the functional thin films are controlled to provide high photo sensitivity.

28 Claims, 8 Drawing Sheets

NON-SINGLE CRYSTALLINE PHOTOSENSOR WITH HYDROGEN AND HALOGEN

This application is a continuation of application Ser. No. 07/173,721 filed Mar. 25, 1988, now abandoned.

BACKGROUND OF THE INVENTION

1. Field of the Invention

This invention relates to a photosensor to be used in the image inputting section of, for example, facsimile, digital computer or scanner, etc. and an image reading method by use thereof.

2. Related Background Art

In the prior art, for image reading in, for example, a signal sending machine or copying machine for image reading photosensor facscimile, a photosensor for reading a manuscript as shown in FIG. 1 has been used, and reading practiced according to the method as shown in FIG. 2. FIG. 2 illustrates schematically an example by use of a photosensor for reading, in which 1 denotes a photosensor, and a converging type light transmission body 2 such as Selfok lens (trade name: Nippon Itagarasu Co.) is provided below the photosensor, and light emission diode (LED) arrays 3 are provided on both sides thereof, and 4 is a manuscript to be read.

There are various kinds of such photosensors. Those employing non-monocrystallinethin film semiconductors such as amorphous semiconductors or polycrystalline semiconductors, etc. as the photoelectric converting layer are accepted as preferable ones, because non-monocrystalline thin film semiconductors have excellent photoelectric converting functions, and also because enlargement of the thin area can be easily done.

A photosensor using said non-monocrystalline semiconductor as the photoelectric converting layer comprises a photoelectric converting layer comprising a non-monocrystalline layer provided on an electrically insulating substrate. Various methods have been proposed for forming a layer of said non-monocrystalline semiconductor. For example, there is the vacuum vapor deposition method, the ion plating method, the reactive sputtering method, the hot CVD method, the plasma CVD method, the optical CVD method, etc. Among them, the plasma CVD method has been practically applied as the optimum method and is generally known widely.

The constitution of the photosensor of the prior art, as shown in FIG. 1, comprises an electrode 202, a photoconductive member 204 and a transparent electrode 203 successively formed on an insulating substrate 201. The photoconductive member 204 has a single layer structure. For this reason, the photoconductive member 204 had a small dark resistance value. Accordingly, a photosensor of high sensitivity could not be obtained. Although by doping oxygen, etc. into the photoconductive member, the dark resistance of the photoconductive member 204 can be made greater, if too much oxygen, etc. is doped, the light resistance value of the photoconductive member 204 becomes greater, and photosensitivity becomes worse. Therefore, cumbersome operations of controlling oxygen amount, etc. are required. Accordingly, increasing dark resistance of the photoconductive member 204 is of itself of limited value and therefore it has been difficult to obtain a photosensor of high sensitivity.

According to the image reading method shown in FIG. 2 by use of the photosensor shown in FIG. 1, the number of charge generated and collected per photon irradiated is generally smaller than 1, and therefore insufficient current is obtained for driving an external circuit. Accordingly, one amplification circuit must be generally provided for one photosensor forming one picture element. For this reason, the cost of the reading device is extremely high.

Since a photosensor is required to be rather lengthy, an amorphous silicon film has been frequently used for its ease in preparation. However, amorphous silicon film, when irradiated with light for a long time, exhibits degraded characteristics and therefore is reduced in S/N ratio when irradiated with light for a long time.

As described above, in the image reading method of the prior art, since resistance value in the dark and sensitivity during photoirradiation of the photosensor are limited, there is the drawback that the S/N ratio during the reading of image information is too low. Accordingly, a sufficient signal cannot be obtained, and an amplification circuit is required to be mounted for each photosensor, and therefore the cost of the reading device is high. Further, deterioration by light is considerable.

SUMMARY OF THE INVENTION

An object of the present invention is to provide a photosensor of high sensitivity by solving the problems of the prior art as described above.

An object of one embodiment of the present invention is to provide a photosensor of high sensitivity which could not be realized in the prior art by overcoming the various problems in the photosensor of the prior art as described above and by controlling the hydrogen content in the photoconductive member.

For this purpose, in a photosensor having a photoconductive member, said photoconductive member has a structure comprising a laminated product consisting of functional thin films superposed on one another, said laminated product comprising at least 2 functional thin films, said functional thin films having band gaps equal to each other and electroconduction types and/or electroconductivities different from each other, and said functional thin film containing 10 atomic % or less of hydrogen.

In another embodiment of the present invention, for the purpose of accomplishing the above objects, in a photosensor having a photoconductive member, said photoconductive member has a structure comprising a laminated product consisting of functional thin films superposed on one another, said laminated product comprising at least 2 functional thin films, said functional thin films having electroconduction types and/or electroconductivities different from each other and band gaps different from each other, and said functional thin film containing 10 atomic % or less of hydrogen.

In still another embodiment of the present invention, for the purpose of accomplishing the above objects, in a photosensor having a photoconductive member, said photoconductive member has a structure comprising a laminated product consisting of functional thin films superposed on one another, said laminated product comprising at least 2 functional thin films, said functional thin films having electroconduction types and/or electroconductivities equal to each other and band gaps different from each other, and said functional thin film containing 10 atomic % or less of hydrogen.

In still another embodiment of the present invention, for the purpose of accomplishing the above objects, in a photosensor constituted of a first photoconductive member and a second photoconductive member, said photoconductive member has a structure comprising a laminated product consisting of functional thin films superposed on one another, the functional thin films constituting said first photoconductive member having electroconduction types and/or electroconductivities different from each other and band gaps different from each other, the functional thin films constituting said second photoconductive member having electroconduction types and/or electroconductivities different from each other and band gaps equal to each other, and the functional thin films constituting said photoconductive member containing 10 atomic % or less of hydrogen.

In still another embodiment of the present invention, for the purpose of accomplishing the above objects, the photosensor is constituted of a first photoconductive member and a second photoconductive member, said photoconductive member having a structure comprising a laminated product consisting of functional thin films superposed on one another, the functional thin films constituting said first photoconductive member having band gaps equal to each other and electroconduction types and/or electroconductivities different from each other, the functional thin films constituting said second photoconductive member having band gaps equal to each other and electroconduction types and/or electroconductivities different from each other and band gaps equal to each other, said first photoconductive member and said second photoconductive member having band gaps different from each other, and the functional thin films constituting said photoconductive member containing 10 atomic % or less of hydrogen.

An object of still another embodiment of the present invention is to provide a photosensor of high sensitivity which could not be realized in the prior art by overcoming the various problems of the photosensor of the prior art as described above, by controlling the hydrogen content in the photoconductive member and by varying continuously the band gap of the photoconductive member with respect to the laminated direction of the functional thin film.

For this purpose, the photosensor has a photoconductive member, said photoconductive member having a structure comprising a laminated product consisting of functional thin films superposed on one another, said functional thin films having electroconduction types and/or electroconductivities different from each other, said functional thin films containing 10 atomic % or less of hydrogen, and the band gap of said photoconductive member being varied continuously in the laminated direction.

An object of still another embodiment of the present invention is to provide an image reading method without deterioration to light which is high in S/N ratio and also low in cost.

For this purpose, the method uses a photosensor having a multi-layer film comprising two layers with different electroconductivities and/or electroconduction types superposed alternately, having electrodes respectively on the upper surface and the lower surface of said multi-layer film, with at least either one of said electrodes being capable of transmitting light therethrough, and irradiated light from an image signal on a region having a smaller area than that of the multi-layer film constituting said photosensor.

According to this embodiment by using a photosensor having a multi-layer film comprising two layers with different electroconductivites and/or electroconduction types superposed alternately, having electrodes respectively on the upper surface and the lower surface of said multi-layer film, with at least either one of said electrodes being capable of transmitting light therethrough, and by irradiating light from an image signal on a region with a smaller area, than that of the multi-layer film, and by utilizing the charges in the portion of the photosensor where the absence of light of image information can be utilized as image information, an image signal with high S/N ratio can be obtained.

An object of still another embodiment of the present invention is to obtain high gain by providing a photosensor of high sensitivity which could not be realized in the prior art, by overcoming the various problems in the photosensor of the prior art and by controlling the hydrogen content in the photoconductive member.

For this purpose, the first embodiment is a photosensor having a photoconductive member, said photoconductive member having a structure comprising a laminated product consisting of at least two functional thin films laminated in multiple layers, said functional thin films having electroconduction types and/or electroconductivities different from each other, and said functional thin films containing 10 atomic % or less of hydrogen, said photoconductive member having electrodes respectively on the upper surface and the lower surface of said photoconductive member, with at least either one of said electrodes being capable of transmitting light therethrough, and further said photoconductive member having electrodes arranged on both sides thereof. By using the above photosensor, applying a voltage between the electrodes on both sides of the photoconductive member in said photosensor, and at the same time irradiating light from the image from the transparent electrode side with a voltage being simultaneously applied between the electrodes of the upper surface and the lower surface of said photoconductive member, a current reflecting the image information is caused to flow between the electrodes at the upper surface and the lower surface of the photoconductive member to read the image information.

DETAILED DESCRIPTION OF THE PREFERRED EMBODIMENTS

Referring now to the accompanying drawings, of the present invention are to be described.

Figure 3:
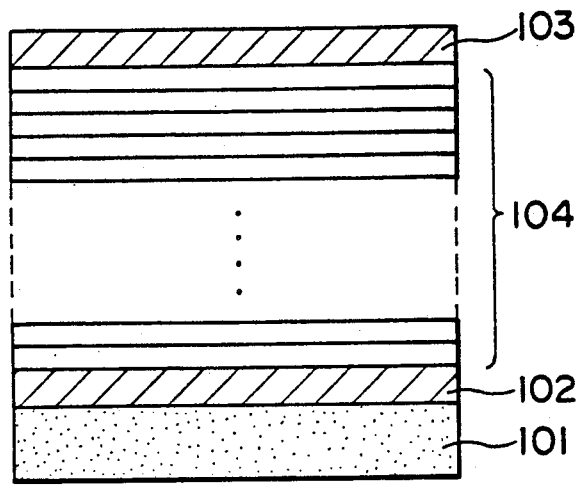
FIG. 3 is a sectional view showing schematically a typical example of the photosensor according to one embodiment of the present invention.

FIG. 3 is a partial sectional view showing schematically a typical example of the photosensor according to this invention.

In the figure, 101 is an insulating substrate, 102 a lower electrode, 103 an upper electrode and 104 a photoconductive member.

The material for the insulating substrate 101 is not limited to the quartz conventionally used, but for example, there can be used films or sheets of synthetic resins such as polyester, polycarbonate, cellulose, acetate, polypropylene, polyvinyl chloride, polyvinylidene chloride, polystyrene, polyamide, etc., glasses, ceramics, etc.

The thickness of the above substrate 101 in this embodiment may be conveniently determined so that a desired photosensor may be obtained. In general, it is made 1 $\mu$m or more from such factors as production, handling of the substrate and its mechanical strength, etc.

As the material for the electrodes 102 and 103 applicable in this embodiment, there may be included metals such as Al, Ag, Au, Pt, Ni, Cr, Fe, Cu, Mo, Ir, Nb, Mg, Zn, Pb, etc., SUS (stainless steel), alloys typically NiCr, so-called transparent electroconductive films such as $In_2O_3$, $SnO_2$, ITO, $ZnO_2$, etc. and further semiconductor layers or semiconductor wafers having higher electroconductivity than the semiconductor layer 104.

If either one of the above electrodes 102 and 103 has sufficient thickness, that electrode may become a support, whereby it is also possible to provide a structure in which the substrate 101 is omitted.

For introducing light into the photoconductive member 104, a transparent or translucent material and appropriate thickness are selected for at least one side of the electrodes.

These electrodes or layers equivalent to the electrodes may be used as bulk, or may be formed by heating vapor deposition, sputtering, plasma CVD, the plating method, etc.

The photoconductive member 104 has at least two kinds of different electroconductive types and/or electroconductivities, and functional thin films with hydrogen content of 10 atomic % or less in the film which are alternately laminated. For example, the thin fibers have a structure such as p/n/p/n ..., p/i//p/i/ ..., n/i/n/i/ .... The thickness of each layer of said functional thin films may be conveniently determined so that a desired photosensor may be obtained and may preferably be 10 Å to 10 $\mu$m, more preferably 10 Å to 1 $\mu$m, most preferably 50 Å to 1000 Å.

The total number of the layers of the functional thin films as mentioned above may be determined so that a desired photosensor may be obtained, but there should desirably be 2 to 10000 layers, more preferably 5 to 1000 layers, most preferably 10 to 100 layers.

The above functional thin film is constituted of a non-monocrystalline semiconductor having photoconductive function, and Si may be mentioned as a suitable matrix therefor. For obtaining a desired photosensor, at least one selected from among Ge, O, Ni, Sn, C, etc. is incorporated in the thin film, and/or the energy band gap is suitably controlled by increasing or decreasing the crystallinity of the non-monocrystalline film.

Further, in the above functional thin film, hydrogen atoms (H) and/or halogen atoms (X) are contained. As said halogen atoms (X), F, Cl, Br, I may be included, particularly preferably F, Cl. The halogen content may be preferably 0.0001 to 10 atomic %. more preferably 0.001 to 5 atomic %, most preferably 0.01 to 2 atomic %.

Figure 4:
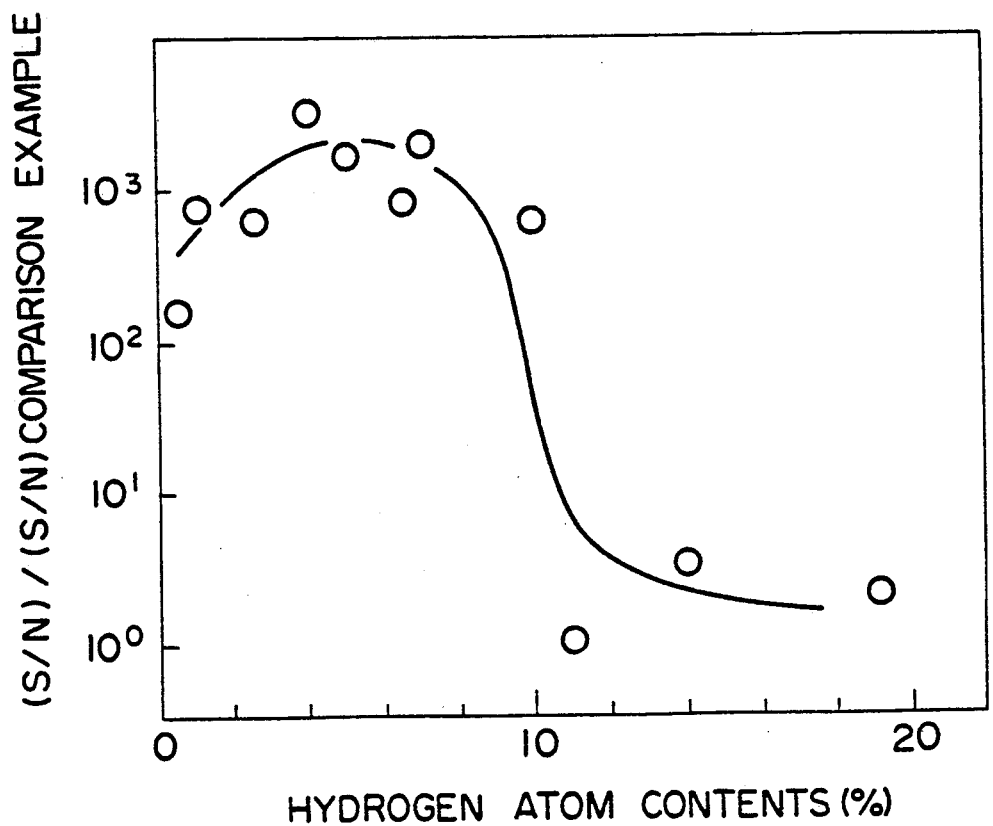
FIG. 4 is a graph showing the relationship between the amount of hydrogen atoms contained in the photoconductive member and the S/N ratio of the photosensor obtained thereby in the photosensor having the structure shown in FIG. 3.

The amount of hydrogen atoms contained in the above functional thin film has been clarified to give enormous influence on the characteristics of the photosensor according to the experiments by the present inventors. More specifically, in this Example, the amount of hydrogen contained in the functional thin film is required to be made 10 atomic % or less. The results of the experiments conducted by the present inventors in the photosensor having the constitution shown in the first Example as described below are shown in FIG. 4. This experiment is conducted generally as follows. While bias voltage of 5 V is previously applied between electrodes 102, 103, dark current (Id) and light current (Ip: when irradiated with 100 lux) are measured. The ratio of the light current to the dark current (Ip/Id) is defined as S/N ratio and is used as the evaluation index of the photosensor, and evaluation is performed in 11 kinds of samples having 0.5 to 20 atomic % of hydrogen contents (constitution and other parameters are all equal). In FIG. 4, for mutual comparison of S/N ratio, the value of the Comparative Example as described below is represented as 1. As is apparent from the results of this experiment, the S/N ratio will be lowered if the content of hydrogen in the functional thin film exceeds 10%. The hydrogen content in the above functional thin film is 10 atomic % or less, preferably 0.5 to 10% and more preferably its lower limit being 1%.

For the above functional thin film to have desired electroconductive type and electroconductivity, a p-type impurity is incorporated or n-type impurity into the functional thin film while controlling its amount. As the p-type impurity to be incorporated in the functional thin film, when the element constituting the functional thin film is constituted primarily of an element of group IV of the periodic table, an element of group III of the periodic table such as B, Al, Ga, In, Tl, etc. may be employed, and among them B and Ga are preferred. On the other hand, as the n-type impurity to be incorporated in the functional thin film, an element of group V of the periodic table such N, P, As, Sb, Bi, etc. may be employed, and among them P, As and Sb are preferred. The amount of these to be incorporated in the functional thin film may be suitably determined in view of such factors as desired electrical characteristics, optical characteristics, etc , but the p-type impurity may be made $3 \times 10^{-2}$ atomic % or less, while the n-type impurity preferably $5 \times 10^{-3}$ atomic % or less.

As the method for forming the functional thin film satisfying the above conditions, there has been proposed the deposition film forming method (Japanese Laid-Open Patent Publication No. 41047/1985) in which a deposited film is formed on a substrate by introducing an active species formed in the decomposition space (B) which mutually reacts with the above precursor into the film forming space (A) for formation of a deposited film on the substrate.

EXAMPLE 1-1

Figure 5:
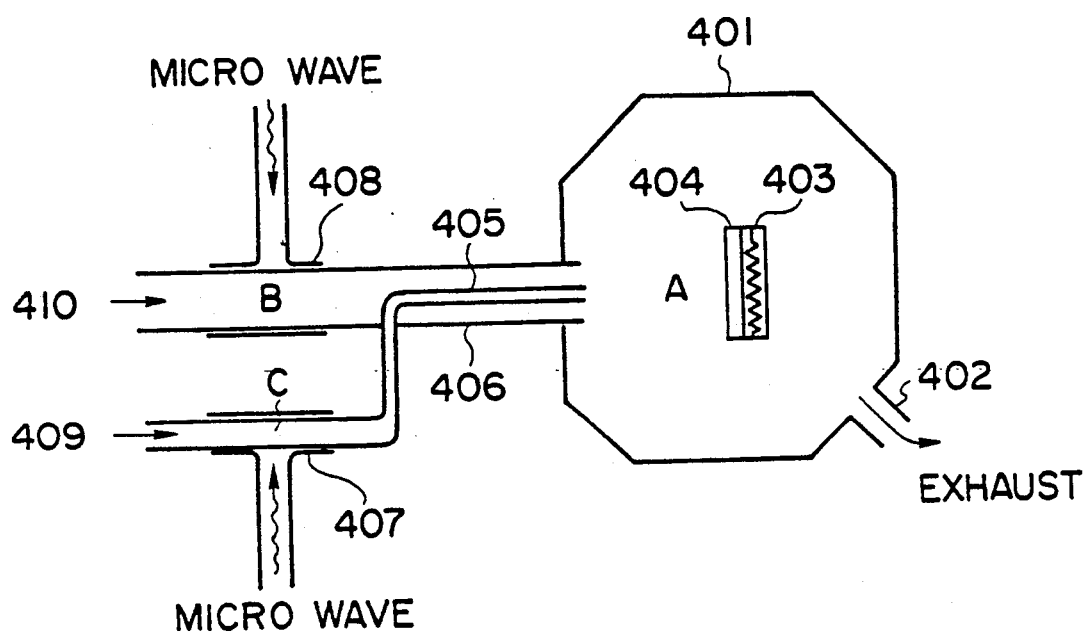
FIG. 5 is a sectional view showing schematically the device for forming deposited film used for preparation of the functional thin film constituting the photoconductive member of the present invention.

A photosensor shown in FIG. 3 was prepared by means of a film forming device shown in FIG. 5.

In FIG. 3, the photosensor has an electrode 102 formed by heating vapor deposition of Cr on a glass substrate 101, further has n-type a-Si:Ge:H:F film and p-type a-Si:H:F film laminated alternately thereon to form a photoconductive member 104, and has a transparent electrode 103 of ITO.

The film forming device shown in FIG. 5 has a substrate holder 403 having a heating heater built therein placed in a vacuum chamber 401 having an evacuation outlet 402, and holds a glass substrate 404 having Cr with a film thickness of about 500 Å vapor deposited by resistance heating at room temperature thereon by another vacuum chamber (not shown) above said holder, thus ensuring a film forming space A.

For introducing a precursor and an active species into the film forming space A, a gas introducing portion with a coaxial doublestructure comprising an inner pipe 405 and an outer pipe 406 is formed. The precursor and the active species introduced through these inner pipe and outer pipe are made desired precursor and active species by separate microwave exciting sections 407, 408 for excitation in the respective exciting decomposition spaces B and C.

The respective original gases of the above precursor and active species are introduced through the gas introducing pipes 409 and 410. In FIG. 5, the distance between the tip end of the outer pipe 405 and the substrate 404 is made 8 cm.

First, the vacuum chamber 401 was internally evacuated to a vacuum degree of about $10^{-5}$ Torr. Then, the substrate was heated by the heating heater to a substrate temperature of 250° C. and maintained at that temperature.

Under such conditions, through the introducing pipe 409, SiF$_3$ at 30 sccm and PH$_3$ diluted to 30 ppm with Ar at 10 sccm, 0.2 vol % of GeF$_4$ based on SiF$_4$ were respectively introduced, and also through the gas introducing pipe 410, H$_2$ was introduced at 30 sccm and Ar at 250 sccm. When the flow rates of the respective gases were stabilized, the pressure within the chamber was maintained at 0.3 Torr. Then, microwaves with a frequency of 2.45 GHz were generated in the excitation section 407 at 100 W and in the excitation section 408 at 200 W.

By maintaining this state for 90 seconds, an n-type a-Si:Ge:H:F film with a film thickness of 200 Å was deposited on the Cr layer 102.

Next, with the microwave power being turned off, introduction of PH$_3$ and GeF$_4$ was stopped, and BF$_3$ diluted to 300 ppm with Ar was introduced at 10 sccm through the gas introducing pipe 409. The flow rate of H$_2$ introduced through the gas introducing pipe 410 was changed to 20 sccm, and when the flow rate of the gas was stabilized, with the pressure in the vacuum chamber 401 being maintained at 0.3 Torr, again microwaves were generated in thrown into the excitation section 407 at 100 W and in the excitation section 408 at 200 W. By maintaining this state for 90 seconds, a p-type a-Si:H:F film with a film thickness of 200 Å was deposited on the n-type a-Si:Ge:H:F film.

Next, with the microwave power being turned off, introduction of BF$_3$ was stopped, and PH$_3$ diluted to 300 ppm with Ar at 10 sccm and 0.2 vol % of GeF$_4$ based on SiF$_4$ were introduced through the gas introducing pipe 409. The flow rate of H$_2$ introduced through the gas introducing pipe 410 was changed to 30 sccm, and when the gas flow rate was stabilized, with the pressure in the vacuum chamber 401 being maintained at 0.3 Torr, again microwaves were generated in the excitation section 407 at 100 W and in the excitation section 408 at 200 W.

Under this state, an n-type a-Si:H:F film with a film thickness of 200 Å was deposited on the p-type a-Si:Ge:H:F film.

Subsequently, following the same procedure, the p-type a-Si:Ge:H:F film and the n-type a-Si:Ge:H:F film were deposited alternately each to a thickness of 200 Å, to form a photoconductive member 104 with a film thickness of 8000 Å having 20 layers each of the respective films laminated.

Then, the microwave power was turned off and also the heating heater was turned off simultaneously with termination of all gas flow into the vacuum chamber 401.

After sufficient cooling, the substrate 101 was taken out from the film forming device, and after the substrate 101 was heated to 200° C. by means of a sputtering device (not shown), a transparent electroconductive film 203 of ITO was vapor deposited to 500 Å.

When the S/N ratio of the photosensor thus obtained was measured according to the method as described above, it had a good value of $1 \times 10^{3.0}$ with the value of the Comparative Example as described below as being 1. This value was not changed even after photoirradiation was continued for 24 hours. Photoirradiation was effected from the ITO side.

Separately, samples of the p-type a-Si:H:F film and the n-type a-Si:Ge:H:F film were respectively prepared on a glass substrate according to the same preparation conditions and the preparation device as described above, and provided for measurement of optical band gap EG$^{opt}$ and quantitative analysis of hydrogen by SIMS. These results are shown in Table 1-1.

As shown in Table 1-1, the band gaps of the p-type a-Si:H:F film and n-type a-Si:Ge:H:F film are different from each other, with the respective hydrogen contents being 10 atomic % or less, thus satisfying the requirements of this Example.

Comparative Example

Similar photosensors and samples were prepared by the same method and device as in Example 1-1 except for changing H$_2$ introduced through the gas introducing pipe 410 during preparation of the n-type a-Si:Ge:H:F film and the p-type a-Si:H:F film to 100 sccm and 70 sccm, respectively, and measurement and analysis were performed similarly as in Example 1-1. As the result, the value of S/N ratio of the photosensor obtained was made 1 as the standard for measuring results of S/N ratio of photosensors in other Examples. In this Comparative Example, after photoirradiation was continued for 24 hours, the value was not as good as in Example 1-1 and was reduced to $1 \times 10^{-0.2}$. The values of optical band gap of the p-type a-Si:H:F film and the n-type a-Si:Ge:H:F film and hydrogen contents are as shown in Table 1-2, which shows that the values of the optical band gaps are different, but the hydrogen contents in the respective films are 11 atomic %, thus exceeding 10 atomic %.

Example 1-2

A photosensor shown in FIG. 3 was prepared by the same device and method as in Example 1-1. In this case, on the Cr layer 102, a p-type a-Si:H:F film and a non-doped n-type a-Si:Ge:H:F film were alternately laminated, followed finally by formation of a transparent electrode 103 of ITO. During preparation of the non-doped n-type a-Si:Ge:H:F film, entirely the same preparation conditions and method were employed except for introducing no PH3 through the gas introducing pipe 409, thereby preparing a photosensor having a photoconductive member 104 having the non-doped a-Si:Ge:H:F film and the p-type a-Si:H:F film laminated alternately each in 20 layers.

Separately, a sample of the non-doped a-Si:Ge:H:F film was prepared by the same device and the same preparation conditions as described above and analyzed similarly as in Example 1-1.

When the same measurement was conducted for the photosensor obtained, the S/N ratio had a good value of $10 \times 10^{2.5}$ with the Comparative Example as the standard. This value was not also changed even after photoirradiation was continued for 24 hours. Photoirradiation was effected from the ITO side.

The hydrogen content and the optical band gap in the non-doped a-Si:Ge:H:F film were as shown in Table 1-3. Particularly, the hydrogen content in the film was 2 atomic %, thus being less than 10 atomic %.

EXAMPLE 1-3

A photosensor shown in FIG. 3 was prepared by means of the device shown in FIG. 5 similarly as in Example 1-1. In this case, photoconductive member 104 was formed by laminating alternately the n-type a-Si:Ge:H:F film and the non-doped a-Si:H:F film. The preparation conditions for the n-type a-Si:Ge:H:F film were made the same as in Example 1-1, and during preparation of the non-doped a-Si:H:F film, other conditions were made entirely the same as in Example 1-1 except for introducing no BF3 through the gas introducing pipe 409, thus preparing a photosensor having an photoconductive member 204 having the n-type a-Si:Ge:H:F film and the non-doped a-Si:H:F film laminated alternately each in 20 layers.

Separately, a sample of the non-doped a-Si:H:F film formed by the same preparation conditions and the preparation device as described above was prepared, and subjected to the same measurement and analysis as described in Example 1-1.

When the same measurement was conducted for the photosensor obtained, the S/N ratio was found to be a good value of $1 \times 10^{2.6}$ with the Comparative Example as the standard. Also, when photoirradiation was continued for 24 hours, this value was not changed.

The value of optical band gap of the non-doped a-Si:H:F film and the hydrogen content in the film were as shown in Table 1-4. Particularly, the hydrogen content in the film was 5 atomic %, thus being less than 10 atomic %.

EXAMPLE 1-4

A photosensor shown in FIG. 3 with a photoconductive member having a structure of the p-type a-Si:C:H:F film and the n-type a-Si:H:F film alternately laminated was prepared according to the same method as in Example 1-1 by means of the device shown in FIG. 5. In this case, by introducing SiF4 at 30 sccm and PH3 diluted to 300 ppm with Ar through the gas introducing pipe 409, and generating microwave power of 100 W into the excitation section 407, and also introducing H2 at 20 sccm and Ar at 250 sccm through the gas introducing pipe 410 and and generating microwave power of 200 W into the excitation section 408, a n-type a-Si:H:F film with a film thickness of 200 Å was formed on the Cr layer 102. Then, by introducing SiF4 at 30 sccm, BF3 diluted to 300 ppm with Ar at 10 sccm and CF4 at 3 sccm through the gas introducing pipe 409, and generating microwave power of 100 W into the excitation section 407, and also introducing H2 at 50 sccm and Ar at 250 sccm through the gas introducing pipe 410 and generating microwave power of 200 W into the excitation section 408, a p-type a-Si:C:H:F film with a film thickness of 100 Å was formed. Thus, a photosensor having a photoconductive member 104 with the n-type a-Si:H:F film and the p-type a-Si:C:H:F film laminated alternately each in 30 layers was prepared.

Separately, samples of he n-type a-Si:H:F film and the p-type a-Si:C:H:F film were prepared by the same preparation conditions and preparation device as described above.

The photosensor and the samples thus obtained were subjected to the same measurement and analysis as described in Example 1-1. As a result, the S/N ratio was found to be a good value of $1 \times 10^{2.9}$ with the Comparative Example as the standard. This value was not changed even when light was continuously irradiated for 24 hours. Photoirradiation was effected from the ITO side.

As to the optical band gaps of the n-type a-Si:H:F film and the p-type a-Si:C:H:F film and the hydrogen contents in the films, as shown in Table 1-5, the optical band gaps of the respective films were different from each other, and the hydrogen contents in the films were both 10 atomic % or less.

EXAMPLE 1-5

A photosensor shown in FIG. 3 with a photoconductive member having a structure of the p-type a-Si:Ge:H:F and the non-doped a-Si:C:H:F alternately laminated was prepared by means of the device shown in FIG. 5.

In this case, by introducing SiF4 at 30 sccm, BF3 diluted to 300 ppm with Ar at 10 sccm and 0.2 vol % (based on SiF4) of GeF through the gas introducing pipe 409 and generating microwave power of 100 W into the excitation section 407, and also introducing H2 at 30 sccm and Ar at 250 sccm through the gas introducing pipe 410 and generating microwave power of 200 W into the excitation section 408, a p-type a-Si:Ge:H:F film with a film thickness of 400 Å was formed on the Cr layer 102. Then, by introducing SiF$_4$ at 30 sccm and CF$_4$ at 3 sccm through the gas introducing pipe 409, gas introducing pipe 410, and generating microwave powers of 100 W and 200 W respectively into the excitation sections 407 and 408, a non-doped a-Si:C:H:F film with a film thickness of 150 Å was formed. Following otherwise the same procedure as in Example 1-1, a photosensor having a photoconductive member 104 with the p-type a-Si:Ge:H:F film and the non-doped a-Si:C:H:F film laminated alternately each in 20 layers was prepared.

Separately, samples of the p-type a-Si:Ge:H:F film and the non-doped a-Si:C:H:F film were prepared by the same preparation conditions and preparation device as described above.

The photosensor and the samples thus obtained were subjected to the same measurement and analysis as described in Example 1-1. As the result, the S/N ratio was found to be a goo value of $1 \times 10^{3.1}$ with Comparative Example as the standard. This value was not changed even when light was continuously irradiated for 24 hours. Photoirradiation was effected from the ITO side.

As to the optical band gaps of the p-type a-Si:Ge:H:F film and the non-doped a-Si:C:H:F film and the hydrogen contents in the films, as shown in Table 1-6, the optical band gaps of the respective films were different from each other, and the hydrogen contents in the films were both 10 atomic % or less.

EXAMPLE 1-6

A plural number of photosensors and samples were prepared according to the same method and by use of the same device as in Example 1-1 except for changing the preparation conditions of the photoconductive member as shown in Table 1-7.

The photosensors and the samples obtained were subjected to the same measurement and analysis as in Example 1-1. As the result, as shown in Table 1-8, the S/N ratios of the photosensors No. 60011 to No. 60015 exhibited good S/N ratios with the Comparative Example as a standard. All of these photosensors were not changed in the S/N ratio of current even when light was continuously irradiated for 24 hours.

The hydrogen contents and optical band gaps of film in the p-type a-Si:H:F film and the n-type a-Si:Ge:H:F film in the respective samples No. 60011 to No. 60015 were as shown in Table 1-9. Thus, the optical band gaps of the respective films were different from each other, and the hydrogen content in the respective films was 10 atomic % or less.

EXAMPLE 1-7

A photosensor shown in FIG. 3 was prepared by means of the device shown in FIG. 5 with a distance between the tip end of the outer pipe and the substrate surface of 5 cm. In this case, a p-type Si film was formed to 200 Å on the Cr layer 202 by introducing SiF$_4$ at 30 sccm and BF$_3$ diluted to 300 ppm with Ar at 10 sccm through the gas introducing pipe 409, and H$_2$ at 100 sccm and Ar at 250 sccm through the gas introducing pipe 410, respectively, and generating microwave power of 100 W into the excitation section 407 and of 400 W into the excitation section 408. Then, a non-doped Si:Ge thin film was formed to 200 Å by introducing SiF$_4$ at 30 sccm and GeF$_4$ in 0.2 vol % based on SiF$_4$ through the gas introducing pipe 409 and introducing H$_2$ at 100 sccm and Ar at 250 sccm through the gas introducing pipe 410, respectively, and generating microwave powers of 100 W into the excitation section 407 and of 400 W into the excitation section 408. With other conditions being the same as in Example 1-1, a photosensor having a photoconductive member 204 with the p-type Si thin film and the non-doped Si:Ge thin film laminated alternately each in 10 layers was prepared.

Separately, 2 samples each having only the p-type Si thin film and the non-doped Si:Ge thin film were prepared, and one of the respective samples was subjected to measurement of optical band gap and quantitative analysis of hydrogen by SIMS, and the other one was subjected to examination of presence of crystallinity by electron beam diffraction (RHEED).

When the same measurement as in Example 1-1 was conducted for the photosensor obtained, the S/N ratio was found to be a good value of $1 \times 10^{2.8}$ with the Comparative Example as the standard. This value was not changed even after photoirradiation was continued for 24 hours.

Values of optical band gaps of the p-type Si thin film and the non-doped Si:Ge thin film, hydrogen contents in the films and presence of crystallinity were as shown in Table 1-10. The optical band gaps of the respective films were different from each other, and the hydrogen contents in the respective films were 10 atomic % or less.

As described above, according to this embodiment, in a photosensor having a photoconductive member, said photoconductive member has a structure with laminated product comprising functional thin films superposed on one another, said laminated product comprising at least two kinds of functional thin films, said functional films having electroconductive types and/or electroconductivities different from each other and also band gaps different from each other, and by making the hydrogen content of said functional thin film 10 atomic % or less, the film quality becomes dense and charge transfer of small number of carriers is improved. As the result, diffusion length of carriers can be elongated, whereby electrical and optical characteristics can be greatly improved to provide a photosensor with S/N ratio not found in the prior art.

Next, another embodiment of the present invention is to be described. The structure of this embodiment is substantially the same as that shown in FIG. 3. However, it is different in the following points. That is, the photoconductive member 104 has band gaps different from each other, has at least two different electroconductive types and/or electroconductivities, and has functional thin films with hydrogen content of 10 atomic % in the film alternately laminated, such as p/n/p/n/..., p/i/p/i/..., n/i/n/i/..., n/i/p/n/i/p/..., n+/n/n+/n/..., n/i/p/n/i/p/..., n+/n/n+/n/..., etc. Other points are the same as those shown in FIG. 3.

EXAMPLE 2-1

A photosensor of this embodiment was prepared by means of the film forming device shown in FIG. 5.

The photosensor of this embodiment, similarly as in Example 1-1, has an electrode 102 formed by heating vapor deposition of Cr on a glass substrate 101, has a photoconductive member 104 formed thereon by laminating alternately a n-type a-Si:H:F film and a p-type Si:H:F film by means of the film forming device shown in FIG. 5, followed finally by provision of a transparent electrode 103 of ITO.

As the film forming device, the same device shown in FIG. 5 was used similarly as in Example 1-1.

First, the vacuum chamber 401 was internally evacuated to a vacuum degree of about $10^{-5}$ Torr. Then, the substrate was heated by the heating heater to a substrate temperature of 250° C. and maintained at that temperature.

Under such conditions, through the introducing pipe 409, SiF$_4$ at 30 sccm and PH$_3$ diluted to 300 ppm with Ar at 10 sccm were respectively introduced, and also through the gas introducing pipe 410, H$_2$ was introduced at 20 sccm and Ar at 250 sccm. When the flow rates of the respective gases were stabilized, the pressure within the chamber 401 was maintained at 0.3 Torr. Then, microwave with a frequency of 2.45 GHz was generated in the excitation section 407 at 100 W and into the excitation section 408 at 200 W.

By maintaining this state for 100 seconds, a n-type a-Si:H:F film with a film thickness of 200 Å was deposited on the Cr layer 102.

Next, with the microwave power being turned off, introduction of PH$_3$ was stopped, and BF$_3$ was introduced at 10 sccm through the gas introducing pipe 409. When the flow rate of the gas was stabilized, with the pressure in the vacuum chamber 401 being maintained at 0.3 Torr, again microwave was generated in the excitation section 407 at 100 W and in the excitation section 408 at 200 W.

By maintaining this state for 100 seconds, a p-type a-Si:H:F film with a film thickness of 200 Å was deposited on the n-type a-Si:H:F film.

Next, with the microwave power being turned off, introduction of BF$_3$ was stopped, and PH$_3$ diluted to 300 ppm with Ar at 10 sccm was introduced through the gas introducing pipe 409. When the gas flow rate was stabilized, with the pressure in the vacuum chamber being maintained at 0.3 Torr, again microwave was thrown into the excitation section 407 at 100 W and into the excitation section 408 at 200 W.

Under this state, a n-type a-Si:H:F film with a film thickness of 200 Å was deposited on the p-type a-Si:H:F film.

Subsequently, following the same procedure, the p-type a-Si:H:F film and the n-type a-Si:H:F film were deposited alternately each to a thickness of 200 Å, to form a photoconductive member 104 with a film thickness of 0.8 μm having 20 layers each of the respective films laminated.

Then, the heating heater was turned off simultaneously with stopping of all the gases introduced into the vacuum chamber 401 and also the microwave power was turned off.

After sufficient cooling, the substrate 101 was taken out from the film forming device, and after the substrate was heated to about 200° C. by means of a sputtering device (not shown), a transparent eletroconductive film 103 of ITO was vapor deposited to 500 Å.

The photosensor thus obtained was applied with a voltage and the current flowed was measured. As the result, the S/N ratio was found to be a good value of $1 \times 10^{3.2}$ with the value of the Comparative Example described below as being 1. The S/N ratio was not changed even after a photoirradiation was continued for 24 hours. Photoirradiation was effected from the ITO side.

Separately, from the sensor as described above, samples of the p-type a-Si:H:F film and the n-type a-Si:H:F film were prepared respectively under the same conditions of gas flow rate, microwave power, inner pressure, substrate temperature as during preparation of the photoconductive member of the photosensor shown in FIG. 3, and provided for quantitative analysis of hydrogen by SIMS. The analytical results of hydrogen contents in p-type and n-type a-Si:H:F film are shown in Table 2-1. As shown in Table 2-1, hydrogen contents in both p-type a-Si:H:F film and n-type a-Si:H:F film are 5 atomic %, thus being less than 10 atomic %.

Comparative Example

According to the same method as in Example 2-1 except for changing the flow rate of H$_2$ gas introduced through the gas introducing pipe 410 to 70 sccm, similar photosensor and samples were prepared and subjected to the same measurement and analysis as in Example 2-1, and the S/N ratio value obtained as the result was made 1 as the standard for other measurement results. After photoirradiation was continued for 24 hours, the value of S/A ratio was reduced to $1 \times 10^{-0.2}$.

The hydrogen contents in the p-type a-Si:H:F film and the n-type a-Si:H:F film were found to be respectively 11 atomic %, thus exceeding 10 atomic %.

EXAMPLE 2-2

A photosensor shown in FIG. 3 was prepared by the same device and method as in Example 2-1. In this case, a non-doped a-Si:H:F film and a p-type a-Si:H:F film were laminated alternately on a Cr layer 102, and finally a transparent electrode 103 of ITO was formed. During preparation of the non-doped a-Si:H:F film, entirely the same preparation conditions and method were employed except for flowing only SiF$_4$ at 30 sccm through the gas introducing pipe 409, thus preparing a photosensor having a photoconductive member 104 with the non-doped a-Si:H:F film and the p-type a-Si:H:F film laminated alternately each in 20 layers.

Separately, a sample of the non-doped a-Si:H:F film was prepared by use of the same preparation device and preparation conditions as described above and analyzed similarly as in Example 2-1.

When the same measurement was conducted for the photosensor obtained as in Example 2-1, the S/N ratio was found to be a good value of $1 \times 10^2$ with Comparative Example as the standard. This value was not changed even after photoirradiation was continued for 24 hours. Photoirradiation was effected from the ITO side.

The hydrogen content in the non-doped a-Si:H:F film was found to be 5 atomic % as shown in Table 2-3, thus being less than 10 atomic %.

EXAMPLE 2-3

A photosensor shown in FIG. 3 was prepared by means of the device shown in FIG. 5 similarly as in Example 2-1. In this case, photoconductive member 104 is formed by laminating alternately the n-type a-Si:H:F film and the non-doped a-Si:H:F film. The preparation conditions of the n-type a-Si:H:F film and the preparation conditions of the non-doped a-Si:H:F film were the same as those in Example 2-1 and Example 2-2, with other conditions being all the same as in Example 2-1, thus preparing a photosensor having a photoconductive member 204 having the n-type a-Si:H:F film and the non-doped a-Si:H:F film laminated alternately each in 20 layers.

When the same measurement was conducted for the photosensor obtained similarly as in Example 2-1, the S/N ratio was found to be a good value of $1\times 10^{2.9}$ with the Comparative Example as a standard. This value was not changed even after photoirradiation was continued for 24 hours. Photoirradiation was effected from the ITO side.

EXAMPLE 2-4

A photosensor shown in FIG. 3 with a photoconductive member having a structure of the p-type a-Si:Ge:H:F film and the n-type a-Si:Ge:H:F film alternately laminated was prepared according to the same method as in Example 2-1 by means of the device shown in FIG. 5. In this case, by introducing SiF$_4$ at 30 sccm and PH diluted to 300 ppm with Ar at 10 sccm and 0.2 vol % of GeF$_4$ based on SiF$_4$ through the gas introducing pipe 409, and generating microwave power of 100 W into the excitation section 407, and also introducing H$_2$ at 30 sccm and Ar at 250 sccm through the gas introducing pipe 410 and generating microwave power of 200 W into the excitation section 408, a n-type a-Si:Ge:H:F film with a film thickness of 400 Å was formed on the Cr layer 102. Then, by introducing SiF$_4$ at 30 sccm, BF$_3$ diluted to 300 ppm with Ar at 10 sccm and 0.2 vol % of GeF$_4$ based on SiF$_4$ through the gas introducing pipe 409, and generating microwave power of 100 W into the excitation section 407, and also introducing H$_2$ at 30 sccm and Ar at 250 sccm through the gas introducing pipe 410 and generating microwave power of 200 W into the excitation section 408, a p-type a-Si:Ge:H:F film with a film thickness of 400 Å was formed. Thus, a photosensor having a photoconductive member 104 with the n-type a-Si:Ge:H:F film and the p-type a-Si:Ge:H:F film laminated alternately each in 10 layers was prepared.

Separately, samples of the n-type a-Si:Ge:H:F film and the p-type a-Si:Ge:H:F film were prepared by the same preparation conditions and preparation device as described above.

The photosensor and the samples thus obtained were subjected to the same measurement and analysis as described in Example 2-1. As the result, the S/N ratio was found to be a good value of $1\times 10^{3.2}$ with the Comparative Example as the standard. This value was not changed even when light was continuously irradiated for 24 hours. Photoirradiation was effected from the ITO side.

The hydrogen contents in the n-type a-Si:Ge:H:F film and the p-type a-Si:Ge:H:F film were found to be each 2 atomic % as shown in Table 2-4, thus being less than 10 atomic % or less.

EXAMPLE 2-5

A photosensor shown in FIG. 3 with a photoconductive member having a structure of the p-type a-Si:C:H:F and the non-doped a-Si:C:H:F alternately laminated was prepared by means of the device shown in FIG. 5.

In this case, by introducing SiF$_4$ at 30 sccm, BF$_3$ diluted to 300 ppm with Ar at 10 sccm and CF$_4$ at sccm through the gas introducing pipe 409 and generating microwave power of 100 W in the excitation section 407, and also introducing H$_2$ at 50 sccm and Ar at 250 sccm through the gas introducing pipe 410 and generating microwave power of 200 W in the excitation section 408, a p-type a-Si:C:H:F film with a film thickness of 100 Å was formed on the Cr layer 102. Then, by introducing SiF$_4$ at 30 sccm and CF$_4$ at 3 sccm through the gas introducing pipe 409, introducing H$_2$ at 50 sccm and Ar at 250 sccm through the gas introducing pipe 410, and generating microwave powers of 100 W and 200 W respectively in the excitation sections 407 and 408, a non-doped a-Si:C:H:F film with a film thickness of 150 Å was formed. Following otherwise the same procedure as in Example 2-1, a photosensor having a photoconductive member 104 with the p-type a-Si:C:H:F film and the non-doped a-Si:C:H:F film laminated alternately each in 25 layers was prepared.

Separately, samples of the p-type a-Si:C:H:F film and the non-doped a-Si:C:H:F film were prepared by the same preparation conditions and preparation device as described above.

The photosensor and the samples thus obtained were subjected to the same measurement and analysis as described in Example 2-1. As the result, the S/N ratio was found to be a good value of $1\times 10^3$ with Comparative Example as a standard. This value was not changed even when light was continuously irradiated for 24 hours. Photoirradiation was effected from the ITO side.

The hydrogen contents in the non-doped a-Si:C:H:F film and the p-type a-Si:C:H:F film were found to be each 9 atomic % as shown in Table 2-5, thus being less than 10 atomic % or less.

EXAMPLE 2-6

A plural number of photosensors and samples were prepared according to the same method and by use of the same device as in Example 2-1 except for changing the preparation conditions of the photoconductive member as shown in Table 2-6.

The photosensors and the samples obtained were subjected to the same measurement and analysis as in Example 2-1. As the result, as shown in Table 7, the S/N ratios of the photosensors No. 6001 to No. 6005 exhibited good S/N ratios with Comparative Example as the standard. All of these photosensors were not changed in S/N ratio even when light was continuously irradiated for 24 hours.

The hydrogen contents in the p-type a-Si:H:F film and the n-type a-Si:H:F film in the respective samples No. 60011 to No. 60015 were as shown in Table 2-8. Thus, the hydrogen contents in the respective films were all 10 atomic % or less.

EXAMPLE 2-7

A photosensor shown in FIG. 3 was prepared by means of the device shown in FIG. 5 with a distance between the tip end of the outer pipe and the substrate surface of 5 cm.

In this case, a non-doped Si film was formed to 200 Å on the Cr layer 202 by introducing SiF$_4$ at 30 sccm through the gas introducing pipe 409, and H$_2$ at 100 sccm and Ar at 250 sccm through the gas introducing pipe 410, respectively, and generating microwave power of 100 W in the excitation section 407 and of 400 W in the excitation section 408. Then, a p-type Si film was formed to 200 Å by introducing SiF$_4$ at 30 sccm and BF$_3$ diluted to 300 ppm with Ar at 10 sccm through the gas introducing pipe 409 and introducing H$_2$ at 100 sccm and Ar at 250 sccm through the gas introducing pipe 410, respectively, and generating microwave powers of 100 W in the excitation section 407 and of 400 W in the excitation section 408. With other conditions being the same as in Example 2-1, a photosensor having a photoconductive member 204 with the non-doped photoconductive film and the p-type photoconductive film laminated alternately each in 10 layers was prepared.

Separately, 2 samples each having only the non-doped photoconductive film and only the p-type photoconductive film were prepared, and one of the respective samples was subjected to measurement of quantitative analysis of hydrogen by SIMS, and the other one was subjected to examination of presence of crystallinity by electron beam diffraction (RHEED).

When the same measurement as in Example 2-1 was conducted for the photosensor obtained, the S/N ratio was found to be a good value of $1 \times 10^{2.7}$ with Comparative Example as the standard. This value was not changed even after photoirradiation was continued for 24 hours.

Hydrogen contents in the non-doped photoconductive film and the p-type photoconductive film and presence of crystallinity were as shown in Table 2-9. The hydrogen contents in the respective films were 10 atomic % or less.

As described above, according to this embodiment, in a photosensor having a photoconductive member, said photoconductive member has a structure with laminated product comprising functional thin films superposed on one another, said functional thin films being at least two kinds and having equal band gaps to each other and different electroconductive types and/or electroconductivities from each other, and by making the hydrogen content of said functional thin film 10 atomic % or less, the film quality becomes dense and charge transfer of small number of carriers is improved. As a result, diffusion length of carriers can be elongated, whereby electrical and optical characteristics can be greatly improved to provide a photosensor with S/N ratio not found in the prior art.

Next, another embodiment of the present invention is to be described. The structure of this embodiment is substantially the same as that shown in FIG. 3. However, it is different in the following points. That is, the photoconductive member 104 has a structure having functional thin films laminated alternately, said functional thin films having conduction types equal to each other, having at least two kinds of band gaps different from each other and hydrogen content in the film of 10 atomic % or less, such as amorphous (hereinafter abbreviated as a-) Si:H:F/a-Si:Ge:H:F/a-Si:H:F/a-Si:Ge:H:F/ . . . , a-Si:H:F/a-Si:C:H:F/a-Si:H:F/a-Si:C:H:F/ . . . , a-Si:C:H:F/a-Si:H:F/a-Si:Ge:H:F/a-Si:C:H:F/a-Si:H:F/a-Si:Ge:H:F/ . . . , a-Si:H:F/polycrystal (hereinafter abbreviated as p-) Si:H:F/a-Si:H:F/p-Si:H:F/ . . . , etc.

EXAMPLE 3-1

A photosensor shown in FIG. 3 was prepared by means of a film forming device shown in FIG. 5.

In FIG. 3, the photosensor has an electrode 102 formed by heating vapor deposition of Cr on a glass substrate 101, has a photoconductive member 104 by laminating alternately a-Si:H:F film and a-Si:Ge:H:F film formed further thereon to form, and has finally provided a transparent electrode 103 of ITO.

First, the vacuum chamber 401 was internally evacuated to a vacuum degree of about $10^{-5}$ Torr. Then, the substrate was heated by the heating heater to a substrate temperature of 250° C. and maintained at that temperature.

Under such conditions, SiF$_4$ was introduced at 30 sccm through the introducing pipe 409, and H$_2$ and Ar were introduced at 20 sccm and 250 sccm, respectively, through the gas introducing pipe 410. When the flow rate of the respective gases were stabilized, the pressure within the chamber was maintained at 0.3 Torr. Then, microwave with a frequency of 2.45 GHz was generated in the excitation section 407 at 100 W and in the excitation section 408 at 200 W.

By maintaining this state for 100 seconds a n-type a-Si:H:F film with a film thickness of 200 Å was deposited on the Cr layer 102.

Next, with the microwave power being turned off, introduction of SiF$_4$ was stopped and in place thereof GeF$_4$ gas diluted to 1 % with SiF$_4$ was introduced at 30 sccm through the gas introducing pipe 409. When the flow rate of the gas was stabilized, with the pressure in the vacuum chamber being maintained at 0.3 Torr, again microwave was generated in the excitation section 407 at 100 W and in the excitation section 408 at 200 W.

By maintaining this state for 100 seconds, an a-Si:Ge:H:F film with a film thickness of 200 Å was deposited on the a-Si:H:F film.

Next, with the microwave power being turned off, introduction of GeF$_4$ diluted with SiF$_4$ was stopped and SiF$_4$ gas was introduced at 30 sccm through the gas introducing pipe 409. When the gas flow rate was stabilized, with the pressure in the, vacuum chamber was maintained at 0.3 Torr, and microwave was generated in the excitation section 407 at 100 W and in the excitation section 408 at 200 W.

Under this state, an a-Si:H:F film with a film thickness of 200 Å was deposited on the a-Si:Ge:H:F film.

Subsequently, following the same procedure, the a-Si:H:F film and the a-Si:Ge:H:F film were deposited alternately each to a thickness of 200 Å, to form a photoconductive member 104 with a film thickness of 0.8 μm having 20 layers each of the respective films laminated.

Then, simultaneously with stopping of all of introduction of the gases introduced into the vacuum chamber 401, the heater was stopped and also the microwave power was turned off.

After cooling of the substrate 101, it was taken out from the film forming device, and the substrate was heated to about 200° C. by another sputtering device (not shown) to have a transparent electroconductive film of ITO 103 was vapor deposited to 500 Å.

When the S/N ratio of the photosensor thus obtained was measured according to the method as described above, it had a good value of 10.3 with the value of Comparative Example as described below as being 1. This value was not changed even after a photoirradiation was continued for 24 hours. Photoirradiation was effected from the ITO side.

Separately, from the above sensor, samples of the a-Si:H:F film and the a-Si:Ge:H:F film were respectively prepared under the same conditions of gas flow rate, microwave power, inner pressure, substrate temperature as during preparation of the photoconductive member of the photosensor shown in FIG. 3 on a glass substrate, and provided for quantitative analysis, of hydrogen by SIMS. The analytical results for the hydrogen contents in a-Si:H:F film and a-Si:Ge:H:F film are shown in Table 3-1. As shown in Table 3-1, the hydrogen contents in the respective films were found to be each 2 atomic %, thus being less than 10 atomic %.

Comparative Example

Similar photosensor and samples were prepared by the same method and device as in Example 3-1 except for changing H$_2$ introduced through the gas introducing pipe 410 to 70 sccm, and measurement and analysis were performed similarly as in Example 3-1. As a result, the value of S/N ratio of the photosensor obtained is made 1 as the standard for measurement results of S/N ratio of photosensors in other Examples. In this Comparative Example, after photoirradiation was continued for 24 hours, the value was not good and was reduced to $1 \times 10^{-0.2}$. Hydrogen contents in a-Si:H:F film and a-Si:Ge:H:F film were found to be 11 atomic % in each film as shown in Table 3-2, thus exceeding 10 atomic %.

EXAMPLE 3-2

A photosensor shown in FIG. 3 was prepared by the same device and method as in Example 3-1. In this case, on the Cr layer 102, a p-type a-Si:H:F film and a p-type a-Si:Ge:H:F film were alternately laminated, followed finally by formation of transparent electrode 103 of ITO. During preparation of the p-type a-Si:H:F film, and the p-type a-Si:Ge:H:F film, respectively, together with flowing of SeF$_4$ gas at 30 sccm and a gas mixture of GeF$_4$/SiF$_4$ (1 %) at 30 sccm, BF$_3$ diluted with Ar (200 ppm) was flowed at 10 sccm, and otherwise using all the same preparation conditions and method as in Example 3-1, thus preparing a photosensor having a photoconductive member 104 with the p-type a-Si:H:F film and the p-type a-Si:Ge:H:F film laminated alternately each in 20 layers.

Separately, samples of the p-type a-Si:H:F film and the p-type a-Si:Ge:H:F film were prepared by the same device and the same preparation conditions as described above and analyzed similarly as in Example 3-1.

When the same measurement as in Example 3-1 was conducted for the photosensor obtained, the S/N ratio had a good value of 12.3 with Comparative Example as a standard. This value was not also changed even after photoirradiation was continued for 24 hours. Photoirradiation was effected from the ITO side.

The hydrogen contents in the p-type a-Si:H:F film and the p-type a-Si:Ge:H:F film are shown in Table 3-3. As shown in Table 3-3, the hydrogen content in each film was found to be 5 atomic %, thus being less than 10 atomic %.

EXAMPLE 3-3

A photosensor shown in FIG. 3 was prepared in the same manner as in Example 3-1 by means of the device shown in FIG. 5. The photoconductive member 104 of this Example has a constitution with a-Si:C:H:F film and a-Si:H:F film laminated alternately.

Through the gas introducing pipe 409, SiF$_4$ was introduced at 30 sccm, CF$_4$ at 3 sccm, and a microwave power of 100 W was thrown into the excitation section 407, while through the gas introducing pipe 410, H$_2$ was introduced at 50 sccm and Ar at 250 sccm, and a microwave power of 200 W was generated in the excitation section 408, to form an Si-C:H:F film with a film thickness of 100 Å on the Cr layer 102. Then, through the gas introducing pipe 409, SiF$_4$ was introduced at 30 sccm, and through the gas introducing pipe 410, H$_2$ was introduced at 20 sccm and Ar at 250 sccm, and microwave powers of 100 W and 200 W were respectively generated in the excitation sections 407 and 408 to form an a-Si:H:F film with a film thickness of 150 Å.

By repeating the above procedure, a photosensor having a photoconductive member 104 with a-Si:C:H:F film and a-Si:H:F film laminated alternately each in 25 layers was prepared.

Separately, samples of a-Si:C:H:F film and a-Si:H:F film under the equal preparation conditions to those as described above were prepared.

When the same measurement and analysis as in Example 3-1 were conducted for the photosensor and the samples thus obtained, the S/N ratio was found to have a good value of 9.8, when the value of the above Comparative Example was made 1. This value was also unchanged even when photoirradiation was continued for 24 hours.

The hydrogen contents in a-Si:C:H:F film and a-Si:H:F film were as shown in Table 3-4. As shown in Table 3-4, the hydrogen contents in the respective films were found to be less than 10 atomic %.

EXAMPLE 3-4

A photosensor shown in FIG. 3 with a photoconductive member 104 consisting of overlaid laminated products of (a-Si:C:H:F/a-Si:H:F/a-Si:Ge:H:F) was prepared by means of the device shown in FIG. 5.

The preparation conditions of a-Si:C:H:F film and a-Si:H:F film were equal to Example 3-3, and the preparation conditions of a-Si:Ge:H:F film were made equal to Example 3-1, and a-Si:C:H:F film with thickness of 100 Å, a-Si:H:F film with thickness of 100 Å and formed each in 20 layers, to prepare a photoconductive member with a thickness of 6000 Å. On this member was formed an ITO transparent electroconductive layer with a thickness of 500 Å was prepared under the same conditions as in Example 3-1.

For the photosensor obtained as described above, the same measurement and analysis were conducted similarly as in Example 3-1. The S/N ratio was found to have a good value of 9.1, when the S/N ratio of the Comparative Example was made 1. No change of this value was observed, even when photoirradiation was continued for 24 hours.

EXAMPLE 3-5

A photosensor having a structure shown in FIG. 3 was prepared by means of the device shown in FIG. 5 with a distance between the outer pipe 406 and the substrate 404 of 5 cm.

After p-Si:H:F film was formed to 200 Å on the Cr layer 202 by introducing SiF$_4$ at 30 sccm through the gas introducing pipe 409 and H$_2$ at 100 sccm and Ar at 250 sccm through the gas introducing pipe 410, respectively, and generating a microwave power of 100 W into the excitation section 407 and of 400 W into the excitation section 408, a-Si:H:F film was formed to a thickness of 100 Å under the same conditions as in Example 3-1.

By repeating the above operation 30 times, a photoconductive member 104 with a thickness of 9000 Å was prepared.

Separately, two samples having only p-Si:H:F film were prepared under the same conditions as above, and one of them is provided for analysis of hydrogen content by SIMS, and the other for confirmation of crystallinity by electron beam diffraction (RHEED) to obtain the analytical results shown in Table 3-5.

When the same measurement as in Example 3-1 was performed for the photosensor obtained as described above, the S/N ratio was found to have a good value of 8.7 with the value of the above Comparative Example as the standard. This value was not changed even after light was continuously irradiated for 24 hours.

As described above, according to this embodiment, in a photosensor having a photoconductive member, said photoconductive member has a structure with laminated product comprising functional this films superposed on one another, said laminated product comprising at least two kinds of functional thin films, said functional films having electroconductive types equal to each other and also band gaps different from each other, and by making the hydrogen content of said functional thin film 10 atomic % or less, the film quality becomes dense and charge transfer of small number of carriers is improved. As the result, diffusion length of carriers can be elongated, whereby electrical and optical characteristics can be greatly improved to provide a photosensor with S/N ratio not found in the prior art.

Next, another embodiment of the present invention is to be described. The structure of this embodiment is substantially the same as that shown in FIG. 3. However, it is different in the following points.

Figure 6:
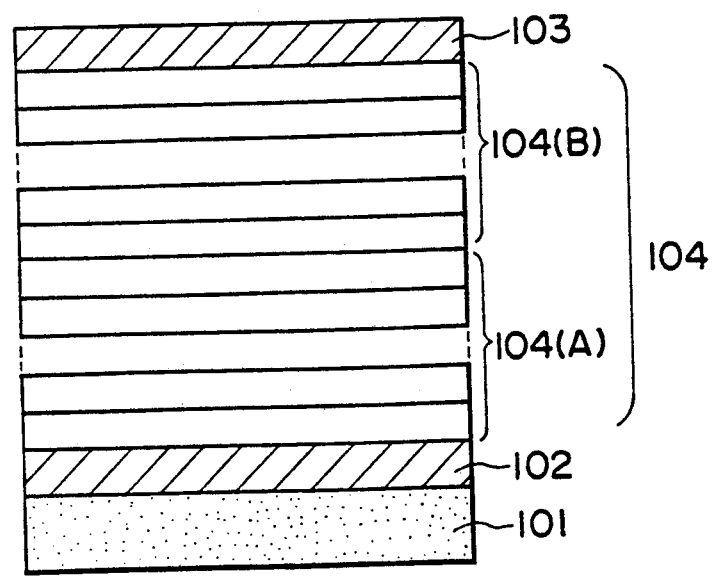
FIG. 6 is a sectional view showing schematically a typical example of the photosensor of another embodiment of the present invention.

The photoconductive member 104, as shown in FIG. 6, is constituted of a first photoconductive member 104(A) with a structure comprising laminated products of functional thin films having at least two or more different electroconduction types and/or electroconductivities and band gaps different from each other laminated, and a second photoconductive member 104(B) with a structure comprising laminated products of functional thin films having band gaps equal to each other laminated, said first photoconductive member and said photoconductive member being constituted in this order from the substrate side, both of said first photoconductive member 104(A) and said second photoconductive member 104(B) having functional thin films with hydrogen content of 10 atomic % or less alternately laminated. For example, it has a structure such as p/n/p/n/ ..., p/i/p/i/ ..., n/i/n/i/ ..., n/i/p/n/i/p/ ..., n+/n/n+/n/ ..., etc.

EXAMPLE 4-1

A photosensor shown in FIG. 6 was prepared by means of a film forming device shown in FIG. 5 in the same manner as in Example 1-1.

The photosensor in this embodiment has an electrode 102 formed by heating vapor deposition of Cr on a glass substrate 101, further has n-type a-Si:Ge:H:F film and p-type a-Si:H:F film laminated alternately thereon to form a first photoconductive member 104(A), and then n-type a-Si:H:F film and p-type a-Si:H:F film laminated alternately thereon to form a second photoconductive member 104(B), and has finally provided a transparent electrode 103 of ITO.

First, the vacuum chamber 401 was internally evacuated to a vacuum degree of about $10^{-5}$ Torr. Then, the substrate was heated by the heater to a substrate temperature of 250° C. and maintained at that temperature.

Under such conditions, through the introducing pipe 409, SiF$_4$ at 30 sccm, PH$_3$ diluted to 30 ppm with Ar at 10 sccm and 0.2 vol% of GeF$_4$ based on SiF$_4$ were respectively introduced, and also through the gas introducing pipe 410, H$_2$ was introduced at 30 sccm and Ar at 250 sccm. When the flow rate of the respective gases were stabilized, the pressure within the chamber was maintained at 0.3 Torr. Then, microwave with a frequency of 2.45 GHz was generated in the excitation section 407 at 100 W and into the excitation section 408 at 200 W.

By maintaining this state for 90 seconds, a n-type a-Si:Ge:H:F film with a film thickness of 200 Å was deposited on the Cr layer 102.

Next, with the microwave power being turned off, introduction of PH$_3$ and GeF$_4$ was stopped, and BF$_3$ diluted to 300 ppm with Ar was introduced at 10 sccm through the gas introducing pipe 409. The flow rate of H$_2$ introduced through the gas introducing pipe 410 was changed to 20 sccm, and when the flow rate of the gas was stabilized, with the pressure in the vacuum chamber 401 being maintained at 0.3 Torr, again microwave was generated in the excitation section 407 at 100 W and into the excitation section 408 at 200 W. By maintaining this state for 90 seconds, a p-type a-Si:H:F film with a film thickness of 200 Å was deposited on the n-type a-Si:Ge:H:F film.

Next, with the microwave power being turned off, introduction of BF$_3$ was stopped, and PH$_3$ diluted to 300 ppm with Ar at 10 sccm and GeF$_4$ in amount of 0.2 vol % based on SiF$_4$ were introduced through the gas introducing pipe 409. The flow rate of H$_2$ introduced through the gas introducing pipe 410 was changed to 30 sccm, and when the gas flow rate was stabilized, with the pressure in the vacuum chamber 401 being maintained at 0.3 Torr, again microwave was generated in the excitation section 407 at 100 W and into the excitation section 408 at 200 W.

Under this state, an n-type a-Si:H:F film with a film thickness of 200 Å was deposited on the p-type a-Si:Ge:H:F film.

Subsequently, following the same procedure, the p-type a-Si:Ge:H:F film and the n-type a-Si:Ge:H:F film were deposited alternately each to a thickness of 200 Å, to form a first photoconductive member 104(A) with a film thickness of 4000 Å having 10 layers each of the respective films laminated.

Then, the microwave power was turned off, introduction of BF$_3$ was stopped, PH$_3$ diluted to 300 ppm with Ar was introduced at 10 sccm through the gas introducing pipe 409 and, with the pressure in the chamber 401 being maintained at 0.3 Torr, microwaves of 100 W and 200 W were thrown respectively into the excitation section 407 and 408. With this state being maintained for 100 seconds, a n-type a-Si:H:F film with a film thickness of 200 Å was deposited on the photoconductive member 104(A).

Next, the microwave power was turned off, introduction of PH$_3$ was stopped and BF$_3$ diluted to 300 ppm with Ar was introduced through the gas introducing pipe 409. When the flow rate of the gas was stabilized, with the pressure in the chamber being maintained at, 0.3 Torr, again microwaves were generated at 100 W in the excitation section 407 and at 200 W into the excitation section 408.

By maintaining this state for 100 seconds, a p-type a-Si:H:F film with a thickness of 200 Å was deposited on the n-type a-Si:H:F film.

Subsequently, following the same procedures, the p-type a-Si:H:F film and the n-type a-Si:H:F film were deposited alternately each to 200 Å, to form a second photoconductive member 104(B) with a film thickness of 4000 Å having laminated those films each in 10 layers.

Thus, after providing a photoconductive member 104 by forming the first photoconductive member 104(A) and the second photoconductive member 104(B) in this order on the Cr layer 102, the microwave power was turned off and also the heater was turned off simultaneously with stopping of all the gases introduced into the vacuum chamber 401. After sufficient cooling, the substrate 101 was taken out from the film forming device, and after the substrate 101 was heated to 200° C. by means of a sputtering device (not shown), a transparent electroconductive film 203 of ITO was vapor deposited to 500 Å.

When the S/N ratio of the photosensor thus obtained was measured according to the method as described above, it had a good value of 10.5 with the value of Comparative Example as described below as being b 1. This value was not changed even after a photoirradiation was continued for 24 hours. Photoirradiation was effected from the ITO side.

Separately, samples of the p-type a-Si:H:F film, the n-type a-Si:H:F film, the n-type a-Si:Ge:H:F film were respectively prepared on a glass substrate according to the same preparation conditions and the preparation device as described above, and were measured for optical band gap and quantitative analysis of hydrogen by SIMS (excluding the sample of the n-type a-Si:H:F film). These results are shown in Table 1-1.

As shown in Table 4-1, the hydrogen content in each film was 10 atomic % or less. The optical band gaps of the p-type a-Si:H:F film and the n-type a-Si:Ge:H:F film constituting the first photoconductive member 104(A) were different from each other.

Comparative Example

Similar photosensor and samples were prepared by the same method and device as in Example 4-1 except for changing $H_2$ introduced through the gas introducing pipe 410 during preparation of the n-type a-Si:Ge:H:F film and the p-type a-Si:H:F film to 100 sccm and 70 sccm, respectively, and measurement and analysis were performed similarly as in Example 1-1. As the result, the value of S/N ratio of the photosensor obtained is made 1 as the standard for measurement results of S/N ratio of photosensors in other Examples. In this Comparative Example, after photoirradiation was continued for 24 hours, the value was not good as reduced to 0.8. The values of optical band gap of the p-type a-Si:H:F film and the n-type a-Si:Ge:H:F film and hydrogen contents are as shown in Table 4-2 (concerning measurement of optical band gap, no measurement of the n-type a-Si:H:F film was conducted).

As shown in Table 4-2, the hydrogen contents in each film exceeded 10 atomic %.

EXAMPLE 4-2

A photosensor shown in FIG. 3 was prepared by means of the device shown in FIG. 5. In this case, a photosensor having the same constitution as in Example 4-1 was prepared except that the first photoconductive member 104(A) had a structure with a p-type a-Si:H:F film and a non-doped a-Si:Ge:H:F film alternately laminated. During preparation of the non-doped a-Si:Ge:H:F film, except for introducing no $PH_3$ through the gas introducing pipe 409, the preparation conditions and the method were made entirely the same as in Example 4-1, whereby a photosensor was prepared, having the first photoconductive member 104(A) with the non-doped a-Si:Ge:H:F film and the p-type a-Si:H:F film laminated alternately each in 10 layers and the second photoconductive member 104(B) with the p-type a-Si:H:F film and the n-type a-Si:H:F film laminated alternately each in 10 layers.

Separately, a sample of the non-doped a-Si:Ge:H film was prepared by use of the same preparation device and conditions as described above, and the same analysis as in Example 4-1 was conducted.

When the same measurement as in example 4-1 was conducted for the photosensor obtained, the S/N ratio had a good value of 10.2 with Comparative Example as the standard. This value was not also changed even after photoirradiation was continued for 24 hours. Photo-irradiation was effected from the ITO side.

The hydrogen content and the optical band gap in the non-doped a-Si:Ge:H:F film were as shown in Table 4-3.

As shown in Table 4-3, the hydrogen content in the film was found to be 10 atomic % or less.

EXAMPLE 4-3

A photosensor shown in FIG. 6 was prepared by means of the device shown in FIG. 5. In this case, a photosensor having the same constitution as in Example 4-1 was prepared except that the first photoconductive member 104(A) had a structure with a non-doped Si:C:H:F film and a n-type a-Si:Ge:H:F film alternately laminated. During preparation of the non-doped a-Si:H:F film, except for introducing no $BF_3$ through the gas introducing pipe 409, the preparation conditions and the method were made entirely the same as in Example 4-1, whereby a photosensor was prepared, having the first photoconductive member 104(A) with the n-type a-Si:Ge:H:F film and the non-doped a-Si:H:F film laminated alternately each in 10 layers and the second photoconductive member 104(B) with the p-type a-Si:H:F film and the n-type a-Si:H:F film laminated alternately each in 10 layers.

Separately, a sample of the non-doped a-Si:Ge:H film was prepared by use of the same preparation device and conditions as described above, and the same analysis as in Example 4-1 was conducted.

When the same measurement as in Example 4-1 was conducted for the photosensor obtained, the S/N ratio had a good value of 10.0 with Comparative Example as the standard. This value was not also changed even after photoirradiation was continued for 24 hours. Photoirradiation was effected from the ITO side.

The hydrogen content and the optical band gap in the non-doped a-Si:Ge:H:F film were as shown in Table 4-4.

As shown in Table 4-4, the hydrogen content in the film was found to be 10 atomic % or less

EXAMPLE 4-4

A photosensor having a photoconductive member 104 constituted of the first photoconductive member 104(A) with the p-type a-Si:C:H:F film and the n-type a-Si:H:F film laminated alternately and the second photoconductive member 104(B) with the p-type a-Si:C:H:F film and the non-doped a-Si:C:H:F film laminated alternately was prepared according to the same method as in Example 4-1 by means of the device shown in FIG. 5. In this case, through the gas introducing pipe 409, $SiF_4$ was introduced at 30 sccm and $PH_3$ diluted to 300 ppm with Ar at 10 sccm, and microwave power of 100 W was generated in the excitation section 407, while through the gas introducing pipe 410, $H_2$ was introduced at 20 sccm and Ar at 250 sccm, and microwave power of 200 W generated in the excitation section 408, to form an n-type a-Si:H:F film with a film thickness of 200 Å on the Cr layer 102. Then, through the gas introducing pipe 109, SiF$_4$ was introduced at 30 sccm, BF$_3$ diluted to 300 ppm with Ar at 10 sccm and CF$_4$ at 10 sccm and microwave power of 100 W was gene the excitation section 407, while through the gas introducing pipe 410, H$_2$ was introduced at 50 sccm and Ar at 250 sccm and microwave power of 200 W generated in the excitation section 408, to form a p type a-Si:C:H:F film with a film thickness of 100 Å. Thus, the first photoconductive member 104(A) having the n-type a-Si:H:F film and the p-type a-Si:C:H:F film laminated alternately each in 20 layers was formed.

Next, with the microwave powers being turned off, introduction of BF$_3$ was stopped, and again microwaves of 100 W and 200 W were generated respectively in the excitation sections 407 and 408, to form a non-doped a-Si:C:H:F film with a film thickness of 100 Å. Then, with the microwave powers being turned off, BF diluted to 300 ppm with Ar was introduced through the gas introducing pipe 409, and again microwaves of 100 W and 200 W were generated in the excitation sections 407 and 408, to form a p-type a-Si:C:H:F film with a thickness of 150 Å. Following subsequently the same procedures, the second photoconductive member 104(B) having the non-doped a-Si:C:H:F film and the p-type a-Si:C:H:F film laminated alternately each in 5 layers was formed.

Otherwise, similarly as described in Example 4-1, a photosensor shown in FIG. 6 was prepared. Separately, samples of the p-type a-Si:C:H:F film, the non-dopes a-Si:C:H:F film and the n-type a-Si:H:F film were prepared by use of the same preparation conditions and device as described above.

The photosensor and samples thus obtained were subjected to the same measurement and analysis as in Example 4-1 (no measurement of band gap of the non-doped a-Si:C:H:F was conducted), the S/N ratio was found to be a good value of 11.3 with Comparative Example as the standard. When photoirradiation was continued for 24 hours, this value remained unchanged. Photoirradiation was effected from the ITO side. The measurement and analysis results of the respective sample films are shown in Table 4-5.

As shown in Table 4-5, the hydrogen content in each film was found to be 10 atomic % or less. The optical band gaps of the p-type a-Si:C:H:F film and the n-type a-Si:H:F film constituting the first photoconductive member 14(A) were different from each other.

EXAMPLE 4-5

A photosensor having the same constitution as in Example 4-4 except that the first photoconductive member 104(A) had a structure with the p-type a-Si:-Ge:H:F film and non-doped a-Si:C:H:F film laminated alternately was prepared according to the same method as in Example 4-1 by means of the device shown in FIG. 5. In this case, through the gas introducing pipe 409, SiF$_4$ was introduced at 30 sccm and CF$_4$ at 3 sccm, while through the gas introducing pipe 410, H$_2$ was introduced at 50 sccm and Ar at 250 sccm, and microwave powers of 100 W and 200 W were thrown respectively into the excitation sections 407 and 408, to form a non-doped a-Si:C:H:F film with a film thickness of 150 Å on the Cr layer 102. Then, through the gas introducing pipe 109, SiF$_4$ was introduced at 30 sccm, BF$_3$ diluted to 300 ppm with Ar at 10 sccm and 0.2 vol.% (based on SiF$_4$) of GeF$_4$ and microwave power of 100 W was generated in the excitation section 407, while through the gas introducing pipe 410, H$_2$ was introduced at 30 sccm and Ar at 250 sccm and microwave power of 200 W generated in the excitation section 408, to form a p-type a-Si:Ge:H:F film with a film thickness of 400 Å. Following subsequently same procedures, the first photoconductive member 104(A) having the non-doped a-Si:C:H:F film and the p-type a-Si:Ge:H:F film laminated alternately each in 25 layers was formed.

Otherwise, a photosensor with the constitution similarly as described in Example 4-4 was prepared. Separately, samples of the p-type a-Si:Ge:H:F film and the non-doped a-Si:C:H:F film were prepared by use of the same preparation conditions and device as described above.

The photosensor and samples thus obtained were subjected to the same measurement and analysis as in Example 4-1, the S/N ratio was found to be a good value of 9.8 with the Comparative Example as the standard. When photoirradiation was continued for 24 hours, this value remained unchanged. Photoirradiation was effected from the ITO side.

The band gap values of the p-type a-Si:Ge:H:F film and the non-doped a-Si:C:H:F film and the hydrogen contents in the films were as shown in Table 4-6.

As shown in Table 4-6, the hydrogen content in each film was found to be 10 atomic % or less, with optical band gaps being different from each other.

EXAMPLE 4-6

A plural number of photosensors and samples were prepared by use of the same method and device as in Example 4-1 except that the preparation conditions of the first photoconductive member 104(A) were changed as shown in Table 407, and the preparation conditions of the second photoconductive member as shown in Table 4-8.

When the photosensors and samples obtained were subjected to the same measurement and analysis as in Example 4-1, the S/N ratios of the photosensors No. 6001 to No. 6005 exhibited good results, with Comparative Example as the standard. Even when photoirradiation was continued for 24 hours, all of these photosensors were not changed in current ratio. Photoirradiation was effected from the ITO side.

The optical band gap values in the respective samples No. 60011 to No. 60015 and the hydrogen contents in the films were as shown in Table 4-10.

As shown in Table 4-10, the hydrogen atom in each film was 10 atomic % or less, and the optical band gaps in the p-type a-Si:H:F film and the n-type a-Si:Ge:H:F film constituting the first photoconductive member 104 were different from each other.

EXAMPLE 4-7

A photosensor shown in FIG. 6 was prepared by means of the device shown in FIG. 5 with a distance between the tip end of the outer pipe and the substrate surface of 5 cm. In this case, during formation of the first photoconductive member 104(A), a p-type Si film was formed to 200 Å on the Cr layer 202 by introducing SiF$_4$ at 30 sccm and BF$_3$ diluted to 300 ppm with Ar at 10 sccm through the gas introducing pipe 409, and H$_2$ at 100 sccm and Ar at 250 sccm through the gas introducing pipe 410, respectively, and generating microwave power of 100 W into the excitation section 407 and of 400 W into the excitation section 408. Then, a non-doped Si:Ge thin film was formed to 200 Å by introducing SiF$_4$ at 30 sccm and GeF$_4$ in 0.2 vol % based on SiF$_4$ through the gas introducing pipe 409 and introducing H₂ at 100 sccm and Ar at 250 sccm through the gas introducing pipe 410, respectively, and generating microwave powers of 100 W the excitation section 407 and of 400 W into the excitation section 408. With other conditions being the same as in Example 4-1, a photosensor having a photoconductive member 204 with the p-type Si thin film and the non-doped Si:Ge thin film laminated alternately each in 10 layers was prepared.

During formation of the second photoconductive member 104(B), a non-doped Si thin film was formed to 200 Å on the first photoconductive member 104(A) by introducing SiF₄ at 30 sccm through the gas introducing pipe 409, H₂ at 100 sccm and Ar at 250 sccm through the gas introducing pipe 410, and generating microwaves of 100 W into the excitation section 407 and of 400 W into the excitation section 408. Then, a p-type Si thin film was formed by introducing SiF₄ at 30 sccm and BF₃ diluted to 300 ppm with Ar through the gas introducing pipe 409, and H₂ at 100 sccm and Ar at 250 sccm through the gas introducing pipe 410, respectively, and generating microwaves of 100 W into the excitation section 407 and of 400 W into the excitation section 408. With other conditions being the same as in Example 4-1, and the second photoconductive member 104(B) with the non-doped Si thin film and the p-type Si thin film laminated alternately each in 10 layers was formed.

A photosensor with otherwise the same constitution as in Example 4-1 was prepared. Separately, 2 samples each having only the p-type Si thin film, only the non-doped Si thin film and the non-doped Si:Ge thin film were prepared, and one of the respective samples was subjected to measurement of optical band gap (no measurement of the sample comprising only the non-doped Si thin film was conducted) and quantitative analysis of hydrogen by SIMS, and the other one was subjected to examination of presence of crystallinity by electron beam diffraction (RHEED).

When the same measurement as in Example 1-1 was conducted for the photosensor obtained, the S/N ratio was found to be a good value of 9.2 with the Comparative Example as the standard. This value was not changed even after photoirradiation was continued for 24 hours.

Values of optical band gaps of the p-type Si thin film, the non-doped Si thin film and the non-doped Si:Ge thin film, hydrogen contents in the films and presence of crystallinity were as shown in Table 4-11. As shown in Table 4-11, the hydrogen content in each film was found to be 10 atomic % or less, and the optical band gaps of the p-type Si thin film and the non-doped Si:Ge thin film constituting the first photoconductive member 104 were different from each other.

As described above, according to this embodiment, in a photosensor constituted of the first photoconductive member and the second photoconductive member, said photoconductive member has a structure with laminated product comprising at least two or more functional thin films superposed on one another, each functional thin film constituting said first photoconductive member having electroconductive types and/or electroconductivities different from each other and also band gaps different from each other, with the hydrogen content of said functional thin film being 10 atomic % or less, whereby the film quality becomes dense and charge transfer of small number of carriers is improved. As the result, diffusion length of carriers can be elongated, whereby electrical and optical characteristics can be greatly improved to provide a photosensor with S/N ratio not found in the prior art.

Next, another embodiment of the present invention is to be described. The structure of this embodiment is substantially the same as that shown in FIG. 3. However, it is different in the following points. That is, the photoconductive member 104 has a structure having functional thin films having at least two kinds of electroconduction types and/or electroconductivities and a hydrogen content in the film of 10 atomic or less, such as p/n/p/n/ . . . , p/i/p/i/ . . . , n/i/n/i/ . . . , n/i/p/n/i/p/ . . . , n+/n/n+/n/ . . . , etc.

In this embodiment, the above functional thin film is constituted of a non-monocrystalline semiconductor having photoconductive function, and Si may be mentioned as a preferable matrix thereof, but for the purpose of obtaining a desired photosensor, at least one selected from among Ge, O, N, Sn, C, etc. is incorporated therein and its content is continuously varied in the laminated direction, thereby varying the band gap continuously in the laminated direction.

EXAMPLE 5-11

A photosensor shown in FIG. 3 was prepared by means of a film forming device shown in FIG. 5.

In FIG. 3, the photosensor has an electrode 102 formed by heating vapor deposition of Cr on a glass substrate 101, further has n-type a-SiC:H:F film and p-type a-SiC:H:F film laminated alternately thereon to form a photoconductive member 104, and has finally provided a transparent electrode 103 of ITO.

The film forming device shown in FIG. 5 has a substrate holder 403 having a heating heater built therein placed in a vacuum chamber 401 having an evacuation outlet 402, holds a glass substrate 404 having Cr with a film thickness of abut 500 Å vapor deposited by resistance heating at room temperature thereon by another vacuum chamber (not shown) above said holder, thus ensuring a film forming space A. For introducing a precursor and an active species into the film forming space A, a gas introducing portion with a coaxial double structure comprising an outer pipe 406 and an inner pipe 405 is formed. The precursor and the active species introduced through these outer pipe and inner pipe are made desired precursor and active species by separate microwave exciting sections 408, 407 for excitation in the respective exciting decomposition spaces B and C.

The respective original gases of the above precursor and active species are introduced through the gas introducing pipes 410 and 409. In FIG. 5, the distance between the tip end of the outer pipe 405 and the substrate 404 is made 8 cm.

First, the vacuum chamber 401 was internally evacuated to a vacuum degree of about $10^{-5}$ Torr. Then, the substrate was heated by the heater to a substrate temperature of 250° C. and maintained at that temperature.

Under such conditions, SiF₄, CF₄ and PH₃ diluted to 300 ppm with Ar were introduced at 30 sccm, 2 sccm and 10 sccm, respectively, through the introducing pipe 410, and also H₂ and Ar were introduced at 20 sccm and 250 sccm, respectively, through the gas introducing pipe 409. When the flow rates of the respective gases were stabilized, the pressure within the chamber was maintained at 0.3 Torr. Then, microwave with a frequency of 2.45 GHz was generated in the excitation section 408 at 100 W and into the excitation section 407 at 200 W.

By maintaining this state for 100 seconds, a n-type a-SiC:H:F film with a film thickness of 200 Å was deposited on the Cr layer 102.

Next, with the microwave power being turned off, introduction of PH$_3$ was stopped, and B$_3$F diluted to 300 ppm with Ar was introduced at 10 sccm through the gas introducing pipe 410. The flow rate of CF$_4$ was set at 4 sccm. When the flow rate of the gas was stabilized, with the pressure in the vacuum chamber 401 being maintained at 0.3 Torr, again microwave was generated in the excitation section 408 at 100 W and into the excitation section 407 at 200 W.

By maintaining this state for 100 seconds, a p-type a-SiC:H:F film with a film thickness of 200 Å was deposited on the n-type a-SiC:H:F film.

Next, with the microwave power being turned off, introduction of BF$_3$ was stopped, and PH$_3$ diluted to 300 ppm with Ar at 10 sccm was introduced through the gas introducing pipe 410 at a pressure of 0.5 Torr or less. The flow rate of CF$_4$ was set at 6 sccm. When the gas flow rate was stabilized, with the pressure in the vacuum chamber 401 being maintained at 0.3 Torr, microwave was generated in the excitation section 408 at 100 W and into the excitation section 407 at 200 W.

Under this state, an n-type a-SiC:H:F film with a film thickness of 200 Å was deposited on the p-type a-SiC:H:F film.

Thus, by turning on and off introduction of PH$_3$ and BF$_3$ and also increasing the flow rate of CF$_4$ by 2 sccm, the p-type a-SiC:H:F film and the n-type a-SiC:H:F film were alternately deposited each to 200 Å, whereby a photoconductive member 104 with a film thickness of 0.8 μm comprising the respective films each in 20 layers was deposited.

Then, the heater was turned off simultaneously with stopping of all the gases introduced into the vacuum chamber 401 and also the microwave power was turned off.

After cooling of the substrate 101, it was taken out from the film forming device, and the substrate 101 was heated to about 200 °C. by means of another sputtering device (not shown), to have a transparent electroconductive film 103 of ITO vapor deposited to 500 Å.

The photosensor thus obtained was applied with a voltage and the current flowed was measured. As the result, the S/N ratio was found to be a good value of $1 \times 10^{3.3}$ with the value of Comparative Example described below as being 1. The S/N ratio was not changed even after photoirradiation was continued for 24 hours. Photoirradiation was effected from the ITO side.

Separately, from the sensor as described above, samples of the p-type a-SiC:H:F film and the n-type a-SiC:H:F film were prepared respectively under the same conditions of gas flow rate, microwave power, inner pressure, substrate temperature as during preparation of the photoconductive member of the photosensor shown in FIG. 3, and quantitative analysis of hydrogen was performed by SIMS. The analytical results of hydrogen contents in p-type and n-type a-SiC:H:F film are shown in Table 5-1. As shown in Table 5-1, hydrogen contents in the respective films are less than 10 atomic %.

Comparative Example

According to the same method as in Example 5-1 except for changing the flow rate of H$_2$ gas introduced through the gas introducing pipe 409 to 70 sccm, similar photosensor and samples were prepared and subjected to the same measurement and analysis as in Example 5-1, and the S/N ratio value obtained as the result is made 1 as the standard for other measurement results. After photoirradiation was continued for 24 hours, the value of S/N ratio was reduced to $1 \times 10^{-0.2}$.

The hydrogen contents in the p-type a-SiC:H:F film and the n-type a-SiC:H:F film were found to each exceed 10 atomic % as shown in Table 5-2.

EXAMPLE 5-2

A photosensor shown in FIG. 3 was prepared by the same device and method as in Example 5-1. In this case, a non-doped a-SiC:H:F film and a p-type a-SiC:H:F film were laminated alternately on a Cr layer 102, and finally a transparent electrode 103 of ITO was formed. During preparation of the non-doped a-SiC:H:F film, entirely the same preparation conditions and method were employed except that SiF$_4$ and CF$_4$ were flowed at 30 sccm and 2 sccm, respectively, through the gas introducing pipe 409, thus preparing a photosensor having a photoconductive member 104 with the non-doped a-SiC:H:F film and the p-type a-SiC:H:F film laminated alternately each in 20 layers.

Separately, a sample of the non-doped a-SiC:H:F film was prepared by use of the same preparation device and preparation conditions as described above and analyzed similarly as in Example 5-1.

When the same measurement was conducted for the photosensor obtained as in Example 5-1, the S/N ratio was found to be a good value of $1 \times 10^{2.5}$ with Comparative Example as a standard. This value was not changed even after photoirradiation was continued for 24 hours. Photoirradiation was effected from the ITO side.

The hydrogen content in the non-doped a-SiC:H:F film was as shown in Table 5-3. As shown in Table 5-3, the hydrogen content in the film was found to be less than 10 atomic %.

EXAMPLE 5-3

A photosensor shown in FIG. 3 was prepared by means of the device shown in FIG. 5 similarly as in Example 5-1. In this case, photoconductive member 104 was formed by laminating alternately the n-type a-SiC:H:F film and the non-doped a-SiC:H:F film. The preparation conditions of the n-type a-SiC:H:F film and the preparation conditions of the non-doped a-SiC:H:F film were the same as those in Example 5-1 and Example 5-2, with other conditions being all the same as in Example 5-1, thus preparing a photosensor having a photoconductive member 204 having the n-type a-SiC:H:F film and the non-doped a-SiC:H:F film laminated alternately each in 20 layers.

When the same measurement was conducted for the photosensor obtained similarly as in Example 5-1, the S/N ratio was found to be a good value of $1 \times 10^{3.1}$ with the Comparative Example as a standard. This value was not changed even after photoirradiation was continued for 24 hours. Photoirradiation was effected from the ITO side.

EXAMPLE 5-4

A photosensor shown in FIG. 3 with a photoconductive member having a structure of the p-type a-Si:Ge:H:F film and the n-type a-Si:Ge:H:F film alternately laminated was prepared according to the same method as in Example 5-1 by means of the device shown in FIG. 5. In this case, by introducing SiF$_4$ at 30 sccm and PH$_3$ diluted to 300 ppm with Ar at 10 sccm and 0.2 vol % of GeF$_4$ based on SiF$_4$ through the gas introducing pipe 410, and generating microwave power of 100 W into the excitation section 408, and also introducing H$_2$ at 30 sccm and Ar at 250 sccm through the gas introducing pipe 409 and generating microwave power of 200 W into the excitation section 407, a n-type a-Si:Ge:H:F film with a film thickness of 400 Å was formed on the Cr layer 102. Then, by introducing SiF$_4$ at 30 sccm, BF$_3$ diluted to 300 ppm with Ar at 10 sccm and 1.9 vol % of GeF$_4$ based on SiF$_4$ through the gas introducing pipe 410, and generating microwave power of 100 W into the excitation section 408, and also introducing H$_2$ at 30 sccm and Ar at 250 sccm through the gas introducing pipe 409 and generating microwave power of 200 W into the excitation section 407, a p-type a-Si:Ge:H:F film with a film thickness of 400 Å was formed Thus, by reducing the amount of GeF$_4$ introduced by 0.1 vol % every time when the p-type a-Si:Ge:H:F film and the n-type a-Si:Ge:H:F film were laminated, a photosensor having a photoconductive member 104 with the n-type a-Si:Ge:H:F film and the p-type a-Si:Ge:H:F film laminated alternately each in 10 layers was prepared.

Separately, samples of the n-type a-Si:Ge:H:F film and the p-type a-Si:Ge:H:F film were prepared by the same preparation conditions and preparation device as described above.

The photosensor and the samples thus obtained were subjected to the same measurement and analysis as described in Example 5-1. As the result, the S/N ratio was found to be a good value of $1 \times 10^{3.0}$ with the Comparative Example as a standard. This value was not changed even when light was continuously irradiated for 24 hours. Photoirradiation was effected from the ITO side.

The hydrogen contents in the n-type a-Si:Ge:H:F film and the p-type a-Si:Ge:H:F film were as shown in Table 5-4. As shown in Table 5-4, the hydrogen content in each film was found to be less than 10 atomic %.

EXAMPLE 5-5

A photosensor shown in FIG. 3 was prepared by means of the device shown in FIG. 5 with a distance between the tip end of the outer pipe and the substrate surface of 5 cm.

In this case, a non-doped SiC film was formed to 200 Å on the Cr layer 202 by introducing SiF$_4$ at 30 sccm and CF$_4$ at 2 sccm through the gas introducing pipe 409, and H$_2$ at 100 sccm and Ar at 250 sccm through the gas introducing pipe 410, respectively, and throwing microwave power of 100 W into the excitation section 407 and of 400 W into the excitation section 408. Then a p-type SiC film was formed to 200 Å by introducing SiF$_4$ at 30 sccm, CF$_4$ at 3 sccm and BF$_3$ diluted to 300 ppm with Ar at 10 sccm through the gas introducing pipe 409 and introducing H$_2$ at 100 sccm and Ar at 250 sccm through the gas introducing pipe 410, respectively, and throwing microwave powers of 100 W into the excitation section 407 and of 400 W into the excitation section 408. With other conditions being the same as in Example 5-1, a photosensor having a photoconductive member 204 with the non-doped SiC film and the p-type SiC film laminated alternately each in 10 layers was prepared.

Separately, 2 samples each having only the non-doped SiC film and only the p-type SiC film were prepared, and one of the respective samples was subjected to measurement of quantitative analysis of hydrogen by SIMS, and the other one was subjected to examination of presence of crystallinity by electron beam diffraction (RHEED).

When the same measurement as in Example 5-1 was conducted for the photosensor obtained, the S/N ratio was found to be a good value of $1 \times 10^{2.9}$ with Comparative Example as a standard. This value was not changed even after photoirradiation was continued for 24 hours.

Hydrogen contents in the non-doped SiC film and the p-type SiC film and presence of crystallinity were as shown in Table 5-5.

In Table 5-5, the hydrogen content in each film was less than 10 atomic %.

As described above, according to this embodiment, in a photosensor having a photoconductive member, said photoconductive member has a structure with laminated product comprising at least two functional thin films superposed on one another, said functional thin films having respectively different electroconductive types and/or electroconductivities, and by making the hydrogen content of said functional thin film 10 atomic % or less, the film quality becomes dense and running performance of small number of carriers is improved. As a result, diffusion length of carriers can be elongated, whereby electrical and optical characteristics can be greatly improved to provide a photosensor with S/N ratio no found in the prior art.

Also, by varying the band gap of the above photoconductive member continuously with respect to the laminated direction, the incident light can be utilized over a broad spectral range, and therefore electrical and optical characteristics of the film could be greatly improved, and further it has become possible to provide a photosensor with high S/N ratio.

Next, another embodiment of the present invention is to be described. The structure of this embodiment is substantially the same as that shown in FIG. 7. However, it is different in the following points. That is, the photoconductive members 104 and 105 each has a structure consisting of functional thin films having at least two kinds of different electroconduction types and/or electroconductivities and hydrogen content of 10 atomic in the film alternately laminated, such as p/n/p/n/ . . . , p/i/p/i/ . . . , n/i/n/i/ . . . , n/i/p/n/i/p/ . . . , n+/n/n+/n/ . . . , etc.

In the present invention, the first photoconductive member 104 and the second photoconductive member 105 have different band gaps in order to effect light absorption with good efficiency by varying sensitivity to light.

The thickness of each layer of said functional thin films may be conveniently determined so that a desired photosensor may be obtained, but it may be preferably 10 Å to 10 μm, more preferably 10 Å to 1 μm, most preferably 50 Å to 1000 Å.

The total number of the layers of the functional thin films as mentioned above may be determined so that a desired photosensor may be obtained, and the number of layers of the thin films of the first and the second photoconductive members may be either equal or different. The total layer number of each photoconductive member should preferably be made 1 to 5000 layers, more preferably 3 to 500 layers, most preferably 5 to 50 layers.

The above first and second photoconductive member may be constituted of a non-monocrystalline semiconductor having photoconductive function, and Si may be mentioned as a suitable matrix therefor. For obtaining a desired photosensor, at least one selected from among Ge, O, Ni, Sn, C, etc. is incorporated in the first photoconductive member, and also another kind of the above element group in the second photoconductive member, to make the first and the second band gaps different from each other.

Further, in the above functional thin film, hydrogen atoms (H) and/or halogen atoms (X) are contained. As said halogen atoms (X), F, Cl, Br, I may be included, particularly preferably F, Cl, and its content may be preferably made 0.0001 to 10 atomic %, more preferably 0.001 to 5 atomic %, most preferably 0.01 to 2 atomic %.

Figure 8:
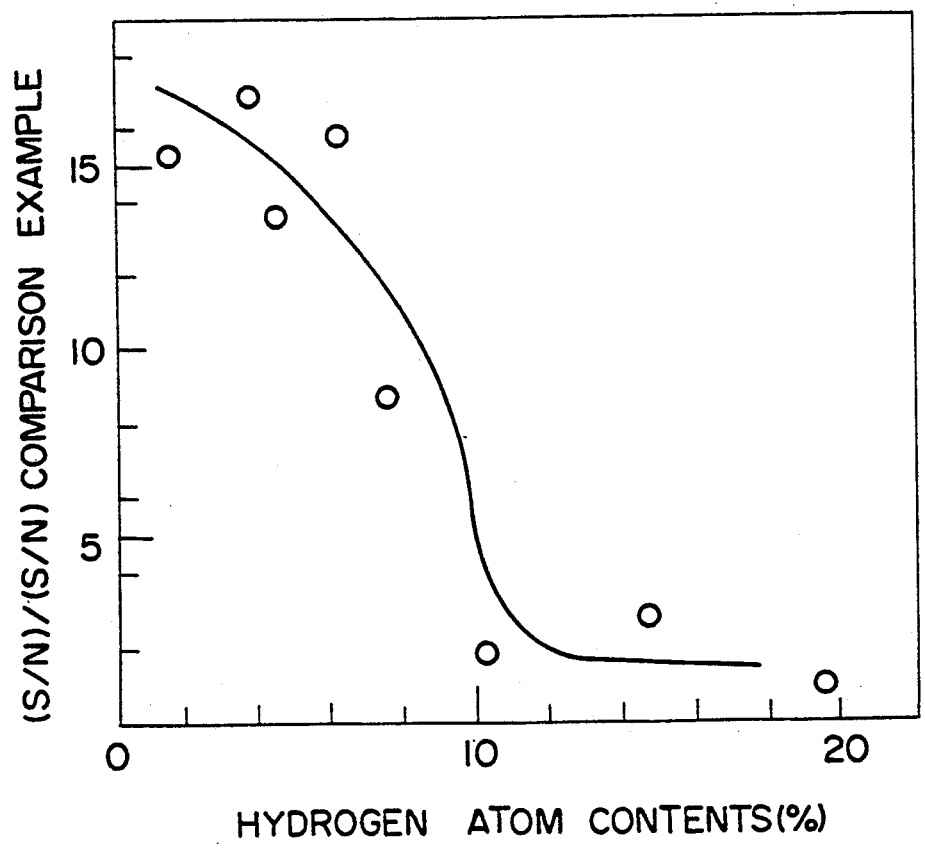
FIG. 8 is a graph showing the S/N ratio for the Comparative Example.

The amount of hydrogen atoms contained in the above functional thin film has been clarified to give enormous influence on the characteristics of the photosensor according to the experiments by the present inventors. More specifically, in this embodiment, the amount of hydrogen contained in the functional thin film is required to be made 10 atomic % or less. The results of the experiments conducted by the present inventors in the photosensor having the constitution shown in the first Example as described below are shown in FIG. 8. This experiment is conducted generally as follows. While bias voltage of 5 V is previously applied between the both electrodes 102, 103, dark current (Id) and light current (Ip: when irradiated with 100 lux) are measured. The ratio of the light current to the dark current (Ip/Id) is defined as S/N ratio, used as the evaluation index of the photosensor, and evaluation is performed in 11 kinds of samples having 0.5 to 20 atomic of hydrogen contents (constitution and other parameters are all equal). In FIG. 8, for mutual comparison of S/N ratio, the value of Comparative Example as described below is represented as 1. As is apparent from the results of this experiment, S/N ratio will be lowered if the content of hydrogen in the functional thin film exceeds 10 atomic %. The hydrogen content in the above functional thin film is preferably 0.5 to 10% and more preferably its lower limit being 1%.

For the above functional thin film to have desired electroconductive type and electroconductivity, it can be accomplished by incorporating a p-type impurity or n-type impurity into the functional thin film while controlling its amount. As the p-type impurity to be incorporated in the functional thin film, when the element constituting the functional thin film is constituted primarily of an element of the group IV of the periodic table, an element of the group III of the periodic table such as B, Al, Ga, In, Tl, etc. may be employed, and among them B and Ga are preferred. On the other hand, as the n-type impurity to be incorporated in the functional thin film, an element of the group V of the periodic table such N, P, As, Sb, Bi, etc. may be employed, and among them P, As and Sb are preferred. The amount of these to be incorporated in the functional thin film may be suitably determined in view of such factors as desired electrical characteristics, optical characteristics, etc., but the p-type impurity may be made $3 \times 10^{-2}$ atomic % or less, while the n-type impurity preferably $5 \times 10^{-3}$ atomic % or less.

As the method for forming the functional thin film satisfying the above conditions, there has been proposed the deposition film forming method (Japanese Laid-Open Patent Publication No. 41047/1985) in which a deposited film is formed on a substrate by introducing an active species formed in the decomposition space (B) which mutually react with the above precursor into the film forming space (A) for formation of a deposited film on the substrate.

EXAMPLE 6-11

Figure 7:
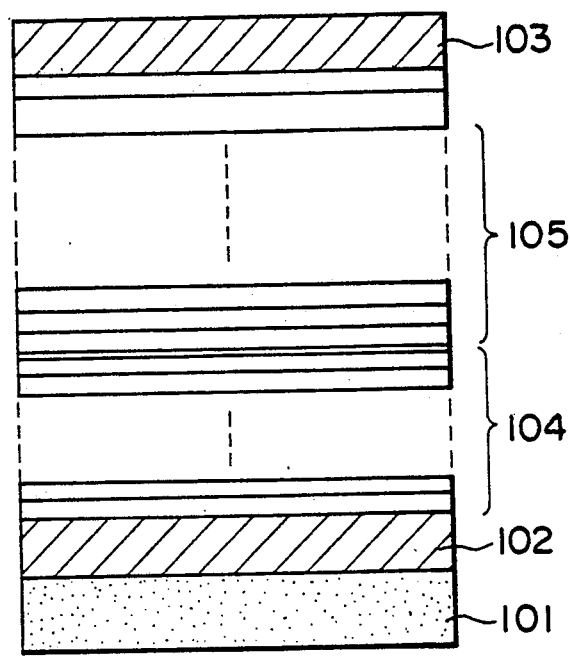
FIG. 7 is a sectional view showing schematically a typical example of the photosensor of another embodiment of the present invention.

A photosensor shown in FIG. 7 was prepared by means of a film forming device shown in FIG. 5. In FIG. 3, the photosensor has an electrode 102 formed by heating vapor deposition of Cr on a glass substrate 101, further has the first photoconductive member 104 comprising n-type a-Si:Ge:H:F film and p-type a-Si:Ge:H:F film laminated alternately formed thereon, and further the second photoconductive member comprising n-type a-Si:H:F film and p-type a-Si:H:F film laminated alternately formed thereon by means of the film forming device shown in FIG. 5, and has finally provided a transparent electrode 103 of ITO.

The film forming device shown in FIG. 5 has a substrate holder 403 having a heating heater built therein placed in a vacuum chamber 401 having an evacuation outlet 402, holds a glass substrate 404 having Cr with a film thickness of about 500 Å vapor deposited by resistance heating at room temperature thereon by another vacuum chamber (not shown) above said holder, thus ensuring a film forming space A. For introducing a precursor and an active species into the film forming space A, a gas introducing portion with a coaxial double structure comprising an inner pipe 405 and an outer pipe 406 is formed. The precursor and the active species introduced through the inner pipe and outer pipe are made desired precursor and active species by separate microwave exciting sections 407, 408 for excitation in the respective exciting decomposition spaces B and C. The respective original gases of the above precursor and active species are introduced through the gas introducing pipes 409 and 410. In FIG. 5, the distance between the tip end of the outer pipe 405 and the substrate 404 was made 8 cm. First, the vacuum chamber 401 was internally evacuated to a vacuum degree of about $10^{-5}$ Torr. Then, the substrate was heated by the heater to a substrate temperature of 250° C. and maintained at that temperature.

Next, through the introducing pipe 409, SiF$_4$, GeF$_4$ diluted to 1% with Ar and PH$_3$ diluted to 30 ppm with Ar were introduced respectively at 30 sccm, 6 sccm and 10 sccm, and also through the gas introducing pipe 410, H$_2$ was introduced at 30 sccm and Ar at 250 sccm. When the flow rate of the respective gases were stabilized, the pressure within the chamber was maintained at 0.3 Torr. Then, microwave with a frequency of 2.45 GHz was generated in the excitation section 407 at 100 W and into the excitation section 408 at 200 W.

By maintaining this state for 100 seconds, a n-type a-Si:Ge:H:F film with a film thickness of 200 Å was deposited on the Cr layer 102.

Next, with the microwave power being turned off, introduction of PH$_3$ was stopped, and BF$_3$ diluted to 300 ppm was introduced at 10 sccm through the gas introducing pipe 409. When the flow rate of the gas was stabilized, with the pressure in the vacuum chamber 401 being maintained at 0.3 Torr, again microwave was thrown into the excitation section 407 at 100 W and into the excitation section 408 at 200 W. By maintaining this state for 90 seconds, a p-type a-Si:Ge:H:F film with a film thickness of 200 Å was deposited on the n-type a-Si:Ge:H:F film. Next, with the microwave power being turned off, introduction of BF$_3$ was stopped, and PH$_3$ diluted to 300 ppm with Ar at 10 sccm was introduced at a pressure of 0.5 Torr or less through the gas introducing pipe 409. Subsequently, by repeating the method as described above, the n-type a-Si:Ge:H:F film and the p-type a-Si:Ge:H:F film were deposited alternately each to a thickness of 200 Å, to form a photoconductive member 104 with a film thickness of 0.4 μm having 10 layers each of the respective films laminated.

Next, the microwave power was turned off and all introductions were stopped, followed by evacuation to a vacuum degree of $10^{-5}$ Torr. Then, through the introducing pipe 409, SiF$_4$ at 30 sccm and PH$_3$ diluted to 300 ppm with Ar at 10 sccm were respectively introduced, and also through the gas introducing pipe 410, H$_2$ was introduced at 20 sccm and Ar at 250 sccm. When the flow rate of the respective gases were stabilized, the pressure within the chamber 401 was maintained at 0.3 Torr. Then, microwave with a frequency of 2.45 GHz was generated in the excitation section 407 at 100 W and into the excitation section 408 at 200 W. By maintaining this state for 100 seconds, an n-type a-Si:H:F film with a film thickness of 200 Å was deposited on the Cr layer 102.

Next, with the microwave power being turned off, introduction of PH$_3$ was stopped, and BF$_3$ diluted to 300 ppm with Ar was introduced at 10 sccm through the gas introducing pipe 409. When the flow rate of the gas was stabilized, with the pressure in the vacuum chamber 401 being maintained at 0.3 Torr, again microwave was generated in the excitation section 407 at 100 W and into the excitation section 408 at 200 W. By maintaining this state for 100 seconds, a p-type a-Si:H:F film with a film thickness of 200 Å was deposited on the n-type a-Si:H:F film. Next, with the microwave power being turned off, introduction of BF$_3$ was stopped, and PH$_3$ diluted to 300 ppm with Ar at 10 sccm was introduced through the gas introducing pipe 409 at a pressure of 0.5 Torr or less. Subsequently, by repeating the above method, the p-type a-Si:H:F film and the n-type a-Si:H:F film were deposited alternately each to a thickness of 200 Å, to form a photoconductive member 104 with a film thickness of 0.4 μm having 10 layers each of the respective films laminated. Then, the heater was turned off simultaneously with stopping of all the gases introduced into the vacuum chamber 401 and also the microwave power was turned off.

After cooling, the substrate 101 was taken out from the film forming device, and the substrate 101 was heated to 200° C. by means of a sputtering device (not shown), a transparent electroconductive film 203 of ITO was vapor deposited to 500 Å.

When the current flowed was measured by applying a voltage on the photosensor thus obtained, the S/N ratio had a good value of $1.5 \times 10$ with the value of Comparative Example as described below as being 1. This value was not changed even after a photoirradiation was continued for 24 hours.

Photoirradiation was effected from the ITO side.

Figure 1:
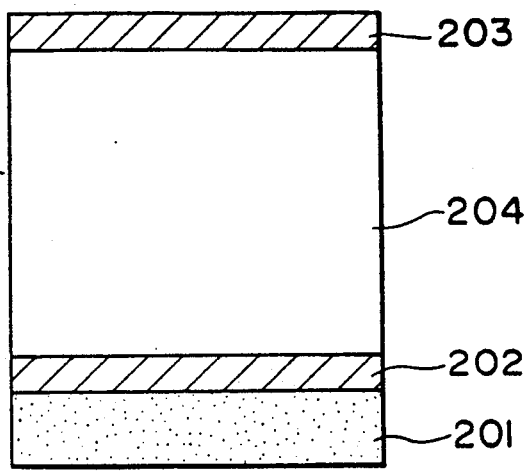
FIG. 1 is a sectional view showing schematically a typical example of the photosensor of the prior art.
Figure 2:
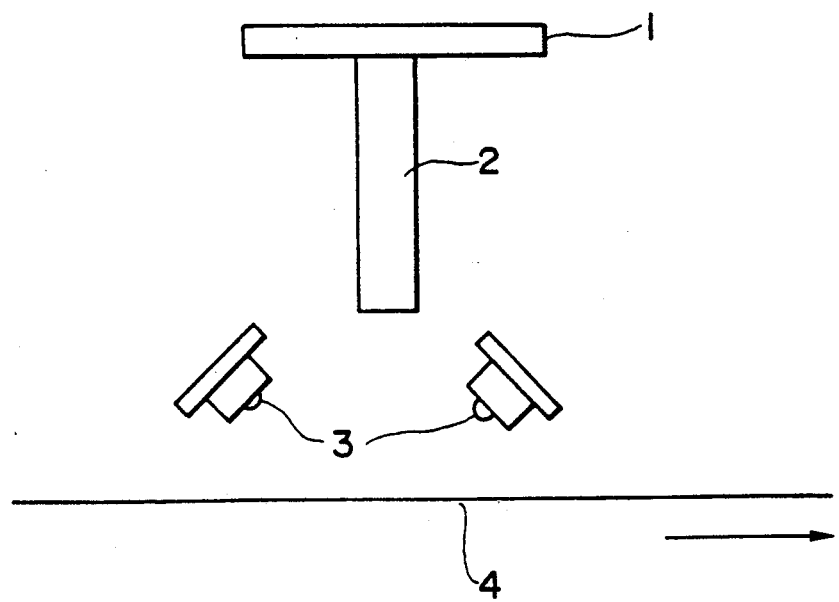
FIG. 2 is a schematic illustration of the image reading method of the prior art.

Separately, the p-type a-Si:H:F film, the n-type a-Si:H:F film, the p-type a-Si:Ge:H:F film and the n-type a-Si:Ge:H:F film were respectively prepared on a glass substrate according to the same conditions of gas flow rates, microwave powers, inner pressure and substrate temperature as during preparation of the photoconductive members 104, 105 of the photosensor shown in FIG. 1, and was done by quantitative analysis of hydrogen by SIMS. The analytical results are shown in Table 6-1.

As shown in Table 6-1, the hydrogen contents in each film was 10 atomic % or less.

Comparative example

Similar photosensor and samples were prepared by the same method and device as in Example 6-1 except for changing the flow rate of H$_2$ gas introduced through the gas introducing pipe 410 to 70 sccm, and measurement and analysis were performed similarly as in Example 1-1. As the result, the value of S/N ratio of the photosensor obtained was made 1 as the standard for measurement results of S/N ratio of photosensors in other Examples After photoirradiation was continued for 24 hours, the value was not good and was reduced to $1 \times 10^{-0.5}$. The hydrogen contents in the p-type a-Si:Ge:H:F film, the n-type a-Si:Ge:H:F film, the p-type a-Si:H:F film and the n-type a-Si:H:F film were as shown in Table 6-2. As shown in Table 2, the hydrogen content in each film exceeded 10 atomic %.

EXAMPLE 6-2

A photosensor shown in FIG. 7 was prepared by use of the same device and method as in Example 6-1. In this case, an intrinsic a-Si:Ge:H:F film and a p-type a-Si:Ge:H:F films were alternately laminated each in 10 layers on the Cr layer 102, followed finally by formation of an ITO transparent electrode 103.

During preparation of the intrinsic a-Si:Ge:H:F film, SiF and GeF diluted to 1% diluted with Ar to 1% were flowed each at 30 sccm through the gas introducing pipe 409. Otherwise, the preparations conditions and the method were made all the same to prepare the photoconductive member 104. Separately, a sample of the intrinsic a-Si:Ge:H:F film was prepared under the same conditions as in preparation of the photoconductive member 104 in FIG. 7, and subjected to quantitative analysis of hydrogen similarly as in Example 6-1. The results are shown in Table 6-3. As shown in Table 3, the hydrogen content in the film was found to be 10 atomic % or less. When the same measurement was conducted for the photosensor obtained similarly as in Example 6-1, the S/N ratio was found to be $1.5 \times 10$ with the Comparative Example as being 1, which value was not changed even after photoirradiation was continued for 24 hours. Photoirradiation at this time was effected from the ITO side.

EXAMPLE 6-3

A photosensor shown in FIG. 7 was prepared by use of the device shown in FIG. 5 similarly as described in Example 6-1. In this case, the photoconductive member 104 had a n-type a-Si:H:F film and an intrinsic a-Si:H:F film laminated alternately each in layers. The preparations conditions were the same as in Example 6-1 and Example 6-2. The constitutions other than the photoconductive member were made the same as in Example 6-1. When the photosensor obtained was subjected to the same measurement as in Example 6-1, the S/N ratio had a good value of $1.7 \times 10$, with the Comparative Example being as 1. This value was not changed even after photoirradiation for 24 hours. Photoirradiation was effected from the ITO side.

EXAMPLE 6-4

A photosensor shown in FIG. 7 was prepared according to the same method as in Example 6-1 by use of the device shown in FIG. 5. The photoconductive member 104 was prepared by laminating a p-type a-Si:H:F film and a n-type a-Si:H:F film laminated alternately each in 10 layers similarly as the photoconductive member 105 in Example 6-1. Next, by introducing SiF$_4$ and CF$_4$ respectively at 30 sccm and 3 sccm through the gas introducing pipe 409, maintaining the pressure at 0.3 Torr, generating microwave power of 100 W into the excitation section 407, while introducing H$_2$ and Ar respectively at 50 sccm and 250 sccm through the gas introducing pipe, and throwing microwave power of 200 W into the excitation section 408, an intrinsic a-Si:H:F film with a film thickness of 100 Å was formed. Then, with the microwave power being turned off, the inner pressure was maintained at 0.3 Torr by introducing BF$_3$ diluted to 300 ppm with Ar at 10 sccm through the gas introducing pipe 409, and again the microwave was generating at 100 W into the excitation section 407 and at 200 W into the excitation section 408. Thus, a p-type a-Si:H:F film was laminated to 100 Å on the intrinsic a-Si:H:F film, and according to the same method, intrinsic and p-type a-Si:H:F film were laminated alternately each in 10 layers on the photoconductive member 104, whereby a photosensor having a photoconductive layer 105 was formed. Separately, samples of the intrinsic and p-type a-Si:H:F films were prepared under the same conditions as in preparation of the photoconductive member 105. When the photosensor and samples thus obtained were subjected to measurement and analysis similarly as in Example 6-1, the S/N ratio had a good value of 1.3×10 with Comparative Example as being 1. This value was not changed even after photoirradiation for 24 hours. Photoirradiation was effected from the ITO side. The hydrogen contents in the intrinsic and p-type a-Si:H:F films were as shown in Table 6-4. As shown in Table 6-4, the hydrogen content in each film was found to be 10 atomic % or less.

EXAMPLE 6-5

By means of the device shown in FIG. 5, according to the same method as in Example 6-1, a photosensor with the photoconductive member 104 having a structure with intrinsic and p-type a-Si:H:F films being laminated alternately each in 10 layers and the photoconductive member 105 having a structure with intrinsic and p-type a-Si:H:F film laminated alternately each in 10 layers was prepared (FIG. 7).

In this case, the photoconductive member 104 was prepared according to the same preparation conditions and method as in Example 6-2, and the photoconductive member 105 according to the same preparation conditions and method as in Example 6-4.

When the photosensor was measured similarly as in Example 6-1, the S/N ratio had a good value of 1.5 ×10 with the Comparative Example as being 1. This value was not changed even after photoirradiation for 24 hours. Photoirradiation was effected from the ITO side.

EXAMPLE 6-6

By means of the device shown in FIG. 5, according to the same method as in Example 6-1, a photosensor with the photoconductive member 104 having a structure with intrinsic and p-type a-Si:H:F films being laminated alternately each in 10 layers and the photoconductive member 105 having a structure with intrinsic and p-type a-Si:H:F film laminated alternately each in 10 layers was prepared (FIG. 7).

In this case, the photoconductive member 104 was prepared according to the same preparation conditions and method as in Example 6-2. Then, SiF$_4$ was introduced at 30 sccm through the gas introducing pipe 409, and H$_2$ and Ar were introduced respectively at 20 sccm and 250 sccm through the gas introducing pipe 410. With the inner pressure maintained at 0.3 Torr, microwave was generating into the excitation sections 407 and 408 respectively at 100 W and 200 W to form an intrinsic a-Si:H:F film with a film thickness of 100 Å. Next, with the microwave turned off, a p-type a-Si:H:F film was formed to 100 Å according to the same method as in formation of the intrinsic a-Si:H:F film except for introducing BF$_3$ diluted to 300 ppm with Ar through the gas introducing pipe 409. Separately, the intrinsic a-Si:H:F film was prepared according to the same method, and the hydrogen content was measured. The results are shown in Table 6-5. As shown in Table 6-5, the hydrogen content in the film was found to be 10 atomic % or less.

When the photosensor was measured similarly as in Example 6-1, the S/N ratio had a good value of 1.8× 10 with Comparative Example as being 1. This value was not changed even after photoirradiation for 24 hours. Photoirradiation was effected from the ITO side.

EXAMPLE 6-7

A photosensor and samples were prepared by the same method and device as in Example 6-1 except for changing the preparation conditions of the photoconductive members 104 and 105 as shown in Table 6-6. The photosensor and the samples were subjected to the same measurement and analysis as in Example 6-1. As a result, the S/N ratio of the photosensor exhibited a good value as shown in Table 6-7 with the value of Comparative Example as being 1. This result was not changed even after photoirradiation for 24 hours. In the respective samples, the hydrogen contents in the p-type and n-type a-Si:H:F films were as shown in Table 6-8. The hydrogen contents in the films of Samples No. 6-11 to 6-15 were each 10 atomic % or less.

EXAMPLE 6-8

A photosensor shown in FIG. 3 was prepared by means of the device shown in FIG. 5 so that the distance between the tip end of the outer pipe and the substrate surface was 5 cm.

Through the gas introducing pipe 409, SiF$_4$, PH$_3$ diluted to 300 ppm with Ar and GeF$_4$ diluted to 1% with Ar were introduced respectively at 30 sccm, 10 sccm and 6 sccm, while through the gas introducing pipe 410, H$_2$ and Ar were introduced respectively at 100 sccm and 250 sccm, and microwave powers of 100 W and 400 W were generated respectively into the excitation section of 407 and 408 to form a n-type S:Ge:H:F film to 200 Å on the Cr layer 102. Then, PH$_3$ was stopped and BF$_3$ diluted to 300 ppm with Ar was introduced at 10 sccm. With other conditions being unchanged, a p-type Si:Ge:H:F film was formed to 200 Å. Subsequently, according to the same procedured, the n-type and p-type Si:Ge:H:F films were laminated each in 10 layers. Next, throwing of microwave and gas introduction were stopped, and through the gas introducing pipe, SiF$_4$ and PH$_3$ diluted to 300 ppm with Ar were introduced respectively at 30 sccm and 10 sccm, while through the gas introducing pipe 410, H$_2$ and Ar were introduced respectively at 100 sccm and 250 sccm, and the microwaves of 100 W and 400 W were respectively generated into the excitation sections 407 and 408.

After formation of a n-type Si:H:F film to 200 Å PH$_3$ was stopped and BF$_3$ diluted to 300 ppm with Ar was introduced at 10 sccm. With other conditions being unchanged, a p-type Si:H:F film was prepared to 200 Å. Subsequently, following the same procedures, the n-type and p-type Si:H:F films were laminated each in 10 layers. As described above, a photosensor having a photoconductive member 105 comprising the p-type and n-type Si:Ge:H:F films laminated was prepared.

Separately from the above photosensor, two samples each of only the photoconductive member deposited were prepared, and one of them was subjected to quantitative analysis of hydrogen by SIMS, and the other to analysis of presence of crystallinity by electron diffraction (RHEED). The results are shown in Table 6-9. As shown in Table 6-9, the hydrogen content in each film was found to be 10 atomic % or less.

When the photosensor was measured similarly as described in Example 6-1, the S/N ratio had a good value of $2 \times 10$ with Comparative Example being 1. This value was not also changed even after photoirradiation for 24 hours.

As described above, in this embodiment, in a photosensor consisting of the first photoconductive member and the second photoconductive member, said photoconductive member has a structure with a laminated product comprising two or more kinds of functional thin films being laminated, the functional thin films constituting said first photoconductive member having band gaps equal to each other and electroconductive types and/or electroconductivities different from each other, the functional thin films constituting said second photoconductive member having band gaps equal to each other and electroconduction types and/or electroconductivities different from each other, said first photoconductive member and said second photoconductive member having band gaps different from each other, with the hydrogen content in the functional thin film constituting said photoconductive member being made 10 atomic % or less,, whereby, the film quality becomes dense, and charge transfer of the small number of carriers is improved. As the result, diffusion length of carriers can be elongated and also light absorption can be increased, whereby a photosensor having more excellent characteristics than in the prior art can be provided.

Figures 10A, 10B:
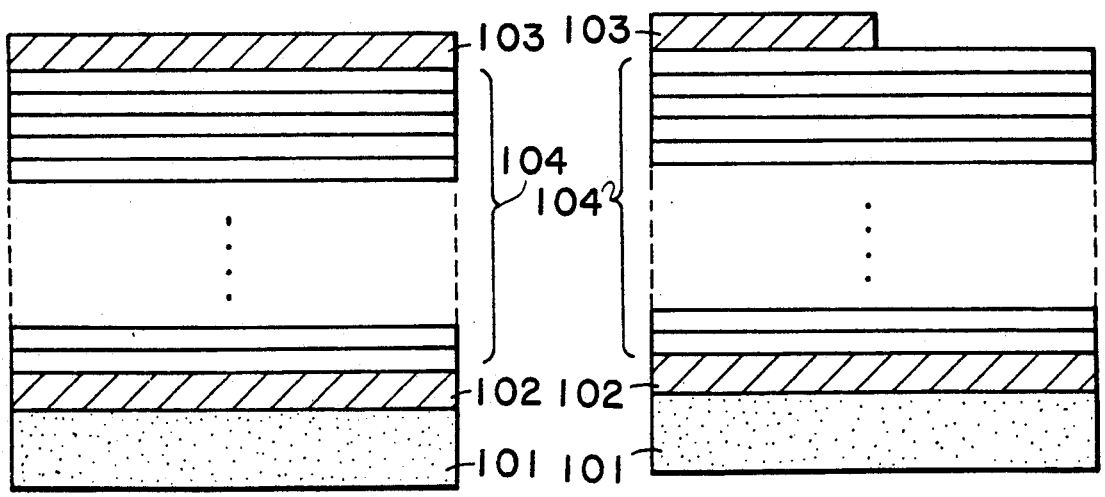
FIG. 10A and 10B are each sectional views showing schematically a typical example of the photosensor of this embodiment.

FIGS. 10A and 10B each are a partial sectional view showing schematically a typical example of the photosensor according to this Example.

In FIGS. 10A and 10B, 101 is an insulating substrate, 102 a lower electrode, 103 an upper electrode and 104 a photoconductive member.

The material for the insulating substrate 101 is not limited to quartz conventionally used, but for example, there can be used films or sheets of synthetic resins such as polyester, polycarbonate, cellulose, acetate, polypropylene, polyvinyl chloride, polyvinylidene chloride, polystyrene, polyamide, etc., glasses, ceramics, etc.

The thickness of the above substrate 101 in this embodiment may be conveniently determined so that a desired photosensor may be obtained, but it is generally made 1 μm or more from such points as production, handling of the substrate and its mechanical strength, etc.

As the material for the electrodes 102 and 103 applicable in this embodiment, there may be included metals such as Al, Ag, Au, Pt, Ni, Cr, Fe, Cu, Mo, Ir, Nb, Mg, Zn, Pb, etc., SUS (stainless steel), alloys typically NiCr, so-called transparent electroconductive films such as $In_2O_3$, $SnO_2$, ITO, $ZnO_2$, etc. and further semiconductor layers or semiconductor wafers having higher electroconductivity than the semiconductor layer 104.

If either one of the above electrodes 102, and 103 has sufficient thickness, that electrode may become support, whereby it is also possible to give a structure in which the substrate 101 is omitted.

For introducing light into the photoconductive member 104, a transparent or translucent material and thickness are selected for at least one side of the electrodes.

These electrodes or layers equivalent to the electrodes may be used as bulk, or may be formed by heating vapor deposition, sputtering, plasma CVD, the plating method, etc.

The photoconductive member 104 has at least two kinds of different electroconductive types and/or electroconductivities, and functional thin films with hydrogen content of 10 atomic % or less in the film are alternately laminated. For example, it has a structure such as P/n/P/n/ ..., P/i/P/i/, n/i/n/i/ ..., n/i/P/n/i/P .. ., n+/n/n+/n/ ..., etc. The thickness of each layer of said functional thin films may be conveniently determined so that a desired photosensor may be obtained, but it may be preferably 10 Å to 10 μm, more preferably 10 Å to 1 μm, most preferably 50 Å to 1000 Å.

The total number of the layers of the functional thin films as mentioned above may be determined so that a desired photosensor may be obtained, but it should desirably be made 2 to 10000 layers, more preferably 5 to 1000 layers, most preferably 10 to 100 layers.

The above functional thin film is constituted of a non-monocrystalline semiconductor having photoconductive function,, and Si may be mentioned as a suitable matrix therefor. For obtaining a desired photosensor, at least one selected from among Ge, O, Ni, Sn, C, etc. is incorporated in the thin film, and/or the band gap is suitably controlled.

Further, in the above functional thin film, hydrogen atoms (H) and/or halogen atoms (X) are contained. As said halogen atoms (X), F, Cl, Br, I may be included, particularly preferably F, Cl, and its content may be preferably made 0.0001 to 10 atomic %, more preferably The electrodes of the photosensor to be used in this embodiment may cover the whole surface of the above functional thin film (FIG. 10(a)) or only a part thereof (FIG. 10(b)). In this case, image irradiation is effected from the electrode side onto the electrode portion.

The amount of hydrogen atoms contained in the above functional thin film has been clarified to give enormous influence on the characteristics of the photosensor according to the experiments by the present inventors. More specifically, in this embodiment, the amount of hydrogen contained in the functional thin film is required to be made 10 atomic 5 or less. The results of the experiments conducted by the present inventors in the photosensor having the constitution shown in the first Example as described below are shown in FIG. 4. This experiment is conducted generally as follows. the both electrodes 102, 103, dark current (Id) and light current (Ip: when irradiated with 100 lux) are measured. The ratio of the light current to the dark current (Ip/Id) is defined as S/N ratio, used as the evaluation index of the photosensor, and evaluation is performed in 11 kinds of samples having 0.5 to 20 atomic % of hydrogen contents (constitution and other parameters are all equal). As is apparent from the results of this experiment, the hydrogen content to be contained in the above functional thin film should be preferably 0.5 to 10 atomic %.

For the above functional thin film to have desired electroconductive type and electroconductivity, it can be accomplished by incorporating a P type impurity or n type impurity into the functional thin film while controlling its amount. As the p-type impurity to be incorporated in the functional thin film, when the element constituting the functional thin film is constituted primarily of an element of group IV of the periodic table, an element of the group III of the periodic table such as B, Al, Ga, In, Tl, etc. may be employed, and among them B and Ga are preferred. On the other hand, as the n type impurity to be incorporated in the functional thin film, an element of group V of the periodic table such N, P, As, Sb, Bi, etc. may be employed, and among them P, As and Sb are preferred. The amount of these to be incorporated in the functional thin film may be suitably determined in view of such factors as desired electrical characteristics, optical characteristics, etc., but the p-type impurity may be made $3 \times 10^{-2}$ atomic % or less, while the n type impurity preferably $5 \times 10^{-3}$ atomic % or less.

Figure 11:
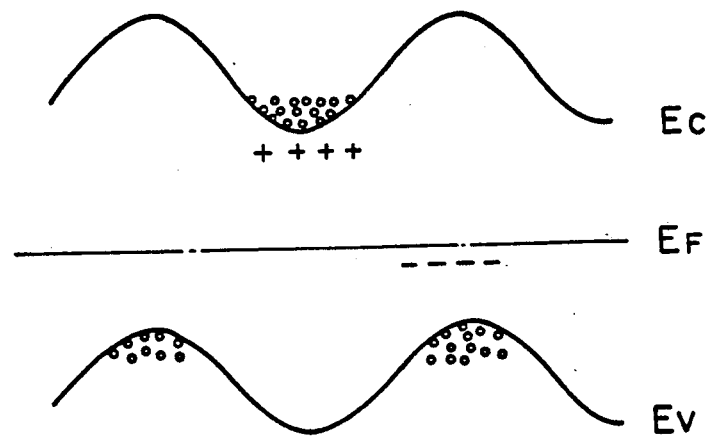
FIG. 11 is a schematic illustration of the energy band diagram of the photosensor of this embodiment.

As described above, by laminating multiple layers of the two kinds of films A and B with different electroconductive types and/or electroconductivities, the band diagram of the functional thin film during dark is varied periodically in potential of the conductor and valence electron band as shown in FIG. 11. FIG. 11 is a sectional view of the laminated film. Accordingly, since flow of charges is impeded at the potential barrier formed, electrons or positive holes are stored at the valley portion of potential.

When light is irradiated under this state, space charges forming the potential barrier are cancelled to lower the potential barrier. Accordingly, the charges accumulated in the valley portion of potential can be moved in the direction perpendicular to the barrier, namely in the laminated direction, horizontal direction in FIG. 11, whereby they contribute to conduction.

When one place in the barrier, namely the barrier at one place somewhere in the vertical direction in FIG. 11 is lowered, the charges accumulated within the potential barrier will become to flow in the laminated direction, namely in the horizontal direction in FIG. 11 through the place where the barrier is lowered. Since, a large amount of charges can be flowed by irradiation of such small number of photons, the number of charges which can be taken out outside per incident photon, will exceed 1 until becoming generally about $10^2$ to $10^5$.

By taking the repetition time for image irradiation longer than the dielectric relaxation time (generally about $10^{-6}$ sec.), reading can be done repeatedly.

Figure 9:
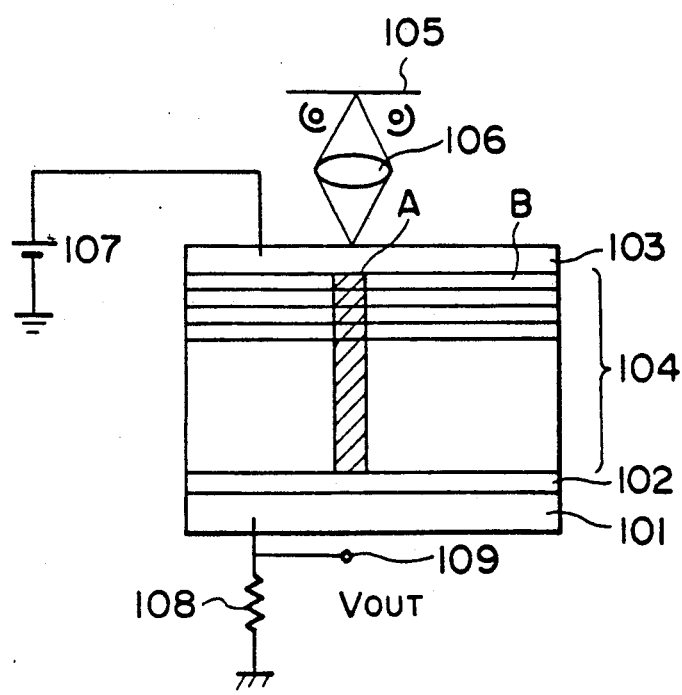
FIG. 9 is a schematic illustration of the image forming method of this embodiment.

FIG. 9 illustrates a conceptional view showing the method of image reading of this embodiment. 101–104 represent the same photosensors as 401–404 in FIG. 10. Photoirradiation which irradiates the image on the manuscript 105 through the lens 106 onto the transparent electrode 103 is effected only at the obliquely hatched portion in the figure, whereby the barrier only at the A portion in the laminated layer 104 is lowered, whereby charges are flowed through the A portion. At that time, the charges accumulated at the potential barrier between the laminated layers not irradiated with light will be transformed through the A portion. For this reason, the number of the charges flowing outside becomes extremely great as compared with the number of photons irradiated.

107 is a power source for applying voltage for permitting the charges to flow in the vertical direction, and the direction and size of voltage may be suitably selected depending on the polarity of a large number of carriers in the multiple film and the polarity and magnitude of the desired signals to be taken out to the outside.

108 is a load resistance for withdrawing the signals to outside as the voltage, and the resistance value is determined depending on the magnitude of current flowed from the photosensor, necessary magnitude as the external signal and the resistance value of the photosensor, etc. 109 is a lead wire for withdrawing external signals.

Referring now to Examples, the image reading method of this embodiment is specifically described, but the present invention is not limited to these Examples.

EXAMPLE 7-1

A photosensor shown in FIG. 10 was prepared by means of a film forming device shown in FIG. 5.

In FIG. 10, the photosensor has an electrode 102 formed by heating vapor deposition of Cr on a glass substrate 101, further has n-type a-Si:H:F film and p-type a-Si:H:F film laminated alternately by means of the film forming device shown in FIG. 5 thereon to form a photoconductive member 104, and has finally provided a transparent electrode 103 of ITO.

First, the vacuum chamber 401 was internally evacuated to a vacuum degree of about $10^{-5}$ Torr. Then, the substrate was heated by the heater to a substrate temperature of 250° C. and maintained at that temperature.

Under such conditions, through the introducing pipe 409, SiF$_4$ at 30 sccm and PH$_3$ diluted to 300 ppm with Ar at 10 sccm were respectively introduced, and also through the gas introducing pipe 410, H$_2$ was introduced at 20 sccm and Ar at 250 sccm. When the flow rate of the respective gases were stabilized, the pressure within the chamber was maintained at 0.3 Torr. Then, microwave with a frequency of 2.45 GHz was thrown into the excitation section 407 at 100 W and into the excitation section 408 at 200 W.

By maintaining this state for 100 seconds, a n-type a-Si:H:F film with a film thickness of 200 Å was deposited on the Cr layer 102.

Next, with the microwave power being turned off, introduction of PH$_3$ was stopped, and BF$_3$ diluted to 300 ppm with Ar was introduced at 10 sccm through the gas introducing pipe 409. When the flow rate of the gas was stabilized, with the pressure in the vacuum chamber 401 being maintained at 0.3 Torr, again microwave was thrown into the excitation section 407 at 100 W and into the excitation section 408 at 200 W.

By maintaining this state for 100 seconds, a p-type a-Si:H:F film with a film thickness of 200 Å was deposited on the n-type a-Si:H:F film.

Next, with the microwave power being turned off, introduction of BF$_3$ was stopped, and PH$_3$ diluted to 300 ppm with Ar at 10 sccm was introduced through the gas introducing pipe 409 at a pressure of 0.5 Torr or less. When the gas flow rate was stabilized, with the pressure in the vacuum chamber 401 being maintained at 0.3 Torr, again microwave was thrown into the excitation section 407 at 100 W and into the excitation section 408 at 200 W.

Under this state, an n-type a-Si:H:F film with a film thickness of 200 Å was deposited on the p-type a-Si:H:F film.

Subsequently, following the same procedure, the p-type a-Si:H:F film and the n-type a-Si:H:F film were deposited alternately each to a thickness of 200 Å, to form a photoconductive member 104 with a film thickness of 0.8 μm having 20 layers each of the respective films laminated.

Then, simultaneously with stopping of all introductions of gases introduced into the vacuum chamber 401, the heating heater was also stopped, and the microwave power was also turned off. After the substrate 101 was returned to room temperature, it was taken out from the film forming device, mounted on a sputtering device and the substrate was heated to about 200° C., followed by vapor deposition of a transparent electroconductive film 103 of ITO over substantially the whole surface of the multilayer film surface except for the end portion.

In the photosensor obtained according to the above procedure, with application of a voltage between the both electrodes, white light of 1 mW/cm$^2$ per unit area was irradiated. The current flowed when the white light was irradiated over the whole surface (10×10 mm$^2$) and that when irradiated only at a part thereof (1×1 mm$^2$) were found to be 5:1, although there is a difference of about 100:1 in the number of photons irradiated. Thus, it has been found that the gain when irradiated only at a part, namely the number of charges flowed per one photon irradiated has become about 20-fold as compared with the case when irradiated over the whole surface.

Separately from the above photosensor, samples of the n-type a-Si:H:F film and the p-type a-Si:H:F film were prepared by the same preparation device and conditions as in preparation of the above photosensor, and subjected to quantitative analysis of hydrogen by SIMS.

Table 7-1 shows the analytical results of the hydrogen contents in the above respective films. As shown in Table 7-1, the hydrogen content in each film was found to be 10 atomic % or less.

EXAMPLE 7-2

According to the same procedure as in Example 7-1, two sheets of Cr/multi-layer film/ITO film were formed on a substrate of Na-free glass with a width of 20 mm and a length of 300 mm (tradename Corning 7079), a pattern of 100 μm×10 mm was formed one-dimensionally in the length direction at intervals of 20 μm on one ITO sheet. On the other remaining ITO sheet, a pattern of 100 μm×100 μm was formed one-dimensionally in the length direction at intervals of 20 μm. When each photosensor array prepared as described above was irradiated with a converged light of 100 μm by means of a Selfock lens array in a reading device with the constitution shown in FIG. 9, the current flowed per one pattern of the photosensor cut with the ITO pattern of 100 μm×10 mm was substantially equal to the pattern flowed per one pattern of the photosensor cut with the ITO pattern of 100 μm×100 μm, with the gain being a high numerical value of about 10$^4$.

Comparative Example

In the photosensor having the ITO pattern of 100 μm×100 μm formed in Example 7-2, a multi-layer film at the portion where there is no ITO pattern was removed by etching.

When the above constitution was irradiated with a light converged to 100 μm by means of the reading device with the constitution shown in FIG. 9, the current flowed per one pattern became small as about 1/50.

EXAMPLE 7-3

A photosensor shown in FIG. 10A and 10B with the multi-layer film consisting of non-doped layer and p-type layer was prepared by the same device and method as in Example 7-1. In this case, on the Cr layer 102, a non-doped a-Si:H:F film and a p-type a-Si:H:F film were alternately laminated, followed finally by formation of an ITO transparent electrode 103 to 500 Å. During preparation of the non-doped a-Si:H:F film, only SiF$_4$ was flowed at 30 sccm through the gas introducing pipe 410, and otherwise all the preparation conditions and the method as in Example 7-1 were employed, whereby a photosensor having a photoconductive member 104 with the non-doped a-Si:H:F film and the p-type a-Si:H:F film laminated alternately each in 20 layers was prepared.

Separately, a sample of the non-doped a-Si:H:F film was prepared under the same conditions as in preparation of the photoconductive member 104 in FIG. 10, and subjected to the same analysis.

When white light of 1 mW/cm$^2$ was irradiated only on a part (1×1 mm$^2$) of the photosensor obtained, the gain was found to be approximately 10$^4$.

When the other portions than that applied with ITO were removed by etching, the gain was dropped to about 10$^2$.

The analytical results of the sample obtained are shown in Table 7-3. As shown in Table 7-3, the hydrogen content in the film was 10 atomic % or less.

EXAMPLE 7-4

A photosensor shown in FIG. 10A and 10B was prepared by means of the device shown in FIG. 4 similarly as in Example 7-1. In this case, the photoconductive member 104 was formed by laminating alternately a n-type a-Si:H:F film and a non-doped a-Si:H:F film. The preparation condition of the n-type a-Si:H:F film and the preparation condition of the non-doped a-Si:H:F film were made the same as in Example 7-1 and 7-3, respectively, with other conditions being the same as in Example 7-1, and a photoconductive member 104 with the n-type a-Si:H:F film and the non-doped a-Si:H:F film laminated alternately each in 20 layers was formed, followed by film formation of an ITO transparent electrode with an area of 2×2 mm$^2$ to prepare a photosensor.

When the same measurement as in Example 7-1 was conducted for the photosensor obtained, the gain was approximately 10$^{4.5}$, and this value was not changed even after photoirradiation was continued for 24 hours. Photoirradiation was effected from the ITO side. When the other portions than that attached with ITO were removed by etching, the gain was dropped to about 10$^2$.

EXAMPLE 7-5

A photosensor having a structure with a photoconductive member comprising a p-type a-Si:Ge:H:F film and a n-type a-Si:Ge:H:F film alternately laminated was prepared by means of the device shown in FIG. 4 in the same manner as in Example 7-1. In this case, by introducing SiF$_4$ at 30 sccm, PH$_3$ diluted to 300 ppm with Ar at 10 sccm and 0.2 vol % of GeF$_4$ based on SiF$_4$ through the gas introducing pipe 409 and generating microwave power of 100 W into the excitation section 407, while introducing H$_2$ at 30 sccm and Ar at 250 sccm through the gas introducing pipe 410 and generating microwave power of 200 W into the excitation section 408, a n-type a-Si:Ge:H:F film with a film thickness of 400 Å was formed on the Cr layer 102. Then, by introducing SiF$_4$ at 30 sccm, BF$_3$ diluted to 300 ppm with Ar at 10 sccm and 0.2 vol % of GeH$_4$ based on SiF$_4$ through the gas introducing pipe 409 and generating microwave power of 100 W into the excitation section 407, while introducing H$_2$ at 30 sccm and Ar at 250 sccm through the gas introducing pipe 410 and generating microwave power of 200 W into the excitation section 408, a p-type a-Si:Ge:H:F film with a film thickness of 400 Å was formed. Thus, a multi-layer film having photoconductive member 104 with the n-type a-Si:Ge:H:F and the p-type a-Si:Ge:H:F film laminated alternately each in 10 layers was formed. On the multi-layer film formed according to the above procedure, an ITO transparent electroconductive film of an area of 2×2 mm$^2$ was formed to 500 Å to prepare a photosensor. Separately, samples of the n-type a-Si:Ge:H:F and the p-type a-Si:Ge:H:F film were prepared under the same conditions for preparation of the photoconductive member 104.

When the photosensor and samples thus obtained were subjected to the same measurement and analysis as in Example 7-1, the gain was found to be about 10$^4$, which value was not changed even when light was irradiated continuously for 24 hours. Photoirradiation was effected from the ITO side. When the multi-layer film at portions other than that where ITO was formed was removed, the gain was lowered to 1/100.

The hydrogen contents in the n-type a-Si:Ge:H:F and the p-type a-Si:Ge:H:F film were as shown in Table 7-4. As shown in Table 7-4, the hydrogen content in each film was 10 atomic % or less.

EXAMPLE 7-6

A photosensor shown in FIG. 10 with a photoconductive member having a structure of the p-type a-Si:C:H:F film and the non-doped a-Si:C:H:F film alternately laminated was prepared by means of the device shown in FIG. 5. In this case, by introducing SiF$_4$ at 30 sccm, BF$_3$ diluted to 300 ppm with Ar at 10 sccm and CF$_4$ at 3 sccm through the gas introducing pipe 410, and generating microwave power of 100 W into the excitation section 408, and also introducing H$_2$ at 50 sccm and Ar at 250 sccm through the gas introducing pipe 409 and generating microwave power of 200 W into the excitation section 407, a p-type a-Si:C:H:F film with a film thickness of 100 Å was formed on the Cr layer 102. Then, by introducing SiF$_4$ at 30 sccm CF$_4$ at 3 sccm through the gas introducing pipe 410, H$_2$ at 50 sccm and Ar at 250 sccm through the gas introducing pipe 409 and throwing microwave powers of 100 W and 200 W into the excitation sections 408, 407, respectively, a non-doped a-Si:C:H:F film with a film thickness of 150 Å was formed. Otherwise, according to the same method as in Example 7-1, a multi-layer film 104 with the p-type a-Si:C:H:F film and the non-doped a-Si:C:H:F film laminated alternately each in 25 layers was prepared. On the above multi-layer film formed according to the above procedure, an ITO transparent electroconductive film of an area of 2×2 mm$^2$ was formed to 500 °A to prepare a photosensor.

Separately from the above sensor, samples of the p-type a-Si:C:H:F film and the non-doped a-Si:C:H:F film were prepared under the same conditions for preparation of the photoconductive member 104 in FIG. 10.

When the photosensor and samples thus obtained were subjected to the same measurement and analysis as in Example 7-1, the gain was found to be about $1 \times 10^{4.2}$, which value was not changed even when light was irradiated continuously for 24 hours. Photoirradiation was effected from the ITO side.

When the multi-layer film at portions other than that where ITO was formed was removed, the gain was lowered to 1/200. The hydrogen contents in the non-doped a-Si:C:H:F and the p-type a-Si:C:H:F film were as shown in Table 7-5. As shown in Table 7-5, the hydrogen content in each film was 10 atomic % or less.

EXAMPLE 7-7

By use of the same method and device as described in Example 7-1, except for varying the preparation conditions of the photoconductive member as shown in Table 7-6, photosensors and samples were prepared. The photosensors and samples obtained were subjected to the same measurement and analysis similarly as in Example 7-1. The gains of the photosensors exhibited good results as shown in Table 7-7. These photosensors were not changed in all the current ratios even when light was irradiated continuously for 24 hours.

The hydrogen contents in the p-type a-Si:H:F and the n-type a-Si:H:F film in each sample were as shown in Table 7-8. As shown in Table 7-8, the hydrogen content in each film was found to be 10 atomic % or less.

EXAMPLE 7-8

A photosensor shown in FIG. 10 was prepared by means of the device shown in FIG. 5 with a distance between the tip end of the outer pipe and the substrate surface of 5 cm. In this case, a non-doped Si thin film was formed to 200 Å on the Cr layer 202 by introducing SiF$_4$ at 30 sccm through the gas introducing pipe 409, and H$_2$ at 100 sccm and Ar at 250 sccm through the gas introducing pipe 410, respectively, and generating microwave power of 100 W into the excitation section 407 and of 400 W into the excitation section 408. Then, a p-type Si thin film was formed to 200 Å by introducing SiF$_4$ at 30 sccm and BF$_3$ diluted to 300 ppm with Ar at 10 sccm through the gas introducing pipe 409 and introducing H$_2$ at 100 sccm and Ar at 250 sccm through the gas introducing pipe 410, respectively, and generating microwave powers of 100 W into the excitation section 407 and of 400 W into the excitation section 408. With other conditions being the same as in Example 7-1, a multi-layer photoconductive member 204 with the non-doped Si thin film and the p-type Si thin film laminated alternately each in 10 layers was prepared. On the above multi-layer thin film, an ITO with an area of 2×2 mm$^2$ was formed to provide a photosensor.

Separately from the above sensor, 2 samples each having only the non-doped Si thin film and the p-type Si thin film were prepared, and one of the respective samples was subjected to quantitative analysis of hydrogen by SIMS, and the other one was subjected to examination of presence of crystallinity by electron beam diffraction (RHEED).

When the same measurement as in Example 7-1 was conducted for the photosensor obtained, the gain was about 10$^4$, which value was not changed even when photoirradiation was continued for 24 hours.

The hydrogen contents and crystallinity of the film in the non-doped Si thin film and the p-type Si thin film gave the results as shown in Table 7-9. As shown in Table 7-9, the hydrogen content in each film was found to be 10 atomic % or less.

When other portions than that where ITO was filmed in the above photosensor were removed, the gain was lowered to about 1/300.

As described above, according to this embodiment, by use of a photosensor having two layers with different electroconductivities and/or electroconductive types and having either one of said electrodes which is transmissive relative to light, and irradiating light of image signals on the region smaller than the area of the multi-layer film constituting said photosensor, it is rendered possible to obtain an image reading method capable of obtaining high gain not found in the prior art.

Figure 12:
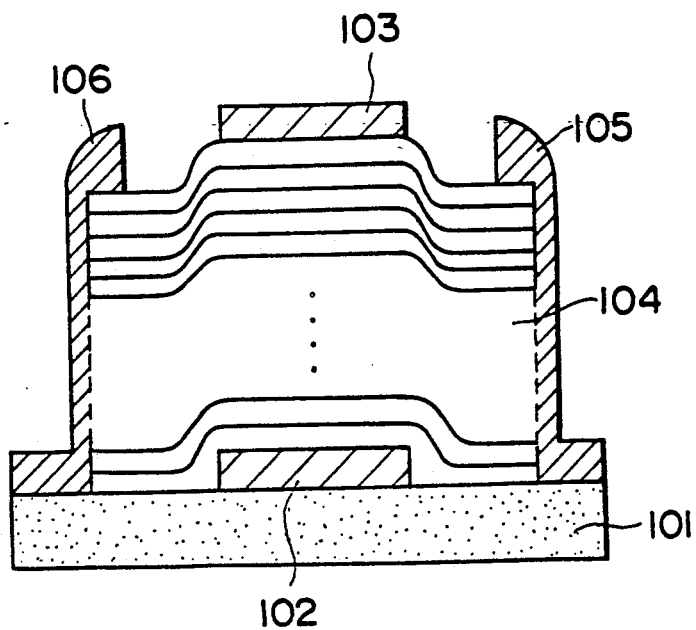
FIG. 12 illustrates schematically the photosensor according to another embodiment of the present invention.
Figure 13:
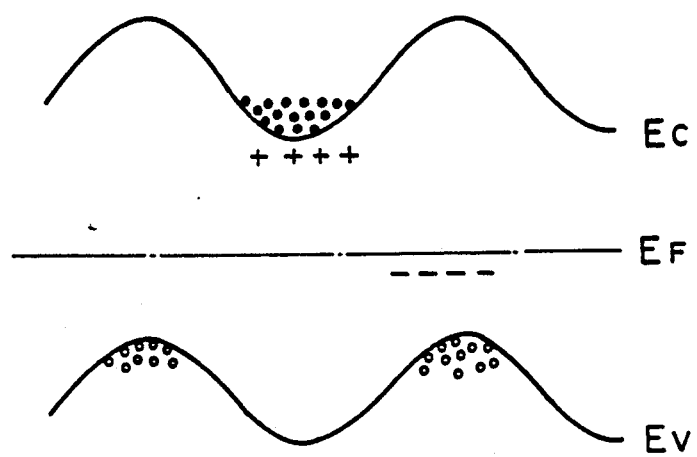
FIG. 13 is a schematic illustration of the energy band diagram of the photosensor of this embodiment.

FIG. 12 is a partial sectional view showing schematically a typical example of the photosensor according to the present invention. On the insulating substrate 101 is formed an electrode 102, and a photoconductive layer 104 comprising a multi-layer film with two layers with different electroconductivities and/or electroconductive types laminated alternately is formed thereon. On the photoconductive layer is formed an electrode 103. Either one of the electrodes 102 and 103 is a transparent electrode. When the electrode 102 is a transparent electrode, a transparent material is used for insulating substrate 101. On both sides of the photoconductive layer 104, a pair of electrodes 105 and 106 are formed.

The material for the insulating substrate 101 is not limited to quartz conventionally used, but for example, there can be used films or sheets of synthetic resins such as polyester, polycarbonate, cellulose, acetate, polypropylene, polyvinyl chloride, polyvinylidene chloride, polystyrene, polyamide, etc., glasses, ceramics, etc. The thickness of the above substrate 101 in this embodiment may be conveniently determined so that a desired photosensor may be obtained, but it is generally made 1 μm or more from such points as production, handling of the substrate and its mechanical strength, etc.

As the material for the electrodes 102, 103, 105 and 106 applicable in this embodiment, there may be included metals such as Al, Ag, Au, Pt, Ni, Cr, Fe, Cu, Mo, Ir, Nb, Mg, Zn, Pb, etc., SUS (stainless steel), alloys typically NiCr, so-called transparent electroconductive films such as $In_2O_3$, $SnO_2$, ITO, $ZnO_2$, etc. and further semiconductor layers or semiconductor wafers having higher electroconductivity than the semiconductor layer 104. If either one of the above electrodes 102 and 103 has sufficient thickness, that electrode may become support, whereby it is also possible to give a structure in which the substrate 101 is omitted. For introducing light into the photoconductive member 104, a transparent or translucent material and thickness are selected for at least one side of the electrodes. These electrodes or layers equivalent to the electrodes may be used as bulk, or may be formed by heating vapor deposition, sputtering, plasma CVD, the plating method, etc.

The photoconductive member 104 has at least two kinds of different electroconductive types and/or electroconductivities, and functional thin films with hydrogen content of 10 atomic % or less in the film are alternately laminated. For example, it has a structure such as p/n/p/n..., p/i/p/i/..., n/i/n/i/..., n/i/p/n/i/p/..., n+/n/n+/n/..., etc. The thickness of each layer of said functional thin films may be conveniently determined so that a desired photosensor may be obtained, but it may be preferably 10 Å to 10 μm, more preferably 10 Å to 1 μm, most preferably 50 Å to 1000 Å.

The total number of the layers of the functional thin films as mentioned above may be determined so that a desired photosensor may be obtained, but it should desirably be made 2 to 10000 layers, more preferably 5 to 1000 layers, most preferably 10 to 100 layers.

The above functional thin film is constituted of a non-monocrystalline semiconductor having photoconductive function, and Si may be mentioned as a suitable maxtix therefor. For obtaining a desired photosensor, at least one selected from among Ge, O, Ni, Sn, C, etc. is incorporated in the thin film, and/or the band gap is suitably controlled.

Further, in the above functional thin film, hydrogen atoms (H) and/or halogen atoms (X) are contained. As said halogen atoms (X), F, Cl, Br, I may be included, particularly preferably F, Cl, and its content may be preferably made 0.0001 to 10 atomic %, more preferably 0.001 to 5 atomic %, most preferably 0.01 to 2 atomic %.

The amount of hydrogen atoms contained in the above functional thin film has been clarified to give enormous influence on the characteristics of the photosensor according to the experiments by the present inventors.

More specifically, in the present invention, the amount of hydrogen contained in the functional thin film is required to be made 10 atomic % or less.

The results of the experiments conducted by the present inventors in the photosensor having the constitution shown in Example 8-1 as described below are the same as shown in FIG. 4. This experiment is conducted generally as follows. While bias voltage of 5 V is previously applied between the both electrodes 102, 103, dark current (Id) and light current (Ip: when irradiated with 100 lux) are measured. The ratio of the light current to the dark current (Ip/Id) is defined as S/N ratio, used as the evaluation index of the photosensor, and evaluation is performed in 11 kinds of samples having 0.5 to 20 atomic % of hydrogen contents (constitution and other parameters are all equal). In FIG. 4, for mutual comparison of S/N ratio, the value of Comparative Example as described below is represented as 1.

As is apparent from the results of this experiment, the hydrogen content incorporated in the above functional thin film should be preferably 0.5 to 10 %, more preferably its lower limit being 1%.

In this embodiment, the fluorine content in the functional thin film should be preferably made 1 atomic % or less.

For the above functional thin film to have the desired electroconductive type and electroconductivity, it can be accomplished by incorporating a p-type impurity or n-type impurity into the functional thin film while controlling its amount. As the p-type impurity to be incorporated in the functional thin film, when the element constituting the functional thin films is constituted primarily of an element of the group IV of the periodic table, an element of the group III of the periodic table (hereinafter merely written as "the group III atom") such as B, Al, Ga, In, Tl, etc. may be employed, and among them B and Ga are preferred. On the other hand, as the n-type impurity to be incorporated in the functional thin film, an element of the group V of the periodic table (hereinafter merely written as "the group V element") such N, P, As, Sb, Bi, etc. may be employed, and among them P, As and Sb are preferred. The amount of these to be incorporated in the functional thin film may be suitably determined in view of such factors as desired electrical characteristics, optical characteristics, etc., but the p-type impurity may be made $3 \times 10^{-2}$ atomic % or less, while the n-type impurity preferably $5 \times 10^{-3}$ atomic % or less. As the method for forming the functional thin film satisfying the above conditions, there has been proposed the deposition film forming method (Japanese Laid-Open Patent Publication No. 41047/1985) in which a deposited film is formed on a substrate by introducing a precursor for formation of a deposited film formed in the decomposition space (B) and an active species formed in the decomposition space (C) and reactive with said precursor into a film formation space (A) for formation of a deposition film on the substrate.

By laminating two kinds of films with different electroconductive types and/or electroconductivities in multiple layers, the band diagram of the functional film during dark is varied periodically in potentials of the conduction band and the valence electron band by formation of space charges as shown in FIG. 4. This figure is a sectional view of the laminated film. The flow of charges is impeded by the potential barrier formed in the lateral direction in FIG. 4. Accordingly, electrons or positive holes are stored in the portion of the valley of potential. Thus, when a voltage is applied in the vertical direction in FIG. 4, the current will readily flow in the vertical direction. The electrodes 105 and 106 are confronted to each other in the vertical direction in the figure. When the voltage is applied between the electrodes 105 and 106, the charges will flow through the valley of the potential. For making the flow of the current smooth, the electrodes 105 and 106 are required to be free from barrier in the direction in which the current is flowed. For this purpose, the electrode of the electrodes 105 and 106 on the minus side should be preferably constituted of an amorphous Si layer doped with an element which becomes an element of highly concentrated doner, namely an element of the group V of the periodic table or a crystalline Si layer formed beneath the electrode, or a metal having smaller work function than that of Si such as Mg, In, etc. or a metal having a work function approximate to that of Si such Al, Ag, etc. On the contrary, for the electrode on the plus side, it is preferable to use an amorphous or crystalline Si layer doped with an element which becomes highly concentrated acceptor, namely an element of the group III of the periodic table formed beneath the electrode, or a metal having larger work function as compared with that of Si such as Pt, Pd, Au, etc. or a metal having work function similar to Si such Al, Ag, etc.

When a voltage is applied between the electrodes 105 and 106, charges will flow through the valley of potential. On the other hand, even when a voltage may be applied between the electrodes 102 and 103, since this direction is horizontal direction in FIG. 4, it is impeded by the potential barrier, whereby the current during dark becomes extremely small. The resistance in the film thickness direction, namely the direction between the electrodes 102 and 103 is extremely high during dark conditions.

When light is irradiated in the film thickness direction, space charges are cancelled by the charges formed by the light irradiated to lower the potential barrier, whereby current becomes to be flowed in the film thickness direction, namely between the electrodes 102 and 103.

If the length between the electrodes 105 and 106 is made sufficiently longer than the length between the electrodes 102 and 103, namely the film thickness of the photoconductive layer 104, the charges flowed through the valley of potential will be flowed in the direction of the electrode 102 or 103.

Figure 14:
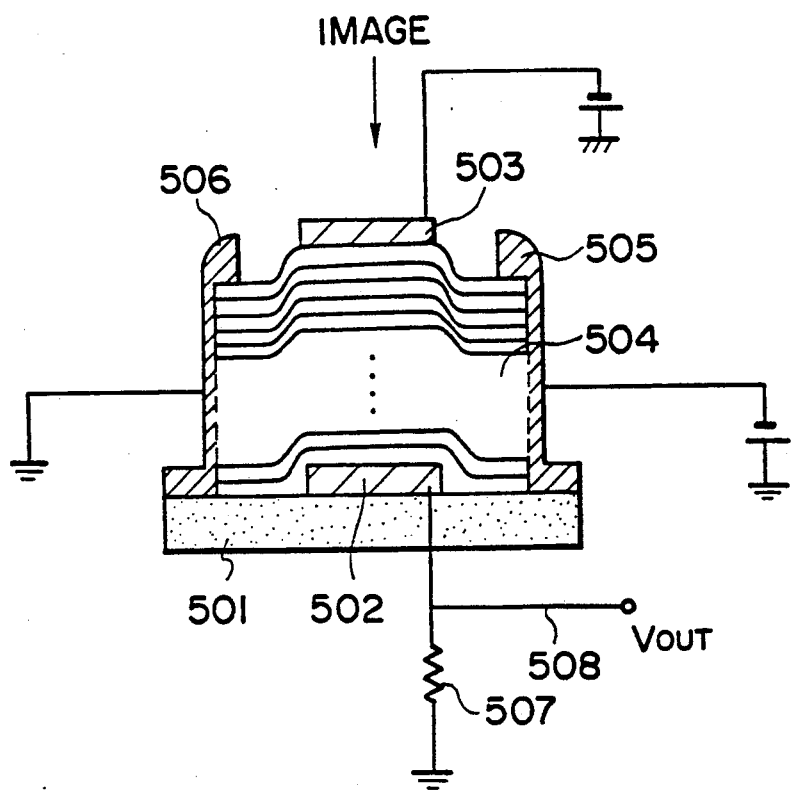
FIG. 14 is a schematic illustration of one example of the image reading method according to this embodiment.

When an image reading method as shown in FIG. 14 is employed, the current passed through the load resistance 507 during dark conditions is extremely small, and during light the charges flowing in the lateral direction of the film thickness through the valley of potential will flow in the film thickness direction, whereby an extremely large amount of charges are flowed. When used as the photosensor, the number of charges flowed to outside relative to incident number of photons will exceed by far 1, becoming generally 100 or more.

FIG. 14 is a schematic illustration of the image reading method by use of the photosensor of this embodiment. 501 to 506 correspond to 101 to 106 in FIG. 1. 507 is a load resistance, which converts the current flowing through the photosensor to a voltage. The magnitude of the load resistance may be determined optimumly depending on the magnitude of the current passed and the magnitude of the voltage withdrawn as the signal. 508 is a lead wire for withdrawing the signal voltage.

The photosensor of the present invention is described in detail by referring to Examples, but the present invention is not limited at all by the following Examples.

EXAMPLE 8-1

A photosensor shown in FIG. 12 was prepared by the film forming device shown in FIG. 5. In FIG. 12, the photosensor is obtained by forming an electrode 10 by heating vapor deposition of Cr on a glass substrate 101, forming a photoconductive member 104 by laminating alternately a n-type a-Si:H:F film and a p-type a-Si:H:F film by the film forming device shown in FIG. 5, providing a transparent electrode 103 of ITO and then attaching electrodes 105 and 106. On a Na-free glass (tradename: Corning 7059) Cr was formed into a film of about 500 Å by the electron beam heating method, and electrode 102 arranged one-dimensionally at 150 μm intervals with 100 μ square was formed by the photolisographic step. The glass substrate 101 having Cr electrode of 100 μ square formed thereon was inserted into the film forming space shown in FIG. 5. The film forming device shown in FIG. 5 comprises a substrate holder 403 having a heating heater built therein placed in a vacuum chamber 401 having an evacuation outlet 402 and a film forming space A ensured above said holder. For introducing a precursor and an active species into the film forming space A, there is formed a gas introducing portion with a coaxial double structure comprising an outer pipe 405 and an inner pipe 406. The precursor and the active species introduced through the outer pipe and inner pipe are converted to desired precursor and active species separately in the respective excitation decomposition spaces B, C at the microwave excitation sections 407 and 408 for excitation. The respective original gases for the above precursor and the active species are introduced through the gas introducing pipes 409 and 410.

Said glass substrate is mounted on the substrate holder 403. 402 shows the glass substrate mounted on the substrate holder. At the front of the glass substrate 402, a mask made of Parmalloy having an opening with a width of 1 mm is mounted. The electrode of Cr is made at the center of the opening of the mask. In FIG. 5, the distance between the tip end of the outer pipe and the substrate surface is made 8 cm. First, the vacuum chamber 101 is evacuated to a vacuum degree of about 10$^{-5}$ Torr. Next, the substrate is heated to 250° C. by the heater, and maintained at that temperature.

Under such conditions, SiF$_4$ and PH$_3$ diluted to 300 ppm with Ar are introduced respectively at 30 sccm and 10 sccm through the gas introducing pipe 910, and H$_2$ and Ar are introduced respectively at 20 sccm and 250 sccm through the gas introducing pipe 409.

When the flow rates of the respective gases are stabilized, the pressure in the chamber is maintained at 0.3 Torr. And, microwave of a frequency of 2.45 GHz is generated at 200 W into the excitation section 407 and 100 W into the excitation section 408.

This state is maintained for 160 seconds to have a n-type a-Si:H:F film with a film thickness of 200 Å deposited on the Cr layer 102.

Next, the microwave power is turned off, introduction of PH$_3$ is stopped, and BF$_3$ diluted to 300 ppm with Ar is introduced at 10 sccm through the gas introducing pipe 410.

When the flow rate of the gas is stabilized, with the pressure in the chamber being maintained at 0.3 Torr, again microwave is generated at 200 W into the excitation section 407 and 100 W into the excitation section 408.

This state is maintained for 100 seconds, to have a p-type a-Si:H:F film with a film thickness of 200 Å deposited on the n-type a-Si:H:F film.

Next, the microwave power is turned off, namely introduction of BF$_3$ is stopped, and PH$_3$ diluted to 200 ppm with Ar is introduced at 10 sccm at a pressure of 0.5 Torr or less through the gas introducing pipe 410. When the flow rate of the gas is stabilized, with the pressure in the chamber being maintained at 0.3 Torr, a microwave is generated at 200 W into the excitation section 407 and at 100 W into the excitation section 408.

Under this state, a n-type a-Si:H:F film with a film thickness of 200 Å is deposited on the p-type a-Si:H:F film.

Subsequently, similarly the p-type a-Si:H:F film and the n-type a-Si:H:F film are alternately deposited each to 200 Å, thereby depositing a photoconductive member 104 with a film thickness of 0.8 μm with 20 layers of each film being laminated.

Then, simultaneously with stopping of all gas introductions introduced into the vacuum chamber 401, the heater was also stopped, and microwave power was also turned off. After the substrate 101 is returned to room temperature, it is taken out from the film forming device, inserted into the sputtering device and heated to about 200° C., whereby a transparent electroconductive film 103 of ITO is vapor deposited to about 500 Å.

Next, according to the photoresist step, ITO pattern arranged one-dimensionally at 150 μ intervals with 100 μ square is formed as superposed on the Cr electrode.

Figure 15:
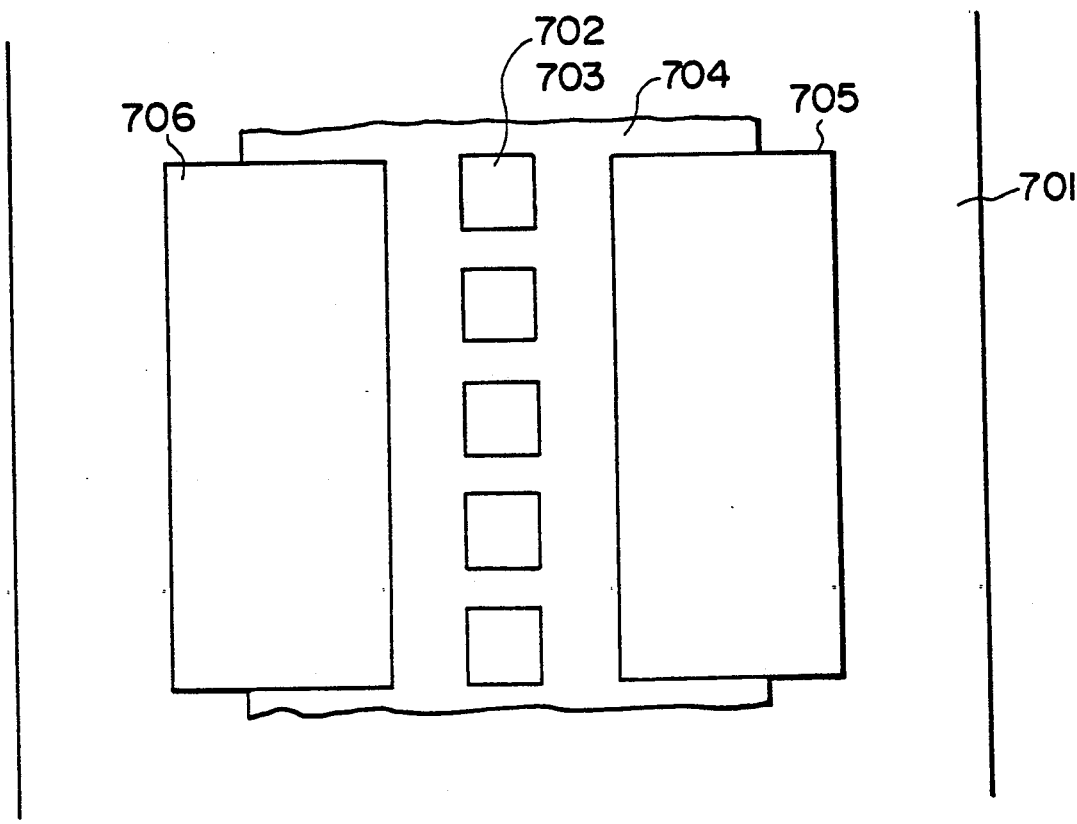
FIG. 15 is a plan view showing schematically the photosensor of the present invention.

Next, as shown in FIG. 15, on both sides of the ITO pattern, a pair of Al electrodes 705 and 706 were formed at an interval of 300 μ.

FIG. 15 is a schematic illustration of the photosensor in FIG. 12 as viewed from above, 701 representing a glass substrate, 702 a lower electrode, 703 an upper electrode and 705 and 706 a pair of side electrodes.

The photosensor obtained according to the above procedure is set in an image reading device shown in FIG. 14, and 10 V is applied between the pair of side electrodes 505 and 506, and 5 V between the lower electrode and the upper electrode 502 and 503. During dark conditions, substantially no current was flowed through the load resistance 507 of 100 Ω, and the voltage across the signal wire 508 is 0 V. When white light of 1 mW/cm$^2$ per unit area is irradiated only on the transparent electrode 103, the voltage of the signal wire 508 becomes 3 V.

To estimate the number of charges flowed to outside from the photosensor per unit number of photons irradiated from the current value flowed to the load resistance 507, it is found to exceed by far 1, giving a gain of about $3 \times 10^3$.

When light is irradiated on the above photosensor for 24 hours for examination of change in characteristics, substantially no change is recognized.

Separately, on a glass substrate, a p-type a-Si:H:F film and a n-type a-Si:H:F film are prepared under the same conditions of gas flow rate, microwave power, inner pressure, substrate temperature as in preparation of the photoconductive member 104 of the photosensor shown in FIG. 1. The analytical results of the hydrogen content in these films are shown in Table 8-1. As shown in Table 8-1, the hydrogen content in each film is 10 atomic % or less.

Comparative Example

The same photosensor and samples are prepared according to the same method as in Example 8-1 except for changing the flow rate of H$_2$ gas introduced through the gas introducing pipe 410 to 70 sccm, and subjected to the same measurement and analysis as in Example 8-1. With the value of the S/N ratio obtained as the result being as 1, it is used as the standard for other results of measurement. After photoirradiation is continued for 24 hours, it is reduced to $1 \times 10^{0.25}$, which is not a good value.

The hydrogen contents in the P type a-Si:H:F film and the n type a-Si:H:F film are as shown in Table 8-2, and the hydrogen content in each film exceeds 10 atomic %.

EXAMPLE 8-2

A photosensor shown in FIG. 12 was prepared by the same device and method as in Example 8-1. In this case, a non-doped a-Si:H:F film and a p-type a-Si:H:F film were laminated alternately on a Cr layer 102, and finally a transparent electrode 103 of ITO was formed. During preparation of the non-doped a-Si:H:F film, entirely the same preparation conditions and method were employed except for flowing only SiF$_4$ at 30 sccm through the gas introducing pipe 409, thus preparing a photosensor having a photoconductive member 104 with the non-doped a-Si:H:F film and the P type a-Si:H:F film laminated alternately each in 20 layers.

Separately, a sample of the non-doped a-Si:H:F film was prepared by use of the same preparation device and preparation conditions as described above and analyzed similarly as in Example 8-1.

When the same measurement was conducted for the photosensor obtained as in Example 8-1, the S/N ratio was found to be a good value of $1 \times 10^{2.3}$ with the Comparative Example as a standard. This value was not changed even after photoirradiation was continued for 24 hours. Photoirradiation was effected from the ITO side.

The hydrogen content in the non-doped a-Si:H:F film was as shown in Table 8-3. As shown in Table 8-3, the hydrogen content is 10 atomic % or less.

EXAMPLE 8-3

A photosensor shown in FIG. 12 was prepared by means of the device shown in FIG. 5 similarly as in Example 8-1. In this case, photoconductive member 104 is formed by laminating alternately the n-type a-Si:H:F film and the non-doped a-Si:H:F film. The preparation conditions of the n type a-Si:H:F film and the preparation conditions of the non-doped a-Si:H:F film were the same as those in Example 8-1 and Example 8-2, with other conditions being all the same as in Example 8-1, thus preparing a photosensor having an photoconductive member 104 having the n-type a-Si:H:F film and the non-doped a-Si:H:F film laminated alternately each in 20 layers.

When the same measurement was conducted for the photosensor obtained similarly as in Example 8-1, the S/N ratio was found to be a good value of $1 \times 10^3$ with Comparative Example as a standard. This value was not changed even after photoirradiation was continued for 24 hours. Photoirradiation was effected from the ITO side.

EXAMPLE 8-4

A photosensor with a photoconductive member having a structure of the p-type a-Si:Ge:H:F film and the n type a-Si:Ge:H:F film alternately laminated was prepared according to the same method as in Example 8-1 by means of the device shown in FIG. 5. In this case, a multi-layer photoconductive member 104 was formed in the following manner.

That is, by introducing $SiF_4$ at 30 sccm and $PH_3$ diluted to 300 ppm with Ar at 10 sccm and 0.2 vol % of $GeF_4$ based on $SiF_4$ through the gas introducing pipe 409, and generating microwave power of 100 W into the excitation section 407, and also introducing $H_2$ at 30 sccm and Ar at 250 sccm through the gas introducing pipe 410 and generating microwave power of 200 W into the excitation section 408, a n-type a-Si:Ge:H:F film with a film thickness of 400 Å was formed on the Cr layer 102. Then, by introducing $SiF_4$ at 30 sccm, $BF_3$ diluted to 300 ppm with Ar at 10 sccm and 0.2 vol % of $GeF_4$ based on $SiF_4$ through the gas introducing pipe 409, and generating microwave power of 100 W into the excitation section 407, and also introducing $H_2$ at 30 sccm and Ar at 250 sccm through the gas introducing pipe 410 and generating microwave power of 200 W into the excitation section 408, a p-type a-Si:Ge:H:F film with a film thickness of 400 Å was formed. Thus, a photosensor having a photoconductive member 104 with the n-type a-Si:Ge:H:F film and the P type a-Si:Ge:H:F film laminated alternately each in 10 layers was prepared.

Separately, samples of the n-type a-Si:Ge:H:F film and the p-type a-Si:Ge:H:F film were prepared by the same preparation conditions and preparation device as described above.

The photosensor and the samples thus obtained were subjected to the same measurement and analysis as described in Example 8-1. As the result, the S/N ratio was found to be a good value of $1 \times 10^3$ with Comparative Example as the standard. This value was not changed even when light was continuously irradiated for 24 hours. Photoirradiation was effected from the ITO side.

The hydrogen contents in the n-type a-Si:Ge:H:F film and the p-type a-Si:Ge:H:F film were as shown in Table 8-4. As shown in Table 8-4, the hydrogen content in each film was 10 atomic % or less.

EXAMPLE 8-5

A photosensor shown in FIG. 3 with a photoconductive member having a structure of the p-type a-Si:C:H:F and the non-doped a-Si:C:H:F alternately laminated was prepared by means of the device shown in FIG. 5.

In this case, by introducing $SiF_4$ at 30 sccm, $BF_3$ diluted to 300 ppm with Ar at 10 sccm and $CF_4$ at 3 sccm through the gas introducing pipe 409 and generating microwave power of 100 W into the excitation section 407, and also introducing $H_2$ at 50 sccm and Ar at 250 sccm through the gas introducing pipe 410 and generating microwave power of 200 W into the excitation section 408, a p-type a-Si:C:H:F film with a film thickness of 100 Å was formed on the Cr layer 102. Then, by introducing $SiF_4$ at 30 sccm and $CF_4$ at 3 sccm through the gas introducing pipe 409, introducing $H_2$ at 50 sccm and Ar at 250 sccm through the gas introducing pipe 410, and generating microwave powers of 100 W and 200 W respectively into the excitation sections 407 and 408, a non-doped a-Si:C:H:F film with a film thickness of 150 Å was formed. Following otherwise the same procedure as in Example 8-1, a photosensor having a photoconductive member 104 with the p-type a-Si:C:H:F film and the non-doped a-Si:C:H:F film laminated alternately each in 25 layers was prepared.

Separately, samples of the p-type a-Si:C:H:F film and the non-doped a-Si:C:H:F film were prepared by the same preparation conditions and preparation device as described above.

The photosensor and the samples thus obtained were subjected to the same measurement and analysis as described in Example 8-1. As the result, the S/N ratio was found to be a good value of $1 \times 10^{2.8}$ with Comparative Example as a standard. This value was not changed even when light was continuously irradiated for 24 hours. Photoirradiation was effected from the ITO side.

The hydrogen contents in the non-doped a-Si:C:H:F film and the p-type a-Si:C:H:F film were as shown in Table 8-5. The hydrogen content in each film was 10 atomic % or less.

EXAMPLE 8-6

A photosensor of Pn and samples were prepared according to the same method as Example 8-1 except for changing the preparation conditions of the photoconductive member as shown in Table 8-6.

The photosensor and the samples obtained were measured and analyzed similarly as described in Example 8-1, whereby the gains of the photosensors exhibited good results as shown in Table 8-7. All of the photosensors were not changed in S/N ratio even when light was irradiated continuously for 24 hours.

The hydrogen contents in the p-type a-Si:H:F film and the n-type a-Si:H:F in each sample were as shown in Table 8-8, and the hydrogen content in each film was 10 atomic % or less.

Of the photosensor shown in FIG. 12, the photoconductive material comprising a multi-layer film was prepared by means of the device shown in FIG. 5 so that a distance between the tip end of the outer pipe and the substrate surface was 5 cm. In this case, a non-doped Si thin film was formed to 200 Å on the Cr layer 102 by introducing $SiF_4$ at 30 sccm through the gas introducing pipe 410, and $H_2$ at 60 sccm and Ar at 250 sccm through the gas introducing pipe 409, respectively, and generating microwave power of 100 W into the excitation section 406 and of 400 W into the excitation section 407. Then, a p-type Si thin film was formed to 200 Å by introducing SiF$_4$ at 30 sccm and BF$_3$ diluted to 300 ppm with Ar at 10 sccm through the gas introducing pipe 410 and introducing H$_2$ at 100 sccm and Ar at 250 sccm through the gas introducing pipe 409, respectively, and generating microwave powers of 100 W into the excitation section 408 and of 400 W into the excitation section 407. With other conditions being the same as in Example 8-1, a photosensor having a photoconductive member 104 with the non-doped Si thin film and the p-type Si thin film laminated alternately each in 10 layers was prepared. Other methods for preparing the respective electrodes were the same as in Example 8-1.

Separately, 2 samples each having only the non-doped Si thin film and only the p-type Si thin film were prepared, and one of the respective samples was subjected to measurement of quantitative analysis of hydrogen by SIMS, and the other one was subjected to examination of presence of crystallinity by electron beam diffraction (RHEED).

When the same measurement as in example 8-1 was conducted for the photosensor obtained, the S/N ratio was found to be a good value of $1 \times 10^{3.2}$ with Comparative Example as a standard. This value was not changed even after photoirradiation was continued for 24 hours.

Hydrogen contents in the non-doped Si thin film and the p-type Si thin film and presence of crystallinity were as shown in Table 8-9. The hydrogen content in each film was 10 atomic % or less.

EXAMPLE 8-8

Figure 16:
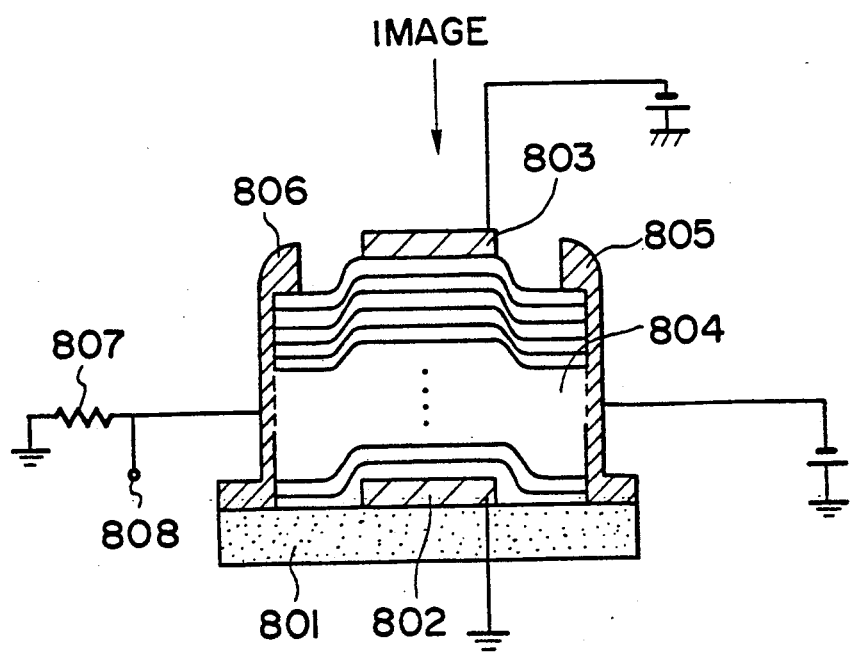
FIG. 16 is a schematic illustration of another example of the image reading method of the present invention.

A photosensor prepared in Example 8-1 was applied with wiring as shown in FIG. 16. 801 to 808 correspond to 501 to 508 in FIG. 14. However, in this case, the load resistance 807 is connected to the side electrode 806, and also the signal withdrawing wire is connected to the side electrode 806. Under this state, a voltage of 10 V was applied between the electrodes 802 and 803, and also a voltage of 20 V between the side electrodes 805 and 806. As the load resistance, 10 k Ω of resistance was connected. The voltage at 808 during dark was −5 V. When light of 14 mv/cm$^2$ was irradiated on the electrode 803, the voltage was changed to 0 V.

When light was irradiated for a long time, no change of voltage to light was observed.

As described above, according to this embodiment, the film quality becomes dense and charge transfer of small number of carriers is improved, whereby the diffusion length of carriers can be elongated and electrical and optical characteristics of the film can be greatly improved to provide a photosensor with S/N ratio not found in the prior art. According to another embodiment of the present invention, it becomes possible to provide an image reading method which can obtain high gain not found in the prior art.

TABLE 1-1

|  | Optical bandgap (ev) | Hydrogen content in film (atomic %) |
|---|---|---|
| p-type a-Si:H:F film | 1.7 | 5 |
| n-type a-Si:Ge:H:F film | 1.4 | 2 |

TABLE 1-2

|  | Optical bandgap (ev) | Hydrogen content in film (atomic %) |
|---|---|---|
| p-type a-Si:H:F film | 1.73 | 11 |
| n-type a-Si:Ge:H:F film | 1.45 | 11 |

TABLE 1-3

|  | Optical bandgap (ev) | Hydrogen content in film (atomic %) |
|---|---|---|
| Non-doped a-Si:Ge:H film | 1.4 | 2 |

TABLE 1-4

|  | Optical bandgap (ev) | Hydrogen content in film (atomic %) |
|---|---|---|
| Non-doped a-Si:H:F film | 1.7 | 5 |

TABLE 1-5

|  | Optical bandgap (ev) | Hydrogen content in film (atomic %) |
|---|---|---|
| p-type a-Si:C:H:F film | 2.4 | 9 |
| n-type a-Si:H:F film | 1.7 | 5 |

TABLE 1-6

|  | Optical bandgap (ev) | Hydrogen content in film (atomic %) |
|---|---|---|
| p-type a-Si:Ge:H:F film | 1.4 | 2 |
| Non-doped a-Si:C:H:F film | 2.4 | 9 |

TABLE 1-7

| Photosensor No. | | 6001 | 6002 | 6003 | 6004 | 6005 |
|---|---|---|---|---|---|---|
| During preparation of p-type a-Si:H:F film | H$_2$ [sccm] | 10 | 20 | 30 | 50 | 30 |
| | Ar [sccm] | 125 | 250 | 300 | 250 | 250 |
| | Microwave power [W] | 200 | 150 | 200 | 300 | 250 |
| During preparation of n-type a-Si:Ge:H:F film | H$_2$ [sccm] | 30 | 60 | 45 | 30 | 50 |
| | Ar [sccm] | 250 | 500 | 350 | 200 | 250 |
| | Microwave power [W] | 150 | 200 | 200 | 100 | 200 |

TABLE 1-8

| Photosensor No. | 6001 | 6002 | 6003 | 6004 | 6005 |
|---|---|---|---|---|---|
| S/N ratio based on Comparative example as the standard | $1 \times 10^{3.2}$ | $1 \times 10^{3.0}$ | $1 \times 10^{2.9}$ | $1 \times 10^{2.6}$ | $1 \times 10^{3.1}$ |

TABLE 1-9

| Sample No. | | 60011 | 60012 | 60013 | 60014 | 60015 |
|---|---|---|---|---|---|---|
| p-type a-Si:H:F film | Optical bandgap (ev) | 1.65 | 1.65 | 1.7 | 1.7 | 1.7 |
| | Hydrogen content in film | 2.5 | 4 | 6.5 | 10 | 10 |

TABLE 1-9-continued

| | Sample No. | 60011 | 60012 | 60013 | 60014 | 60015 |
|---|---|---|---|---|---|---|
| n-type a-Si:Ge:H:F film | Optical bandgap (ev) (atomic %) | 1.4 | 1.4 | 1.4 | 1.4 | 1.4 |
| | Hydrogen content in film (atomic %) | 1.5 | 3.5 | 3 | 1.5 | 2.5 |

TABLE 1-10

| | Optical bandgap (ev) | Hydrogen content in film (atomic %) | Crystallinity |
|---|---|---|---|
| p-type Si thin film | 1.7 | 6 | Yes |
| Non-doped SiGe thin film | 1.4 | 7 | Yes |

TABLE 2-1

| | |
|---|---|
| Hydrogen content of p-type a-Si:H:F film | 5 atomic % |
| Hydrogen content of n-type a-Si:H:F film | 5 atomic % |

TABLE 2-2

| | |
|---|---|
| Hydrogen content of p-type a-Si:H:F film | 11 atomic % |
| Hydrogen content of n-type a-Si:H:F film | 11 atomic % |

TABLE 2-3

| | |
|---|---|
| Hydrogen content of Non-doped a-Si:H:F film | 5 atomic % |

TABLE 2-4

| | |
|---|---|
| Hydrogen content of p-type a-Si:Ge:H:F film | 2 atomic % |
| Hydrogen content of n-type a-Si:Ge:H:F film | 2 atomic % |

TABLE 2-5

| | |
|---|---|
| Hydrogen content of p-type a-Si:C:H:F film | 9 atomic % |
| Hydrogen content of Non-doped a-Si:C:H:F film | 9 atomic % |

TABLE 2-6

| Photosensor No. | 6001 | 6002 | 6003 | 6004 | 6005 |
|---|---|---|---|---|---|
| Gas flow rate of gas introduced from 410 | | | | | |
| $H_2$ [sccm] | 10 | 20 | 30 | 50 | 30 |
| Ar [sccm] | 125 | 250 | 300 | 250 | 250 |
| Microwave power (W) | 200 | 150 | 200 | 300 | 250 |

TABLE 2-7

| Photosensor No. | 6001 | 6002 | 6003 | 6004 | 6005 |
|---|---|---|---|---|---|
| S/N ratio based on Comparative example as the standard | $1 \times 10^{2.8}$ | $1 \times 10^{3.5}$ | $1 \times 10^{2.9}$ | $1 \times 10^{2.8}$ | $1 \times 10^{3.3}$ |

TABLE 2-8

| Sample No. | 60011 | 60012 | 60013 | 60014 | 60015 |
|---|---|---|---|---|---|
| Hydrogen content of p-type a-Si:H:F film (atomic %) | 2.5 | 4 | 6.5 | 10 | 7 |
| Hydrogen content of n-type a-Si:H:F film (atomic %) | 2.5 | 4 | 6.5 | 10 | 7 |

TABLE 2-9

| | Hydrogen content in film (atomic %) | Crystallinity |
|---|---|---|
| Non-doped photoconductive film | 6 | Yes |
| P-type photoconductive film | 6 | Yes |

TABLE 3-1

| | |
|---|---|
| Hydrogen content of a-Si:H:F: film | 2 atomic % |
| Hydrogen content of a-Si:Ge:H:F film | 2 atomic % |

TABLE 3-2

| | |
|---|---|
| Hydrogen content of a-Si:H:F film | 11 atomic % |
| Hydrogen content of a-Si:Ge:H:F film | 11 atomic % |

TABLE 3-3

| | |
|---|---|
| Hydrogen content of p-type a-Si:H:F film | 5 atomic % |
| Hydrogen content of p-type a-Si:Ge:H:F film | 5 atomic % |

TABLE 3-4

| | |
|---|---|
| Hydrogen content of a-Si:C:H:F film | 4 atomic % |
| Hydrogen content of a-Si:H:F film | 2 atomic % |

TABLE 3-5

| | |
|---|---|
| Hydrogen content of P-Si:H:F film | 9 atomic % |
| Crystallinity | Yes |

TABLE 4-1

| | Hydrogen content in film (atomic %) | Optical band gap (ev) |
|---|---|---|
| p-type a-Si:H:F film | 5 | 1.7 |
| n-type a-Si:H:F film | 5 | — |
| n-type a-Si:Ge:H:F film | 2 | 1.4 |

TABLE 4-2

| | Hydrogen content in film (atomic %) | Optical band gap (ev) |
|---|---|---|
| p-type a-Si:H:F: film | 11 | 1.73 |
| n-type a-Si:H:F: film | 11 | — |
| n-type a-Si:Ge:H:F film | 11 | 1.45 |

TABLE 4-3

| | Hydrogen content in film (atomic %) | Optical band gap (ev) |
|---|---|---|
| Non-doped a-Si:Ge:H:F film | 2 | 1.4 |

TABLE 4-4

| | Hydrogen content in film (atomic %) | Optical band gap (ev) |
|---|---|---|
| Non-doped a-Si:H:F film | 5 | 1.7 |

TABLE 4-5

| | Hydrogen content in film (atomic %) | Optical band gap (ev) |
|---|---|---|
| p-type a-Si:C:H:F film | 9 | 2.4 |
| Non-doped n-type a-Si:H:F film | 9 | — |
| n-type a-Si:H:F film | 5 | 1.7 |

TABLE 4-6

| | Hydrogen content in film (atomic %) | Optical band gap (ev) |
|---|---|---|
| p-type a-Si:Ge:H:F film | 2 | 1.4 |
| Non-doped a-Si:C:H:F film | 9 | 2.4 |

TABLE 4-7

| Photosensor No. | | 6001 | 6002 | 6003 | 6004 | 6005 |
|---|---|---|---|---|---|---|
| During preparation of p-type a-Si:H:F film | H₂ [sccm] | 10 | 20 | 30 | 50 | 30 |
| | Ar [sccm] | 125 | 250 | 300 | 250 | 250 |
| | Microwave power [W] | 200 | 150 | 200 | 300 | 250 |
| During preparation of n-type Si:Ge:H:F film | H₂ [sccm] | 30 | 60 | 45 | 30 | 50 |
| | Ar [sccm] | 250 | 500 | 350 | 200 | 250 |
| | Microwave power [W] | 150 | 200 | 200 | 100 | 200 |

TABLE 4-8

| Photosensor No. | | 6001 | 6002 | 6003 | 6004 | 6005 |
|---|---|---|---|---|---|---|
| Gas flow rate of gas introduced from 410 | H₂ [sccm] | 10 | 20 | 30 | 50 | 30 |
| | Ar [sccm] | 125 | 250 | 300 | 250 | 250 |
| | Microwave power [W] | 200 | 150 | 200 | 300 | 250 |

TABLE 4-9

| Photosensor No. | 6001 | 6002 | 6003 | 6004 | 6005 |
|---|---|---|---|---|---|
| S/N ratio based on Comparative example as the standard | 10.0 | 10.6 | 9.7 | 9.5 | 10.3 |

TABLE 4-10

| Sample No. | | 60011 | 60012 | 60013 | 60014 | 60015 |
|---|---|---|---|---|---|---|
| p-type a-Si:H:F film | Optical band gap (ev) | 1.65 | 1.65 | 1.7 | 1.7 | 1.7 |
| | Hydrogen content in film (atomic %) | 2.5 | 4 | 6.5 | 10 | 7 |
| n-type a-Si:Ge:H:F film | Optical band gap (ev) | 1.4 | 1.4 | 1.4 | 1.4 | 1.4 |
| | Hydrogen content in film (atomic %) | 1.5 | 3.5 | 3 | 1.5 | 2.5 |
| n-type a-Si:H:F film | Hydrogen content in film (atomic %) | 2.5 | 4 | 6.5 | 10 | 7 |

TABLE 4-11

| | Hydrogen content in film (atomic %) | Optical band gap (ev) | Crystallinity |
|---|---|---|---|
| p-type Si thin film | 6 | 1.7 | Yes |
| Non-doped Si thin film | 6 | — | Yes |
| Non-doped SiGe thin film | 7 | 1.4 | Yes |

TABLE 5-1

| | |
|---|---|
| Hydrogen content of p-type SiC:H:F: film | 6 atomic % |
| Hydrogen content of n-type a-SiC:H:F film | 6 atomic % |

TABLE 5-2

| | |
|---|---|
| Hydrogen content of p-type a-SiC:H:F film | 12 atomic % |
| Hydrogen content of n-type a-SiC:H:F film | 12 atomic % |

TABLE 5-3

| | |
|---|---|
| Hydrogen content of non-doped a-SiC:H:F film | 5 atomic % |

TABLE 5-4

| | |
|---|---|
| Hydrogen content of p-type a-Si:Ge:H:F film | 3 atomic % |
| Hydrogen content of n-type a-Si:Ge:H:F film | 3 atomic % |

TABLE 5-5

| | Hydrogen content in film (atomic %) | Crystallinity |
|---|---|---|
| non-doped photoconductive film | 7 | Yes |
| p-type photoconductive film | 7 | Yes |

TABLE 6-1

| Film material | Hydrogen contents (atomic %) |
|---|---|
| p-type a-Si:Ge:H:F | 2 |
| n-type a-Si:Ge:H:F | 2 |
| p-type a-Si:H:F | 5 |
| n-type a-Si:H:F | 5 |

TABLE 6-2

| Film material | Hydrogen contents (atomic %) |
|---|---|
| p-type a-Si:Ge:H:F | 11 |
| n-type a-Si:Ge:H:F | 11 |
| p-type a-Si:H:F | 12 |
| n-type a-Si:H:F | 12 |

TABLE 6-3

| Film material | Hydrogen contents (atomic %) |
|---|---|
| i-type a-Si:Ge:H:F | 2 |

TABLE 6-4

| Film material | Hydrogen contents (atomic %) |
|---|---|
| i-type a-Si:Ge:H:F | 9 |
| p-type-Si:Ge:H:F | 9 |

TABLE 6-5

| Film material | Hydrogen contents (atomic %) |
|---|---|
| i-type a-Si:H:F | 5 |

TABLE 6-6

| Photosensor No. | | 6001 | 6002 | 6003 | 6004 | 6005 |
|---|---|---|---|---|---|---|
| Quantity of gas introduced from gas conduit 410 | Hz [sccm] | 20 | 20 | 30 | 50 | 30 |
| | Ar [sccm] | 250 | 250 | 300 | 250 | 250 |
| Microwave power [W] | | 200 | 150 | 200 | 300 | 250 |

TABLE 6-7

| Photosensor No. | 6001 | 6002 | 6003 | 6004 | 6005 |
|---|---|---|---|---|---|
| Ratio of current at light irradiation to dark current | 1.5 × 10 | 1.8 × 10 | 1.7 × 10 | 1.5 × 10 | 1.8 × 10 |

TABLE 6-8

| | Hydrogen contents (atomic %) | | | | |
|---|---|---|---|---|---|
| Sample No. | 60011 | 60012 | 60013 | 60014 | 60015 |
| Film material | | | | | |
| p-type a - Si:Ge:H:F | 1.5 | 3 | 5 | 8 | 5 |
| n-type a - Si:Ge:H:F | 1.5 | 3 | 5 | 8 | 5 |
| p-type a - Si:H:F | 2.5 | 4 | 6.5 | 10 | 7 |
| n-type a - Si:H:F | 2.5 | 4 | 6.5 | 10 | 7 |

TABLE 6-9

| Film material | Hydrogen contents (atomic %) | Crystallinity |
|---|---|---|
| p-type a - Si:Ge:H:F | 4 | Yes |
| n-type a - Si:Ge:H:F | 4 | Yes |
| p-type a - Si:H:F | 6 | Yes |
| n-type a - Si:H:F | 6 | Yes |

TABLE 7-1

| Hydrogen content of p-type a-Si:H:F film | 5 atomic % |
|---|---|
| Hydrogen content of n-type a-Si:H:F film | 5 atomic % |

TABLE 7-2

| Hydrogen content of p-type a-Si:H:F film | 11 atomic % |
|---|---|
| Hydrogen content of | 11 atomic % |

TABLE 7-2-continued p-type a-Si:H:F film

TABLE 7-3

| Hydrogen content of Non-doped a-Si:H:F film | 5 atomic % |
|---|---|

TABLE 7-4

| Hydrogen content of p-type a-Si:Ge:H:F film | 2 atomic % |
|---|---|
| Hydrogen content of n-type a-Si:Ge:H:F film | 2 atomic % |

TABLE 7-5

| Hydrogen content of p-type a-Si:C:H:F film | 9 atomic % |
|---|---|
| Hydrogen content of Non-doped a-Si:C:H:F film | 9 atomic % |

TABLE 7-6

| Photosensor No. | | 6001 | 6002 | 6003 | 6004 | 6005 |
|---|---|---|---|---|---|---|
| quantity of gas introduced from gas conduit 410 | H₂ [sccm] | 10 | 20 | 30 | 50 | 30 |
| | Ar [sccm] | 125 | 250 | 300 | 250 | 250 |
| Microwave power | | 200 | 150 | 200 | 300 | 250 |

TABLE 7-7

| Photosensor No. | 6001 | 6002 | 6003 | 6004 | 6005 |
|---|---|---|---|---|---|
| gain | $1 \times 10^{3.8}$ | $1 \times 10^{3.4}$ | $1 \times 10^{3.6}$ | $1 \times 10^4$ | $1 \times 10^3$ |

TABLE 7-8

| Sample No. | 60011 | 60012 | 60013 | 60014 | 60015 |
|---|---|---|---|---|---|
| Hydrogen content of p-type a-Si:H:F film (atomic %) | 2.5 | 4 | 6.5 | 10 | 7 |
| Hydrogen content of n-type a-Si:H:F film (atomic %) | 2.5 | 4 | 6.5 | 10 | 7 |

TABLE 7-9

| | Hydrogen content in film (atomic %) | Crystallinity |
|---|---|---|
| Non-doped photo-conductive film | 6 | Yes |
| p-type photo-conductive film | 6 | Yes |

TABLE 8-1

| | Hydrogen contents in film (atomic %) |
|---|---|
| p-type a-Si:H:F film | 5 |
| n-type a-Si:H:F film | 5 |

TABLE 8-2

| | Hydrogen contents in film (atomic %) |
|---|---|
| p-type a-Si:H:F film | 11 |
| n-type a-Si:H:F film | 11 |

TABLE 8-3

| | Hydrogen contents in film (atomic %) |
|---|---|
| Non-doped A-Si:H:F film | 4 |

TABLE 8-4

| | Hydrogen contents in film (atomic %) |
|---|---|
| p-type a-Si:Ge:H:F film | 2 |
| n-type a-Si:Ge:H:F film | 3 |

TABLE 8-5

| | Hydrogen contents in film (atomic %) |
|---|---|
| p-type a-Si:C:H:F film | 9 |
| n-type a-Si:C:H:F film | 8 |

TABLE 8-6

| Photosensor No. | | 6001 | 6002 | 6003 | 6004 | 6005 |
|---|---|---|---|---|---|---|
| During preparation of p-type a-Si:H:F film | H$_2$ (sccm) | 10 | 20 | 30 | 50 | 30 |
| | Ar (sccm) | 125 | 250 | 300 | 250 | 250 |
| | Microwave power (W) | 200 | 150 | 200 | 300 | 250 |
| During preparation of n-type a-Si:H:F film | H$_2$ (sccm) | 30 | 60 | 45 | 30 | 50 |
| | Ar (sccm) | 250 | 500 | 350 | 200 | 250 |
| | Microwave power (W) | 150 | 200 | 200 | 100 | 200 |

TABLE 8-7

| Photosensor No. | 6001 | 6002 | 6003 | 6004 | 6005 |
|---|---|---|---|---|---|
| S/N ratio based on Comparative example as the standard | $1 \times 10^{3.4}$ | $1 \times 10^{3.1}$ | $1 \times 10^{2.8}$ | $1 \times 10^{2.4}$ | $1 \times 10^{2.9}$ |

TABLE 8-8

| Sample No. | | 60011 | 60012 | 60013 | 60014 | 60015 |
|---|---|---|---|---|---|---|
| p-type a-Si:H:F film | Hydrogen Content in film (atomic %) | 3 | 5 | 7 | 10 | 7 |
| n-type a-Si:Ge:H:F film | Hydrogen Content in film (atomic %) | 2 | 4 | 5 | 6 | 4 |

TABLE 8-9

| | Hydrogen Contents (atomic %) | Crystallinity |
|---|---|---|
| P-type Si thin film | 3 | Yes |
| Non-doped Si thin film | 2 | Yes |

We claim:

1. A photosensor having a pair of electrodes and a photoconductive member sandwiched between the pair of electrodes, said photoconductive member consisting of a laminate of a plurality of alternating layers of a first non-single crystalline thin film and a second non-single crystalline thin film, wherein each of said first and second non-single crystalline thin films has a thickness of 10 Å–10 μm, and includes hydrogen at 0.5–10 atomic percent and halogen atoms at 0.0001–10 atomic percent;

at least one of said first and second non-single crystalline thin films includes impurity for controlling conductivity; and said first and second non-single crystalline thin films have band gaps equal to each other and at least one of electroconduction types and electroconductivities different from each other.

2. A photosensor according to claim 1, wherein said photoconductive member contains amorphous silicon.

3. A photosensor according to claim 1, wherein said photoconductive member contains polycrystalline silicon.

4. A photosensor having a pair of electrodes and a photoconductive member sandwiched between the pair of electrodes, said photoconductive member consisting of a laminate of a plurality of alternating layers of a first non-single crystalline thin film and a second non-single crystalline thin film, wherein each of said first and second non-single crystalline thin films has a thickness of 10 Å–10 μm, and includes hydrogen at 0.5–10 atomic percent and halogen atoms at 0.0001–10 atomic percent;

at least one of said first and second non-single crystalline thin films includes impurity for controlling conductivity; and said first and second non-single crystalline thin films have band gaps different from each other and at least one of electroconductive types and electroconductivities different from each other.

5. A photosensor according to claim 4, wherein said photoconductive member contains amorphous silicon.

6. A photosensor according to claim 4, wherein said photoconductive member contains polycrystalline silicon.

7. A photosensor having a pair of electrodes and a photoconductive member sandwiched between the pair of electrodes, said photoconductive member consisting of a laminate of a plurality of alternating layers of a first non-single crystalline thin film and a second non-single crystalline thin film, wherein each of said first and second non-single crystalline thin films has a thickness of 10 Å–10 μm, and includes hydrogen at 0.5–10 atomic percent and halogen atoms at 0.0001–10 atomic percent;

at least one of said first and second non-single crystalline thin films includes band gap regulating atoms; and said first and second non-single crystalline thin films have band gaps different from each other and at least one of electroconductive types and electroconductivities different from each other.

8. A photosensor according to claim 7, wherein said photoconductive member contains amorphous silicon.

9. A photosensor according to claim 7, wherein said photoconductive member contains polycrystalline silicon.

10. A photosensor having a pair of electrodes and first and second photoconductive members sandwiched between the pair of electrodes,
wherein said first photoconductive member consists of at least two kinds of non-single crystalline thin films laminated alternatively;
each of said two kinds of non-single crystalline thin films has a thickness of 10 Å-10 μm;
each of said two kinds of non-single crystalline thin films includes silicon atoms, hydrogen atoms at 0.5-10 atomic percent and halogen atoms at 0.0001-10 atomic percent;
said two kinds of non-single crystalline thin films have at least one of band gaps and electroconductive types and conductivities different form each other;
wherein said second photoconductive member consists of at least two kinds of non-single crystalline thin films laminated alternatively;
each of said two kinds of non-single crystalline thin films has a thickness of 10 Å-10 μm;
each of said two kinds of non-single crystalline thin films includes silicon atoms, hydrogen atoms at 0.5-10 atomic percent and halogen atoms at 0.0001-10 atomic percent;
said two kinds of non-single crystalline thin films have band gaps equal to other, and at least one of electroconductive types and conductivity different from each other; and
wherein said first and second photoconductive members are laminated.

11. A photosensor according to claim 10, wherein said photoconductive members contain amorphous silicon.

12. A photosensor according to claim 10, wherein said photoconductive members contain polycrystalline silicon.

13. A photosensor having a pair of electrodes and a photoconductive member sandwiched between the pair of electrodes, said photoconductive member consisting of a laminate of a plurality of alternating layers of a first non-single crystalline thin film and a second non-single crystalline thin film,
wherein each of said first and second non-single crystalline thin films has a thickness of 10 Å-10 μm, and includes hydrogen at 0.5-10 atomic percent and halogen atoms at 0.0001-10 atomic percent;
at least one of said first and second non-single crystalline thin films includes an impurity for controlling conductivity so that at least one of said first and second non-single crystalline thin films electroconductive types and conductivity are different from each other,
wherein all of said first and second non-single crystalline thin films have band gaps different from each other, the band gaps continuously changing in the direction of said film thickness.

14. A photosensor according to claim 13, wherein said photoconductive member contains polycrystalline silicon.

15. A photosensor according to claim 13, wherein said photoconductive member contains polycrystalline silicon.

16. A photosensor having a pair of electrodes and first and second photoconductive members sandwiched between the pair of electrodes,
wherein said first photoconductive member consists of at least two kinds of non-single crystalline thin films laminated alternatively;
each of said two kinds of non-single crystalline thin films has a thickness of 10 Å-10 μm;
each of said two kinds of non-single crystalline thin films includes silicon atoms, hydrogen atoms at 0.5-10 atomic percent and halogen atoms at 0.0001-10 atomic percent;
said two kinds of non-single crystalline thin films have band gaps different from each other, and at least one of electroconductive type and conductivity different from each other;
wherein said second photoconductive member consists of at least two kinds of non-single crystalline thin films laminated alternatively;
each of aid two kinds of non-single crystalline thin films has a thickness of 10 Å-10 μm;
each of said tow kinds of non-single crystalline thin films includes silicon atoms, hydrogen atoms at 0.5-10 atomic percent and halogen atoms at 0.0001-10 atomic percent;
said two kinds of non-single crystalline thin films have band gaps equal to each other, and at least one of electroconductive type and conductivity different from each other; and
wherein said two kinds of non-single crystalline thin films are laminated; and
the band gaps of the first and second photoconductive members are different.

17. A photosensor according to claim 16, wherein said photoconductive members contain amorphous silicon.

18. A photosensor according claim 16, wherein said photoconductive members contain polycrystalline silicon.

19. An image-forming method, which comprises:
(a) using a photosensor having a non-single crystalline multi-layer film comprising two layers each with a thickness of 10 Å-10 μm, different electroconductivities and electroconductive types, superposed alternately, and each layer including silicon, hydrogen at 0.1 to 10 atomic percent and halogen at 0.0001 to 10 atomic percent, having electrodes respectively on the upper surface and the lower surface of said multi-layer film, with at least one of said electrodes being capable of transmitting light therethrough, and
(b) irradiating light from an image signal on a portion of the multi-layer film constituting said photosensor to generate a current between the electrodes reflecting information from said image signal.

20. A photosensor having a photoconductive member, said photoconductive member having a structure comprising laminated non-single crystalline thin films of silicon and 0.5-10 atomic percent hydrogen, alternating pairs of said thin films having at least one of electroconductive types and electroconductivities different from each other, said photoconductive member having electrodes on the upper surface and the lower surfaces and both sides thereof, with at least one of said electrodes being capable of transmitting light therethrough.

21. An image reading method, which comprises using a photosensor as defined in claim 20, applying a voltage between the electrodes on the photoconductive member and at the same time irradiating lightly from the image from the transparent electrode side to thereby generate a current reflecting the image information and reading the image information.

22. A photosensor according to claim 20, wherein said thin films contain 1 atomic percent or less of fluorine.

23. A photosensor according to claim 20, wherein the thin films constituting said photoconductive member contain amorphous silicon.

24. A photosensor according to claim 20, wherein the thin films constituting said photoconductive member contain polycrystalline silicon.

25. A photosensor having a pair of electrodes and a photoconductive member sandwiched between the pair of electrodes, said photoconductive member consisting of a laminate of a plurality of alternating layers of a first non-single crystalline thin film and a second non-single crystalline thin film,
- wherein each of said first and second non-single crystalline thin films has a thickness of 10 Å–10 μm, and includes hydrogen at 0.5–10 atomic percent and halogen atoms at 0.0001–10 atomic percent;
- at least one of said first and second non-single crystalline thin films includes an impurity for controlling conductivity;
- wherein the degree of crystallinity of at least one of said first and second non-single crystalline thin film is regulated; and
- said first and second non-single crystalline thin films have band gaps different from other, and at least one of electroconductive types and electroconductivities different from each other.

26. A photosensor having a pair of electrodes and a photoconductive member sandwiched between the pair of electrodes, said photoconductive member consisting of a laminate of a plurality of alternating layers of a first non-single crystalline thin film and a second non-single crystalline thin film,
- wherein each of said first and second non-single crystalline thin films has a thickness of 10 Å–10 μm, and includes hydrogen at 0.5–10 atomic percent and halogen atoms at 0.0001–10 atomic percent;
- degree of crystallinity of at least one of said first and second non-single crystalline thin films is regulated; and
- said first and second non-single crystalline thin films have band gaps equal to each other and at least one of electroconductive types and electroconductivities different from each other.

27. A photosensor having a pair of electrodes and a photoconductive member sandwiched between the pair of electrodes, said photoconductive member consisting of a plurality of first non-single crystalline thin films and a plurality of second non-single crystalline thin films laminated alternatively,
- wherein each of said first and second non-single crystalline thin films has a thickness of 10 Å–10 μm, and includes hydrogen at 0.5–10 atomic percent and halogen atoms at 0.0001–10 atomic percent,
- at least one of said first and second non-single crystalline thin films includes band gap regulating atoms, and
- said first and second non-single crystalline thin films have band gaps different from each other, and at least one of electroconductive types and electroconductivities equal to each other.

28. A photosensor having a pair of electrodes and a photoconductive member sandwiched between the pair of electrodes, said photoconductive member consisting of a plurality of first non-single crystalline thin films and a plurality of second non-single crystalline thin films laminated alternatively,
- wherein each of said first and second non-single crystalline thin films has a thickness of 10 Å–10 μm, and includes hydrogen at 0.5–10 atomic percent and halogen atoms at 0.0001–10 atomic percent,
- wherein the degree of crystallinity of at least one of said first and second non-single crystalline thin films is regulated, and
- said first and second non-single crystalline thin films have band gaps different from each other, and at least one of electroconductive types and electroconductivities equal to each other.

* * * * *

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

On the title page:

IN [56] REFERENCES CITED

OTHER PUBLICATIONS, "Photovoltaic IV:" should read --Photovoltaics IV:--.

IN [57] ABSTRACT

Line 9, "photo sensitivity" should read --photosensitivity--.

COLUMN 1

Line 17, "facscimile," should read --facsimile,--.
Line 28, "non-monocrystallinethin" should read --non-monocrystalline thin--.
Line 34, "thin area" should read --thin film area--.
Line 64, "value" should read --value,--.

COLUMN 2

Line 1, "charge" should read --charges--.

COLUMN 3

Line 66, "irradiated" should read --which irradiates--.

COLUMN 4

Line 8, "and" should be deleted.
Line 9, "area," should read --area--.

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

COLUMN 5

Line 25, "drawings, of" should read --drawings, Examples of--.
    Line 26, "to be" should be deleted.

COLUMN 6

Line 2, "fibers" should read --films--.
    Line 3, "p/i//p/i/" should read --p/i/p/i--.
    Line 10, "that," should read --that--.
    Line 44, "ratio and" should read --ratio, and--.
    Line 59, "is incorporated or n-type impurity" should read --or n-type impurity is incorporated--.

COLUMN 7

Line 6, "etc ," should read --etc.,--.
    Line 38, "doublestructure" should read --double structure--.
    Line 49, "made" should be deleted.
    Line 56, "SiF$_3$at" should read --SiF$_3$ at--.
    Line 62, "at0.3 Torr." should read --at 0.3 Torr.--.

COLUMN 8

Line 9, "thrown into" should be deleted.
    Line 16, "GeF$_4$based" should read --GeF$_4$ based--.

COLUMN 9

Line 57, "an" should read --a--.

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

COLUMN 10

Line 20, "and and" should read --and--.

COLUMN 11

Line 2, "pipe 409, gas" should read --pipe 409, introducing $H_2$ at 50 sccm and Ar at 250 sccm through the gas--.
Line 19, "goo" should read --good--.

COLUMN 13

Line 37, "thrown" should read --generated--.
Line 38, "into" should read --in-- (both occurrences).

COLUMN 15

Line 50, "10 atomic % or less." should read --10 atomic %.--.
Line 58, "at sccm" should read --at 3 sccm--.

COLUMN 16

Line 23, "10 atomic % or less." should read --10 atomic %.--.
Line 24, "EXAMPLE2-6" should read --EXAMPLE 2-6--.
Line 33, "Table 7," should read --Table 2-7,--.

COLUMN 18

Line 2, "at0.3 Torr." should read --at 0.3 Torr.--.
Line 14, "at0.3 Torr," should read --at 0.3 Torr,--.

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

COLUMN 18

Line 24, "the," should read --the-- and "was" should read --being--.
Line 58, "analysis," should read --analysis--.

COLUMN 19

Line 53, "thrown into" should read --generated in--.

COLUMN 20

Line 25, "and formed" should read --and a-Si:Ge:H:F film with thickness of 100 Å were repeatedly formed--.

COLUMN 21

Line 4, "this" should read --thin--.
Line 31, "photoconductive member" should read --second photoconductive member--.
Line 65, "at0.3 Torr." should read --at 0.3 Torr.--.

COLUMN 22

Line 42, "thrown respectively into" should read --generated respectively in--.
Line 43, "section 407 and 408." should read --sections 407 and 408.--.
Line 51, "at," should read --at--.
Line 53, "into" should read --in--.

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

COLUMN 23

Line 11, "being b 1." should read --being 1.--.

COLUMN 24

Line 5, "example 4-1" should read --Example 4-1--.
Line 10, "Photo-irradiation" should read --Photoirradiation--.
Line 66, "generated" should read --was generated--.

COLUMN 25

Line 1, "pipe 109," should read --pipe 409,--.
Line 4, "gene" should read --generated in--.
Line 17, "BF" should read --$BF_3$--.
Line 29, "non-dopes" should read --non-doped--.
Line 60, "thrown" should read --generated--.
Line 61, "into" should read --in--.
Line 64, "pipe 109," should read --pipe 409,--.

COLUMN 26

Line 33, "Table 407," should read --Table 4-7,--.
Line 50, "first photoconductive member 104" should read --first photoconductive member 104(A)--.
Line 59, "Cr layer 202" should read --CR layer 102--.

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

COLUMN 27

Line 3, "100 W the" should read --100 W in the--.
   Line 53, "104" should read --104(A)--.

COLUMN 28

Line 23, "EXAMPLE 5-11" should read --EXAMPLE 5-1--.
   Line 33, "heating" should be deleted.
   Line 36, "abut" should read --about--.

COLUMN 29

Line 5, "$B_3$ F" should read --$BF_3$--.
   Line 45, "flowed" should read --flow--.

COLUMN 31

Line 17, "formed Thus" should read --formed.  Thus--.
   Line 46, "Cr layer 202" should read --Cr layer 102--.
   Line 49, "throwing" should read --generating--.
   Line 50, "into" should read --in--.
   Line 57, "throwing" should read --generating-- and "into" should read --in--.

COLUMN 32

Line 21, "running" should read --charge transfer--.
   Line 22, "performance" should be deleted.
   Line 26, "no" should read --not--.
   Line 42, "atomic" should read --atomic %--.
   Line 64, "member" should read --members--.

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

COLUMN 33

Line 14, "clarified to give" should read --shown to have--.
   Line 31, "atomic" should read --atomic %--.
   Line 68, "react" should read --reacts--.

COLUMN 34

Line 3, "EXAMPLE 6-11" should read --EXAMPLE 6-1--.
   Line 18, "heating" should be deleted.
   Line 42, "introducing pipe 409," should read --gas introducing pipe 409,--.
   Line 61, "thrown into" should read --generating in--.

COLUMN 35

Line 48, "transparent electroconductive film 203" should read --transparent electroconductive film 103--.
   Line 64, "Fig. 1" should read --Fig. 3-- and "was done" should be deleted.
   Line 65, "gen by" should read --gen was done by--.

COLUMN 36

Line 11, "Examples After" should read --Examples. After--.
   Line 16, "Table 2," should read --Table 6-2,--.
   Line 27, "SiF and GeF diluted to 1%" should read --$SiF_4$ and $GeF_4$--.
   Line 36, "Table 3," should read --Table 6-3,--.

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

COLUMN 37

Line 7, "throwing" should read --generating--.
    Line 13, "through,.the" should read --through the--.
    Line 14, "generating" should read --generated--.
    Line 18, "film" should read --films--.
    Line 43, "film" should read --films--.
    Line 63, "film" should read --films--.

COLUMN 38

Line 4, "generating" should read --generated--.
    Line 36, "Samples No. 6-11" should read
            --Samples No. 60011--.
    Line 37, "6-15" should read --60015--.
    Line 56, "procedured," should read --procedures,--.
    Line 58, "throwing" should read --generating--.
    Line 67, "200 Å" should read --200 Å,--.

COLUMN 39

Line 38, "less,, whereby," should read --less, whereby--.

COLUMN 40

Line 32, "function,," should read --function,--.
    Line 43, "bly" should read --bly 0.001 to 5 atomic %, most
            preferably 0.01 to 2 atomic %.--.
    Line 50, "clarified to give" should read --shown to have--.
    Line 55, "10 atomic 5" should read --10 atomic %--.
    Line 60, "follows. the" should read --follows. While bias
            voltage of 5 V is previously applied between the--.

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

COLUMN 41

Line 5, "P type" should read --p-type--.
Line 46, "Since," should read --Since--.
Line 51, "taking" should read --making--.
Line 65, "transformed" should read --transferred--.

COLUMN 42

Line 38, "thrown" should read --generated--.
Line 39, "into" (first occurrence) should read --in--.
Line 50, "thrown into" should read --generated in--.
Line 61, "thrown into" should read --generated in--.

COLUMN 43

Line 7, "heating" should be deleted.

COLUMN 45

Line 48, "30 sccm $CF_4$" should read --30 sccm, $CF_4$--.
Line 51, "throwing" should read --generating--.
Line 52, "into" should read --in--.
Line 61, "500° A" should read --500 Å--.

COLUMN 46

Line 33, "Cr layer 202" should read --Cr layer 102--.

COLUMN 48

Line 18, "clarified to give" should read --shown to have--.
Line 62, "such N," should read --such as N,--.

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

COLUMN 49

Line 35, "doner," should read --donor,--.
Line 40, "such Al," should read --such as Al,--.

COLUMN 50

Line 40, "photolisographic" should read --photolithographic--.
Line 45, "heating" should be deleted.
Line 47, "ensured" should read --spaced--.
Line 61, "402 shows" should read --402 is--.
Line 63, "Parmalloy" should read --Permalloy--.

COLUMN 51

Line 5, "gas introducing pipe 910," should read --gas introducing pipe 410,--.

COLUMN 52

Line 19, "FIG. 1." should read --FIG. 12--.
Line 35, "P type" should read --p-type--.
Line 52, "P type" should read --p-type--.

COLUMN 53

Line 51, "P type" should read --p-type--.

COLUMN 54

Lines 12-13, boldface should be deleted.
Line 44, "Pn" should read --p-n type--.
Line 68, "section 406" should read --section 408--.

UNITED STATES PATENT AND TRADEMARK OFFICE
CERTIFICATE OF CORRECTION

PATENT NO. : 5,019,887
DATED : May 28, 1991
INVENTOR(S) : MITSUYUKI NIWA, ET AL.

It is certified that error appears in the above-identified patent and that said Letters Patent is hereby corrected as shown below:

COLUMN 55

Line 11, "in10" should read --in 10--.

COLUMN 58

TABLE 3-5, "P-Si:H:F film" should read --p-Si:H:F film--.

COLUMN 61

TABLE 6-6, "Hz" should read --$H_2$--.

COLUMN 62

TABLE 7-2-continued, "p-type" should read --n-type--.

COLUMN 63

TABLE 8-3, "Non-doped A-Si:H:F film" should read
--Non-doped a-SiH:F film--.

COLUMN 64

Line 4, "impurity" should read --an impurity--.
Line 26, "impurity" should read --an impurity--.

COLUMN 65

Line 22, "form" should --from--.
Line 59, "films" should read --films'--.

UNITED STATES PATENT AND TRADEMARK OFFICE
CERTIFICATE OF CORRECTION

PATENT NO. : 5,019,887

DATED : May 28, 1991

INVENTOR(S) : MITSUYUKI NIWA, ET AL.

It is certified that error appears in the above-identified patent and that said Letters Patent is hereby corrected as shown below:

COLUMN 66

Line 23, "aid" should read --said--.
Line 25, "tow" should read --two--.
Line 40, "according" should read --according to--.

COLUMN 67

Line 4, "lightly" should read --light--.
Line 31, "film" should read --films--.

COLUMN 68

Line 3, "degree" should read --wherein the degree--.

Signed and Sealed this

Nineteenth Day of October, 1993

Attest:

BRUCE LEHMAN

Attesting Officer

Commissioner of Patents and Trademarks